(12) United States Patent
Guerra

(10) Patent No.: US 10,916,674 B2
(45) Date of Patent: *Feb. 9, 2021

(54) BANDGAP-SHIFTED SEMICONDUCTOR SURFACE AND METHOD FOR MAKING SAME, AND APPARATUS FOR USING SAME

(71) Applicant: NANOPTEK CORPORATION, Concord, MA (US)

(72) Inventor: John Michael Guerra, Concord, MA (US)

(73) Assignee: NANOPTEK CORPORATION, Concord, MA (US)

( * ) Notice: Subject to any disclaimer, the term of this patent is extended or adjusted under 35 U.S.C. 154(b) by 473 days.

This patent is subject to a terminal disclaimer.

(21) Appl. No.: 14/680,999

(22) Filed: Apr. 7, 2015

(65) Prior Publication Data

US 2015/0214411 A1    Jul. 30, 2015

Related U.S. Application Data

(63) Continuation of application No. 14/195,810, filed on Mar. 3, 2014, which is a continuation-in-part of
(Continued)

(51) Int. Cl.
*C25B 1/00* (2006.01)
*C25B 11/03* (2006.01)
(Continued)

(52) U.S. Cl.
CPC ........ *H01L 31/0549* (2014.12); *B01J 21/063* (2013.01); *B01J 35/004* (2013.01);
(Continued)

(58) Field of Classification Search
CPC ...................................................... C25B 1/003
(Continued)

(56) References Cited

U.S. PATENT DOCUMENTS 3,925,212 A * 12/1975 Tchernev ................ C25B 1/003
    204/278
4,021,323 A *  5/1977 Kilby ...................... C25B 1/003
    136/246
(Continued)

OTHER PUBLICATIONS

Imenes et al, Spectral beam splitting technology for increased conversion efficiency in solar concentrating systems: a review, International Solar Energy Society World Congress 2003, vol. 84, Issue 1-4, Oct. 2004, pp. 19-69.*
(Continued)

*Primary Examiner* — Harry D Wilkins, III
(74) *Attorney, Agent, or Firm* — David J. Cole

(57) ABSTRACT

Titania is a semiconductor and photocatalyst that is also chemically inert. With its bandgap of 3.2 and greater, to activate the photocatalytic property of titania requires light of about 390 nm wavelength, which is in the ultra-violet, where sunlight is very low in intensity. A method and devices are disclosed wherein stress is induced and managed in a thin film of titania in order to shift and lower the bandgap energy into the longer wavelengths that are more abundant in sunlight. Applications of this stress-induced bandgap-shifted titania photocatalytic surface include photoelectrolysis for production of hydrogen gas from water, photovoltaics for production of electricity, and photocatalysis for detoxification and disinfection.

21 Claims, 50 Drawing Sheets

Related U.S. Application Data application No. 12/136,736, filed on Jun. 10, 2008, now abandoned, and a continuation-in-part of application No. 12/136,716, filed on Jun. 10, 2008, now Pat. No. 8,673,399, which is a continuation-in-part of application No. 10/424,259, filed on Apr. 26, 2003, now Pat. No. 7,485,799.

(60) Provisional application No. 60/380,169, filed on May 7, 2002.

(51) Int. Cl.
| | | |
|---|---|---|
| *H01L 31/054* | (2014.01) | |
| *H02S 40/20* | (2014.01) | |
| *B01J 35/00* | (2006.01) | |
| *B01J 21/06* | (2006.01) | |
| *B01J 37/06* | (2006.01) | |
| *B01J 37/34* | (2006.01) | |

(52) U.S. Cl.
CPC .............. *C25B 1/003* (2013.01); *C25B 11/03* (2013.01); *H02S 40/20* (2014.12); *B01J 35/0033* (2013.01); *B01J 37/06* (2013.01); *B01J 37/348* (2013.01); *Y02E 10/52* (2013.01); *Y02E 60/36* (2013.01)

(58) Field of Classification Search
USPC .......................................... 204/248; 205/340
See application file for complete search history.

(56) References Cited

U.S. PATENT DOCUMENTS

| | | | | |
|---|---|---|---|---|
| 4,061,555 A | * | 12/1977 | Miyatani | C25B 1/003 204/242 |
| 4,124,464 A | * | 11/1978 | Miyatani | C25B 1/003 204/242 |
| 4,278,829 A | * | 7/1981 | Powell | F24J 2/07 126/634 |
| 4,427,749 A | * | 1/1984 | Graetzel | C25B 1/003 204/242 |
| 4,511,450 A | * | 4/1985 | Neefe | C25B 1/003 204/157.5 |
| 4,528,252 A | * | 7/1985 | Yamazaki | H01G 9/20 204/266 |
| 4,722,776 A | * | 2/1988 | Murphy | C25B 1/003 136/244 |
| 4,957,610 A | * | 9/1990 | Hawkins | C25B 1/003 204/157.41 |
| 5,592,028 A | * | 1/1997 | Pritchard | C25L 31/04 290/1 R |
| 5,660,698 A | * | 8/1997 | Scannell | C25B 11/03 204/252 |
| 5,779,866 A | * | 7/1998 | Tarancon | C25B 15/08 204/262 |
| 6,015,950 A | * | 1/2000 | Converse | H01L 31/0543 126/609 |
| 6,471,834 B2 | * | 10/2002 | Roe | C25B 1/003 204/242 |
| 7,485,799 B2 | * | 2/2009 | Guerra | C25B 1/003 136/245 |
| 2003/0228727 A1 | * | 12/2003 | Guerra | C25B 1/003 438/200 |
| 2005/0046977 A1 | * | 3/2005 | Shifman | F24J 2/12 359/853 |

OTHER PUBLICATIONS

Imenes, Spectral Beam Splitter for Solar Hydrogen Production, Oct. 2007 (available at http://solar.org.au/papers/07papers/Presentation50. pdf).*

Licht, Solar Water Splitting to Generate Hydrogen Fuel: Photothermal Electrochemical Analysis, Jounral of Physical Chemistry B, vol. 107, No. 18, Apr. 2003, pp. 4253-4260.*

Quan et al, Preparation of Titania Nanotubes and Their Environmental Applications as Electrode, Environmental Science & Technology, vol. 39, No. 10, Apr. 2005, pp. 3770-3775 (Year: 2005).*

Markle, Etching Titanium with HF and Nitric Acid Solutions, Chemcut Corporation, pp. 1-13, no date available (accessed on May 30, 2018 at http://www.chemcut.net/wp-content/uploads/2015/02/Etching-Titanium-with-HF-and-Nitric-Acid-Solutions-Part1.pdf) (Year: 2018).*

* cited by examiner

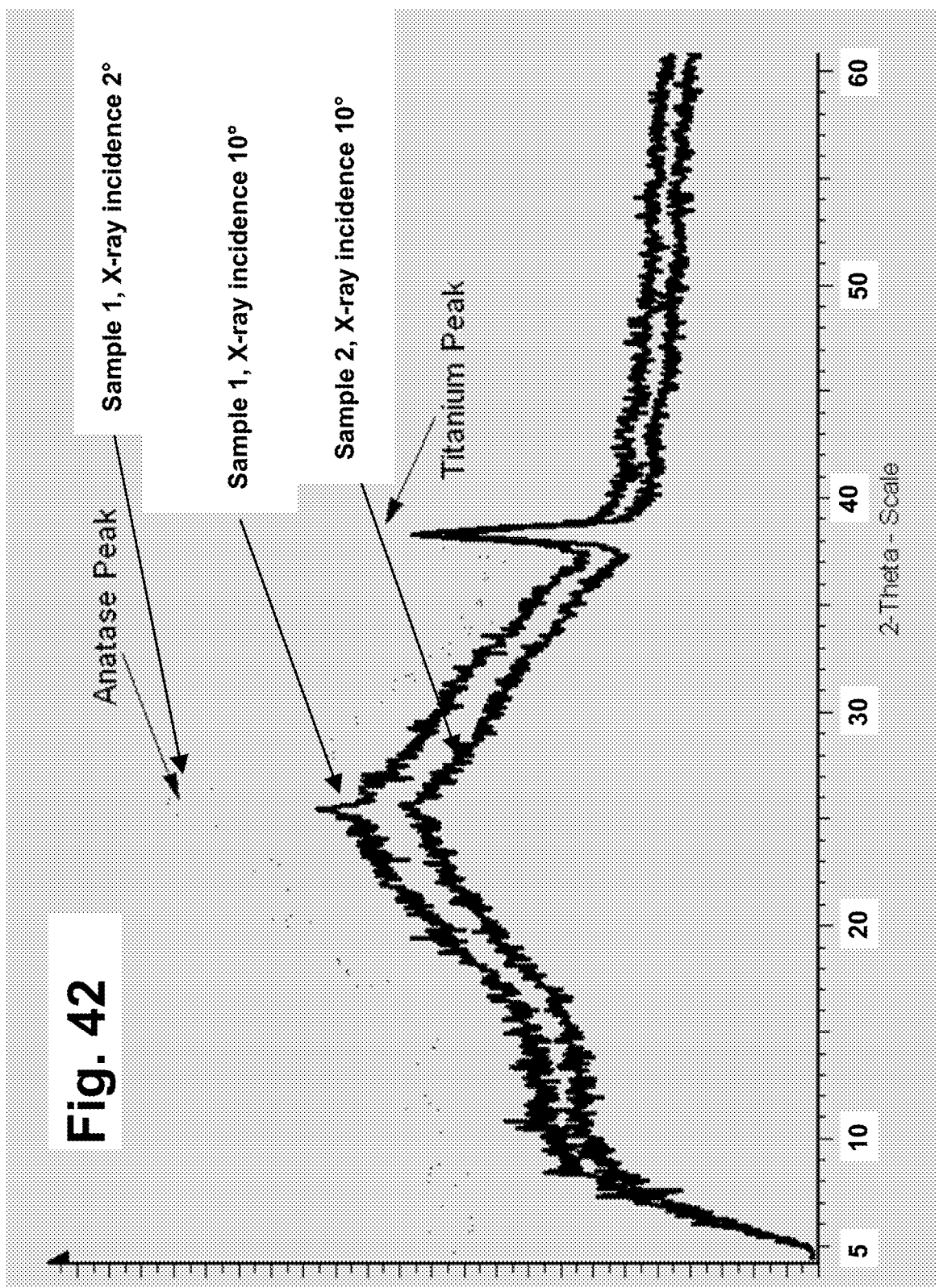

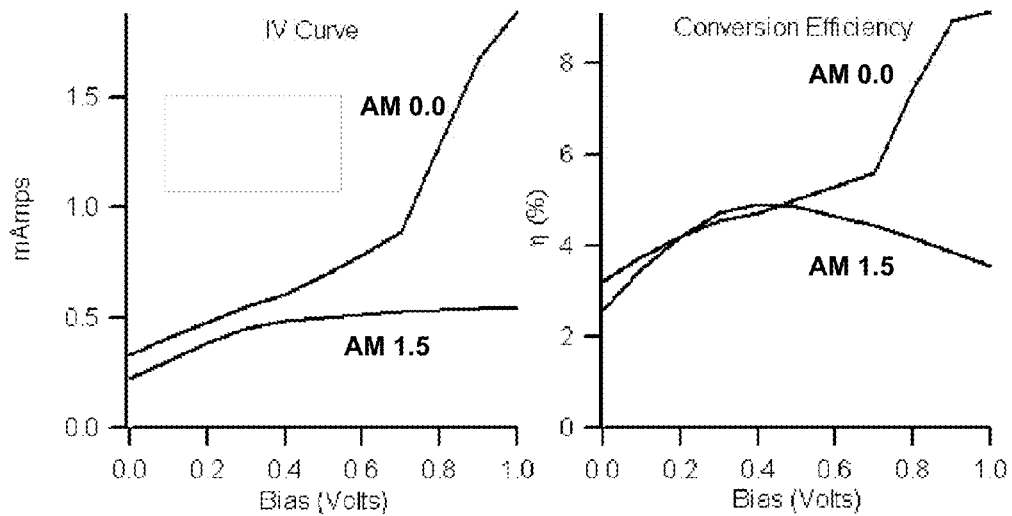
Fig. 45A  Fig. 45B
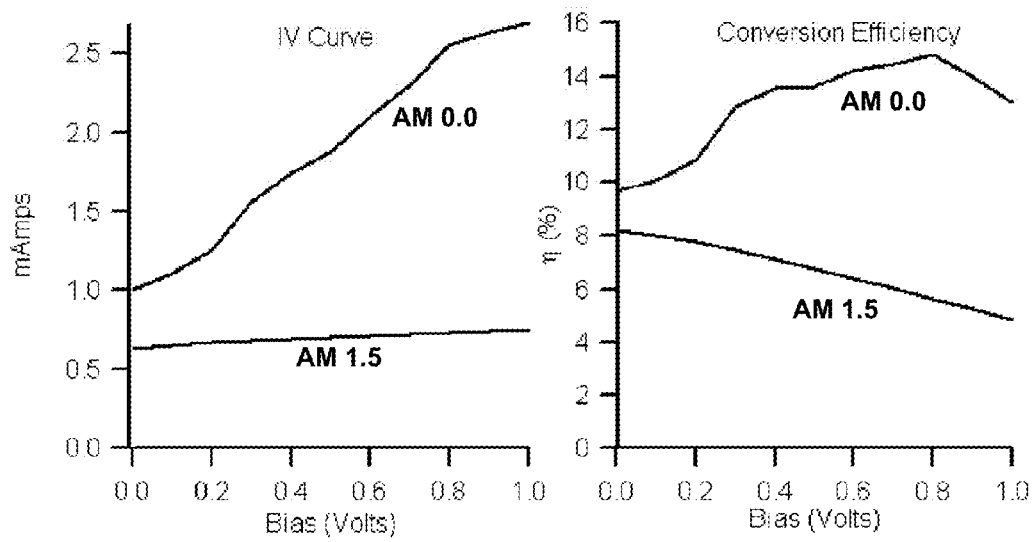
Fig. 45C  Fig. 45D

BANDGAP-SHIFTED SEMICONDUCTOR SURFACE AND METHOD FOR MAKING SAME, AND APPARATUS FOR USING SAME

REFERENCE TO RELATED APPLICATIONS

This application is a continuation of copending application Ser. No. 14/195,810, filed Mar. 3, 2014 (now abandoned), which itself is a continuation-in-part of copending application Ser. No. 12/136,716, filed Jun. 10, 2008 (Publication No. 2008/0299697, now U.S. Pat. No. 8,673,399, issued Mar. 18, 2014), which itself is a continuation-in-part of application Ser. No. 10/424,259, filed Apr. 26, 2003 (Publication No. 2003/0228727, now U.S. Pat. No. 7,485,799, issued Feb. 3, 2009), which claims benefit of Provisional Application Ser. No. 60/380,169, filed May 7, 2002. The aforementioned application Ser. No. 14/195,810 is also a continuation-in-part of copending application Ser. No. 12/136,736, filed Jun. 10, 2008 (Publication No. 2008/0283121, now abandoned), which itself is a continuation-in-part of the aforementioned application Ser. No. 10/424,259.

The entire disclosures of all the aforementioned applications, and of all U.S. patents and published and copending applications mentioned below, are herein incorporated by reference.

BACKGROUND OF INVENTION

This invention relates to a bandgap-shifted semiconductor surface, and a method for making same. This invention also relates to photocatalytic surfaces used in the process of photoelectrolysis, photovoltaics, and photocatalysis, and more specifically to induction and management of stress in a thin titania film photocatalytic surface to match the band gap of the titania more efficiently with the solar spectrum at the earth's surface for photoelectrolysis, photovoltaics, and photocatalysis.

For general background information relating to this invention see:
1. www.colorado.edu/~bart/book/solar.htm: Bart J. Van Zeghbroeck, 1997, Chapter 4.8 (Photodiodes and Solar Cells) and Chapter Section 2.2.5 (Temperature and stress dependence of the energy bandgap).
2. J. G. Mavroides, J. A. Kafalas, and D. F. Kolesar, "Photoelectrolysis of water in cells with $SrTiO_3$ anodes," Applied Physics Letters, Vol. 28, No. 5, 1 Mar. 1976, and references therein.
3. A. Fujishima and K. Honda, Nature, 238, 37 (1972)
4. O. Khaselev and J. Turner, "A Monolithic Photovoltaic-Photoelectrochemical Device for Hydrogen Production via Water Splitting," Science, Vol. 280, 17 Apr. 1998.
5. P. J. Sebastian, M. E. Calixto, and R. N. Bhattacharya, Electrodeposited CIS and CIGS thin film photocatalysts for hydrogen production by photoelectrolysis.
6. T. Gerfin, M. Graetzel and L. Walder, Progr. Inorg. Chem., 44, 345-393 (1997), Molecular and Supramolecular Surface Modification of Nanocrystalline $TiO_2$ films: Charge-Separating and Charge-Injecting Devices.
7. Guerra, J. M., Storage Medium Having a Layer of Micro-Optical Lenses Each Lens Generating an Evanescent Field, U.S. Pat. No. 5,910,940, Jun. 8, 1999.
8. Guerra, J. M., Adsorption Solar Heating and Storage System, U.S. Pat. No. 4,269,170, May 26, 1981.
9. Guerra, J. M., Photon tunneling microscopy applications, MRS Proceedings Volume 332, Determining Nanoscale Physical Properties of Materials by Microscopy and Spectroscopy, M. Sarikaya, H. K. Wickramasinghe and M. Isaacson, editors. Page 457, FIG. 8b shows tensile stress fissures in diamond-like carbon coating on a silicon substrate. FIG. 9a shows adhesion failure due to compressive stresses in a magnesium fluoride thin film coating on an acrylic substrate.
10. Guerra, J. M., Storage Medium Having a Layer of Micro-Optical Lenses Each Lens Generating an Evanescent Field (application title: Optical Recording Systems and Media with Integral Near-Field Optics), U.S. Pat. No. 5,910,940, Jun. 8, 1999. Assigned to Polaroid Corp.
11. Guerra, J. M. and D. Vezenov, Method of fabrication of sub-micron spherical micro-lenses. Patent Applied For Apr. 12, 2001.
12. Guerra, J. M. et al, "Embedded nano-optic media for near-field high density optical data storage: modeling, fabrication, and performance," Proceedings, Optical Data Storage Conference, SPIE, April, 2001.
13. Guerra, J. M. et al, "Near-field optical recording without low-flying heads," ISOM Technical Digest, Taipei, 2001.
14. Guerra, J. M. et al, "Near-field optical recording without low-flying heads: Integral Near-Field Optical (INFO) Media," Japanese Journal of Applied Physics, scheduled publication March 2002
15. J. M. Bennett et al, "Comparison of the properties of titanium dioxide films prepared by various techniques," Appl. Opt. 28, 3303-3317 (1989)
16. H. T. Tien and A. L. Ottova, "Hydrogen generation from water using semiconductor septum electrochemical photovoltaic (SC-SEP) cells," Current Topics in Biophysics 2000, 25(1), 39-60. Modeled on nature's photosynthetic thylakoid membrane.

The ills of our carbon-based energy are well-known: pollution of land and oceans, air pollution, and the global warming that is likely caused by the latter. In addition, there is the growing dependence on foreign oil (presently at 46%, up from 27% during the Oil Embargo during the Carter administration) with the economic, political, and human costs that result from that dependence. Hydrogen has been gradually emerging as the fuel of choice for the future and perhaps even the very near future. Fuel cell technology has recently advanced exponentially, with plans for miniature fuel cells to replace batteries in the ever power-hungry personal digital devices, and for combustion engines for automobiles in which hydrogen is the fuel. This last important application has made great progress in that the hydrogen can now be safely and efficiently stored in a host of metal hydride based materials, with the hydrogen being piped to or stored at local filling stations, with the associated cost and danger. In another approach, the hydrogen is split at the engine from toxic hydrogen-bearing liquids such as gasoline and alcohols.

Ultimately, for a hydrogen-based energy to be completely beneficial, one would like to be able to split our most abundant resource, water, with a renewable energy source. Many have turned to solar cells to provide the electricity for electrolysis of water as a way to provide a stable and efficient storage for solar energy, with the stored hydrogen (adsorbed in a metal hydride, Ovshinsky et al) later used to create electric power in a fuel cell. However, the losses of the solar cell in converting sunlight to electricity, combined with the losses in the electrolytic splitting of water into hydrogen and oxygen, make for low efficiency overall. Further, the cost of the apparatus and lifetime of the components make the economic viability dim at this time.

A promising path and highly sought-after goal is to use sunlight directly to split water. The free energy required for decomposing water into gaseous $H_2$ and $O_2$ is just 1.23 eV, so this seems possible given that the peak of the solar spectrum is about 2.4 eV (ref. Mavroides). However, the threshold energy for this reaction is 6.5 eV, so direct photodissociation is not possible. However, Honda and Fujishima (Nature 238, 37 (1972)) showed that the threshold energy required can be greatly reduced by introducing a photocatalytic semiconductor surface, such as titania. Immersing single crystal titania (n-type) and Pt electrodes in an aqueous electrolyte, connected externally to form an electrolytic cell, they observed development of gaseous oxygen at the titania electrode and gaseous hydrogen at the Pt electrode when the cell was illuminated. (In other photoelectrolytic cells, hydrogen collects at the semiconductor cathode and oxygen collects at the conducting anode, with a membrane preventing their recombining) However, while they succeeded in activating titania as a photocatalyst, they required artificial light, such as a xenon lamp, with a photon energy of greater than 3.2 eV, the lowest energy gap of titania. Even so, their energy conversion efficiencies were low. Further, such light is in the ultraviolet part of the spectrum, and very little is present in sunlight at the surface of the earth (sunlight integrated over the 3 eV to 4 eV range is only 4 mW per square cm, compared to the 100 mW per square cm total in visible sunlight), so that titania photoelectrolysis with sunlight has less than 1% efficiency, and the photoelectrolysis quantum efficiency, independent of the solar spectrum, is only 1-2% unless a bias voltage is applied. For photoelectrolysis, as it is known, to spontaneously occur in sunlight, and with a practical efficiency, therefore requires the semiconductor to have a bandgap of about 1.7 electron volts (eV) in order to (1) have the energy required to split the water into hydrogen and oxygen gases, and (2) absorb at the peak of the solar spectrum for highest efficiency.

Following this work, others (Turner and Warren) have investigated semiconductor alloys or compounds with lower bandgaps. For example, p-type $GaInP_2$ has a bandgap of 1.8 to 1.9 eV, which would work adequately in sunlight to produce a photocurrent that can be used to break down water into hydrogen and oxygen. However, they found that surface treatments in the form of metallated porphyrins and transition metals, such as compounds of ruthenium, were necessary to suppress the bandedge migration and allow bandedge overlap to occur. Without this treatment, hydrogen and oxygen cannot be produced because the conduction band and the Fermi level of the semiconductor do not overlap the redox potentials of water, i.e. when light shines on the semiconductor, electrons build up on the surface, shifting the bandedges and Fermi level further away from the overlap of the water redox potentials. The long term surface stability of these surface treatments are not known.

Other attempts at photoelectrolytic cells with lower bandgap semiconductors typically (1) are corrosive in water, and (2) require a bias voltage, supplied by a conventional power source or by a photovoltaic cell or photodiode. The corrosion problem has been reduced by using platinum as the anode, and/or by combining different semiconductors. This again reduces economic viability.

The titania electrode in the Honda/Fujishima cell has the important advantage that it does not undergo anodic dissociation in water, and titania is much less expensive than other semiconductors. Mavroides, Kafalas, and Kolesar demonstrated somewhat higher efficiency titania cells using n-type $SrTiO_3$ for its smaller electron affinity, after having confirmed the Honda/Fujishima results with titania in earlier work. They achieved 10% maximum quantum efficiency, an order of magnitude higher than for titania, but with light with energy hv (where h is Planck's constant and v is the light frequency) at 3.8 eV, compared to 3.2 eV required for the anatase form of titania. They believed this increase in efficiency was the result of band bending at the anode surface that is about 0.2 eV larger than for titania, resulting from the smaller electron affinity of $SrTiO_3$. In their energy-level model for photoelectrolysis, the semiconductor serves as only the means for generating the necessary holes and electrons, without itself reacting chemically. In their model, the low quantum efficiency of titania is not due to inefficient carrier transfer, as others had shown that this was close to 100% with platinized —Pt cathodes and illuminated titania anodes, but rather to insufficient band-bending at the titania surface to cause efficient separation of the electron-hole pairs. The complete process, according to their model as in Ref 2, (which is in substantial agreement with models of other researchers), is that photoelectrolysis occurs because electron-hole pairs generated at the semiconductor surface upon absorption of illumination with the required photon energy are separated by the electric field of the barrier, in the form of the energy-band bending at the surface, preventing recombination. The electrons move into the bulk of the anode and then through the external circuit to the cathode. There, they are transferred to the $H_2O/H_2$ level of the electrolyte and hydrogen gas is released:

$$2e^- + 2H_2O \rightarrow H_2 + 2OH^- \tag{1}$$

Oxygen is produced at the same time as holes are transferred from the anode surface to the $OH^-/O_2$ level of the electrolyte, as:

$$2p^+ + 2OH^- \rightarrow \tfrac{1}{2}O_2 + H_2O \tag{2}$$

In other work that is farther afield from this application, Graetzel invented a titania solar photovoltaic cell in which the functions of absorption of light and the separation of the electric charges ("electrons" and "holes") are not both performed by the semiconductor (titania in this case). Instead, the light absorption is performed by a dye monolayer that is adsorbed onto titania particles, in one case, and onto titania nano-crystals, in another case. In this way he avoids the problem of titania's 3.2 eV bandgap. This technology is now being commercialized by, for example, Sustainable Technologies International. Others have followed his lead and replaced the dye absorber with quantum dot particles attached to the titania particles, where the quantum dots perform the light absorption (QD Photovoltaics, The University of Queensland). In all of this work, however, there is no attempt to alter the bandgap of the titania. Also, the titania layer is required to be microns thick, and is applied as a sol-gel. Such a process requires solvents and temperatures incompatible with polymer substrates. Further, an electrolyte is required to fill the porous gaps in the titania matrix and complete the cell. This electrolyte is non-aqueous and somewhat volatile, so packaging, cell lifetime, and effect on the environment remain problematic. Efficiencies are reported to be around only 5% at this point. Most importantly, such a device provides no direct access to the titania photocatalytic surface, and so cannot be used for hydrogen production, detoxification, or disinfection.

Still further afield is work by researchers at Oxford's Physics and Chemistry Departments, who are devising "inverted" photonic bandgap (PBG) crystals comprising polycrystalline titanium dioxides (titania), while earlier researchers achieved the same with self-assembled titania nano-spheres. Here, the bandgap is determined by the relative indices of refraction of the titania spheres and the empty or lower index media around and in between the spheres, the size of the spheres, and their geometrical arrangement. Again, there is no attempt to alter the bandgap of the titania spheres themselves, and the application is for directing, absorbing, and otherwise controlling light of a certain wavelength. The titania is used for its high refractive index of 2.4 to 2.6, which provides the desired index ratio of greater than 2 to if the immersion medium is air with in index of unity.

So, titania has also been shown to have use in photovoltaic devices. And in addition to photoelectrolysis for hydrogen production, titania's photocatalytic properties have been shown to have beneficial application to disinfection by killing biological organisms, and detoxification by breaking down toxic chemicals. It will be seen that the invention disclosed herein, by enabling titania to function well in visible light, such as sunlight, also applies to photovoltaics, disinfection, and detoxification.

In all of the above work, titania is either in the form of a slab cut from a crystal, and can be either of the most common polymorphs rutile or anatase, or is a thick film resulting from a sol gel process, or else are small particles of crystalline titania either in suspension or hot-pressed into a solid. No one is using, to our knowledge, titania in the form of a thin film deposited in a vacuum coating process.

SUMMARY OF THE INVENTION

One would like a semiconductor photocatalyst with a bandgap that is better matched to the solar spectrum and/or artificial illumination for higher efficiency or even to work at all. In this invention, the bandgap of the known chemically-inert photocatalyst titania ($TiO_2$) is shifted and broadened to be active at wavelengths more prevalent in sunlight and artificial light by inducing and managing sufficiently high stress in titania by vacuum coating a thin film of titania onto a substrate, preferably of a different Young's modulus, with bending undulations on the surface of a spatial radius similar to the film thickness. The undulated coating also serves to self-focus and concentrate the incident light required for the process, increase photocatalytic surface area, and prevent delamination of the film from the substrate. The electrical activity so induced in the band-shifted titania subsequently by visible light is applied to photoelectrolysis (hydrogen production from water and light), photovoltaics (electrical power from sunlight), photocatalytic disinfection and detoxification, point-of-use photoelectrolysis for use in internal combustion engines, for example, and stress-induced tunable bandgap components for communications. In addition, the same stress-induced thin film bandgap shifting works with other semiconductors such as amorphous silicon, and with similar benefits.

Accordingly, this invention provides for shifting, lowering, or reducing the size of, the optical bandgap of a semiconductor into optical wavelengths predominant in the illuminant by stressing (specifically straining) the semiconductor, where the semiconductor is a thin film, and/or where the stress is caused by conditions under which the thin film is formed, and/or where the stress is caused by the shape of the substrate on a nano scale, and/or where the stress is caused by the mechanical, chemical, and thermal properties of the substrate.

In such a semiconductor, the bandgap may be shifted into longer wavelengths by heating. The semiconductor may be titania. The bandgap may be shifted into wavelengths that are abundant in the solar spectrum. The semiconductor may be a photocatalyst. The stress-inducing template profiles may also provide a mechanical lock to the coating so that the stress can exist without causing delamination of the coating from the substrate. The stress-inducing template profiles may create additional surface area without increasing the width or length of the surface, for additional efficiency in photocatalytic action.

The photocatalyst may be used to split an aqueous solution into hydrogen gas and oxygen gas when irradiated. The illumination may be from the sun, or from artificial light. The illumination may be further concentrated by the stress-inducing template shape by self-focusing, and the concentration of the illumination may be largely independent of incident illumination angle, thereby reducing or eliminating the need to track the sun in the sky. The stress-inducing profiles in the substrate may be one-dimensional, such as cylinders, or two-dimensional, such as spheres. The pitch of stress-inducing profile may be chosen relative to the desired illumination wavelength such the absorption is increased and reflection is decreased as in a photonic bandgap crystal. The thickness of the semiconductor layer may be chosen to be ¼ of the wavelength of the desired illumination, thereby acting as an anti-reflection filter and increasing absorption and decreasing reflection. The substrate surface profiles may be chosen to be a certain shape, depth, and radius so that the titania film grows as lenses over the profiles. The thickness of the semiconductor may be chosen so that the focal plane of said lenses is coplanar with the distal surface of the titania layer.

The additional effective surface created by the substrate stress-inducing profiles facilitates and improves heat dissipation. The semiconductor may be formed by heat oxidation, or by anodizing. The semiconductor may be a contiguous film. The semiconductor may be a matrix of particles such as spheres. The substrate can be polymer, glass, silicon, stainless steel, copper, aluminum, or substrate material.

The photocatalyst may be used to detoxify a medium in contact with it. The photocatalyst may also be used to disinfect a medium or biological agent in contact or proximal with it.

The substrate may be transparent or reflective, and can be flexible. The substrate and titania formation are compatible with a roll-to-roll web manufacturing process. The substrate profiles may be embossed into the substrate with a stamper from a master, or molded into the substrate with a stamper from a master, or caused by reticulation in the substrate or in a layer applied to the substrate. The semiconductor-coated substrates can be stacked in layers to increase efficiency in a given area, and may be pre-coated on the reverse side with a transparent conducting electrode such as indium tin oxide (ITO). The substrates may be edge-illuminated.

The semiconductor used in the present invention can be titania, strontium titanate ($StTiO_3$) silicon, or other semiconductor.

The titania-coated substrate(s) of the present invention can function as the anode in a photoelectrolytic cell, which further comprises some or all of the following: a housing, an aqueous electrolyte, a gas separation septum, a cathode, and a bias source. The photoelectrolysis may store solar energy chemically in the form of hydrogen, which may be further combined into a metal hydride or other adsorber. Nano-lenses on the substrate may improve performance in low light level and diffuse light applications. The present invention may be applied to both terrestrial and space environments. The illumination used in the present invention may be supplied by a laser diode or laser, a spark between electrodes, or a flashlamp. The hydrogen may be produced at point of use by artificial illumination.

The substrate shape may be used to increase or otherwise control the stress in the titania film; the shape can be concave or convex or a mix of both, and the scale of the radius of curvature can be from nanometers to meters. The substrate may be a piezo device such that the amount of stress induced in the semiconductor film, and therefore the bandgap, is tunable over a range, for use in photonics. The substrate may be temperature controlled, such that by changing the temperature the substrate contracts or expands and causes a tunable bandgap shift in the semiconductor layer. The substrate may be a very small particle or sphere, typically several microns in diameter but as small as tens of nanometers in diameter, and the material may be a polymer, glass, metal, or other material coated with titania or other suitable semiconductor. The sphere may be one of many applied to a surface or surfaces, or are in suspension in a fluid, and can be applied by spraying, painting, or inkjet deposition. Alternatively, the substrate may be a small diameter polymer or other fiber, and the semiconductor-coated fiber may be woven into fabrics for protective clothing, or into mesh filters for water or air filtration, or into paper for envelopes that are readily antibiotic when illuminated with daylight or artificial light.

The present invention may be used in photovoltaic applications, for which the stress is enabling (titania) or improving (amorphous silicon), in photoelectrolysis, detoxification, disinfection, and point-of-use photoelectrolysis. The present invention may also be used for continual tuning of stress and bandgap properties for telecommunication applications, to alter and improve magnetic properties of thin films applied to hard drive disks for data storage, and to provide a corrugated substrate to which a desired titania or other thin film will adhere under stress but will not cause scatter or diffraction due to its sub-wavelength spatial period.

In the semiconductor-coated stressed films of the present invention, a sinusoidal interface at the high index thin film and low index substrate or low index air or water respectively may cause an effective index that varies gradually from one index to the other, with gradient index benefits of improved transmission and reduced reflection. The photocatalyst may be a thin film, thereby reducing the probability of recombination of the hole and electron pairs that occurs in bulk semiconductors in the absence of an anode (or cathode) and electrolyte. A titania coating may evaporated from a titania target, a titanium target with oxygen bled into chamber, or a $Ti_xO_y$ target such as $Ti_2O_3$. The titania coating may comprise rutile and/or anatase and/or other polymorphs, as well as amorphous titania. Additional thin films may be applied between the semiconductor and the substrate in order to promote adhesion or to further modify the stress in the semiconductor. In the photocatalytic method of the present invention, the combustion product is clean desalinated water, so that the photocatalytic device provides desalination and purification of water. A point-of-use photocatalyst device may used in a hydrogen-based internal combustion engine.

This invention provides apparatus for utilizing different parts of the solar spectrum simultaneously to carry out photo-induced reactions and to generate electricity, the apparatus comprising:
  a primary reflector arranged to concentrate radiation incident thereon to a primary focus;
  a secondary reflector disposed at or adjacent the primary focus and arranged to direct radiation incident thereon to a secondary focus;
  photovoltaic means for converting radiation to electricity; and
  photo-reactor means for carrying out at least one photo-induced reaction, the photo-reactor means comprising at least one photoactive electrode,
  wherein one of the photovoltaic means and the photo-reactor means is disposed at or adjacent the primary focus, and the other of the photovoltaic means and the photo-reactor means is disposed at or adjacent the secondary focus.

In this apparatus of the present invention, the photovoltaic means may use a first wavelength range for converting radiation to electricity and the photo-reactor means may use a second wavelength range at least part of which differs from the first wavelength range, and the secondary reflector may comprises a wavelength selective reflector arranged to reflect one of the first and second wavelength ranges to the secondary focus. The photo-reactor means may comprise a counter-electrode in addition to the photoactive electrode, and the apparatus may further comprising conductors connecting the photovoltaic means to the counter-electrode and photoactive electrode so that the voltage generated by the photovoltaic means is applied as a bias voltage across the counter-electrode and photoactive electrode. The photoactive electrode may comprise titania, desirably titania which is stressed such that at least part of the titania has its bandgap shifted to longer wavelengths in any of the ways taught herein. For example, the titania may have been produced by acid etching of titanium metal, followed by at least one of anodizing and heat oxidation of the acid etched titanium to convert at least part of the titanium to anatase.

Also, in this apparatus of the present invention, the photo-reactor means may comprise a counter-electrode and a liquid-tight container surrounding the counter-electrode and the photoactive electrode, the container containing an aqueous medium capable of being electrolyzed to produce hydrogen and oxygen. The apparatus may further comprise a substantially tubular inner vessel disposed within the container and having apertures extending therethrough through which the aqueous medium can pass through the tubular inner vessel, the counter-electrode being disposed within the inner vessel, and the photoactive electrode having the form of a sheet outside and extending partially around the tubular inner vessel.

In one form of such apparatus, the photo-reactor means is disposed at or adjacent the secondary focus, and the photoactive electrode has substantially the form of a hollow tube having an aperture through which radiation can enter the tube, the inside surface of the photoactive electrode being photoactive.

As an alternative to the use of tubular inner vessel, the apparatus may comprise a septum disposed within the container and essentially dividing the interior of the container into two chambers, with the photoactive electrode disposed in one chamber and the counter electrode in the other chamber. At least one portion of the septum adjacent the container may be provided with grooves which extend between, and provide ionic conduction pathways between, the two chambers. Alternatively, the septum may be formed of an open cell material, the open cells providing ionic conduction pathways between the two chambers.

The apparatus may comprise drive means for rotating the primary reflector around an axis to enable the primary reflector to track the sun.

This invention also proves a method for bringing about a photoinduced chemical reaction in a liquid. Such a method comprises:

providing an apparatus comprising:
a primary reflector arranged to concentrate radiation incident thereon to a primary focus;
a secondary reflector disposed at or adjacent the primary focus and arranged to direct radiation incident thereon to a secondary focus;
photovoltaic means for converting radiation to electricity; and
photo-reactor means for carrying out at least one photo-induced reaction, the photo-reactor means comprising at least one photoactive electrode in contact with the liquid,
wherein one of the photovoltaic means and the photo-reactor means is disposed at or adjacent the primary focus, and the other of the photovoltaic means and the photo-reactor means is disposed at or adjacent the secondary focus
allowing electromagnetic radiation to fall on the primary reflector, to be reflected therefrom to the secondary reflector, and to be again reflected to the secondary focus, whereby at least part of the radiation falls on the photoactive electrode, thereby causing the photoactive electrode to bring about the reaction in the liquid, and a second part of the radiation falls on the photovoltaic means, thereby causing the photovoltaic means to generate an electric potential.

In this method, the photovoltaic means may be electrically connected to the photoactive electrode so that the electric potential generated by the photovoltaic means is applied between the photoactive electrode and a counter electrode. The liquid may be an aqueous solution such that the reaction effected is the generation of hydrogen and oxygen gases from the liquid.

This invention provides a process for producing a titania electrode comprising primarily anatase (with possibly a minor proportion of rutile) having a bandgap lower than that of unstressed anatase, the process comprising:
(a) subjecting titanium metal to an etchant (which may be an acid etchant); and
(b) oxidizing at least part of etched titanium to anatase by at least one of (i) anodizing the titanium in an acid or other anodizing solution, and (ii) heating the titanium in an oxygen-containing atmosphere.

In this process, the titanium metal used may be an impure form containing not more than about 99.6 percent titanium by weight, for example Grade 1 titanium having the following specification by weight:
C 0.1% maximum
Fe 0.2% maximum
H 0.015% maximum
N 0.03% maximum
O 0.18% maximum
Ti 99.5% minimum, up to about 99.6%.
or Grade 2 titanium having the following specification by weight:
C 0.1% maximum
Fe 0.3% maximum
H 0.015% maximum
N 0.03% maximum
O 0.25% maximum
Ti 99.2% minimum, up to about 99.6%.
The titanium metal used may be in the form of a foil, sheet or film from about 0.1 to about 1 mm thick.

Step (a) of the process, in which the nano-structures are formed, may be effected using sulfuric acid having a concentration of at least about 93 percent by weight at a temperature of about 60 to about 100° C. In a preferred from of the process, the sulfuric acid has a concentration in the range of about 93 to about 98 percent by weight and the acid etching is effected at a temperature of about 75 to about 85° C. The acid etching may be carried out for a period of from about 60 to about 600 seconds from the onset of visible bubbling.

Step (b) of the process, in which the titania of substantially anatase morphology is formed, may be effected by anodizing in an aqueous medium having a pH in the range of about 1.5 to about 2.5 and at a temperature of about 60 to about 100° C. The anodizing may be effected at a maximum voltage of from about 70 to about 100 Volts. The anodizing may also be effected at a voltage which increases with time, for example the voltage may increase with time substantially according to the equation:

$$V = V_{Final}(1 - e^{-at})$$

where a is an arbitrary constant.

Alternatively, the titania formation in step (b) may be effected by heat oxidizing the titanium at a temperature of at least about 630° C. for a period of not more than about 300 minutes, and preferably at a temperature of about 635 to 735° C. for a period of about 300 to about 10 minutes. The variation of the photoactivity of the resultant titania electrode with the time and temperature used in the heat oxidation step is somewhat complex and is discussed in detail below with reference to FIG. 31. The heat oxidation may be effected in air to which additional oxygen has been added.

This invention also provides a photoelectrolytic cell for production of first and second gases from a liquid, the cell comprising: a container capable of holding the liquid; a photoelectrode disposed within the container and capable of generating the first gas upon exposure to radiation; a counterelectrode disposed within the container electrically connected to the photoelectrode and capable of generating a second gas when the photoelectrode is exposed to radiation; and a septum arranged between the photoelectrode and the counterelectrode to separate the first and second gases.

This invention also provides an apparatus for generating electricity and/or for carrying out photo-induced reactions, the apparatus comprising: a container capable of holding the liquid; a photoelectrode disposed within the container and capable of generating the first gas upon exposure to radiation; and a counterelectrode disposed within the container electrically connected to the photoelectrode and capable of generating a second gas when the photoelectrode is exposed to radiation, wherein the photoelectrode has a plurality of apertures extending therethrough, said apertures serving to improve migration of ions between the photoelectrode and the counterelectrode.

This invention also provides a photoelectrolytic cell for production of at least one gas from a liquid, the cell comprising: a container capable of holding the liquid; a photoanode disposed within the container; a cathode disposed within the container and electrically connected to the photoanode, such that when the photoanode is exposed to radiation, at least one gas will be generated by the photoanode and the cathode; and a second anode disposed within the container, the second anode not being photolytically active but being electrically connected to the cathode.

This invention also provides an apparatus for generating electricity and for carrying out photo-induced reactions, the apparatus comprising: a primary reflector arranged to concentrate radiation incident thereon to a primary focus; a dichroic mirror disposed at or adjacent the primary focus and arranged to pass a first band of radiation therethrough and to reflect a second band of radiation having wavelengths differing from those of the first band; photovoltaic means for converting radiation to electricity; and photo-reactor means for carrying out at least one photo-induced reaction, the photo-reactor means comprising at least one photoactive electrode, wherein one of the photovoltaic means and the photo-reactor means is arranged to receive the first band of radiation passing through the dichroic mirror, and the other of the photovoltaic means and the photo-reactor means is arranged to receive the second band of radiation reflected from the dichroic mirror.

This invention also provides an apparatus for generating electricity and for carrying out photo-induced reactions, the apparatus comprising: a primary reflector arranged to concentrate radiation incident thereon to a primary focus; a secondary reflector disposed at or adjacent the primary focus and arranged to direct radiation incident thereon to a secondary focus; photovoltaic means for converting radiation to electricity; and photo-reactor means for carrying out at least one photo-induced reaction, the photo-reactor means comprising at least one photoactive electrode, wherein one of the photovoltaic means and the photo-reactor means is disposed at or adjacent the primary focus, and the other of the photovoltaic means and the photo-reactor means is disposed at or adjacent the secondary focus, the apparatus having a Dall-Kirkham reflective design, with an elliptical primary reflector and a cylindrical secondary reflector.

This invention also provides a mirror assembly for concentrating incident radiation on a locus, the mirror assembly comprising: a support member; two end caps mounted on the support member and spaced apart from one another, each end cap having a mounting surface facing the other end cap, and a curved groove cut into its mounting surface; and; a flexible substrate having one reflective surface mounted in the curved grooves on the two end caps so that the reflective surface of the flexible substrate concentrates incident radiation on a locus.

This invention also provides a photoelectrolytic cell for production of at least one gas from a liquid, the cell comprising: a container capable of holding the liquid; a photoanode; a cathode electrically connected to the photoanode, such that when the photoanode is exposed to radiation, at least one gas will be generated by the photoanode and the cathode, wherein the container is substantially cylindrical and at least part of the container is light transmissive such that the light transmissive part of the container concentrates light on the photoanode.

Finally, this invention provides a photoelectrolytic cell for production of at least one gas from a liquid, the cell comprising: a container capable of holding the liquid, the container having first and second apertures extending therethrough; a photoanode; a cathode electrically connected to the photoanode, such that when the photoanode is exposed to radiation, at least one gas will be generated by the photoanode and the cathode; a liquid circulation tube disposed outside the container extending from the first aperture to the second aperture thereof such that liquid contain from the interior of the container through the first aperture, through the liquid circulation tube and back into the container through the second aperture; and heat extraction means arranged to extract heat from the liquid in the liquid circulation tube.

Other features of the invention will be readily apparent when the following detailed description is read in connection with the drawings.

BRIEF DESCRIPTION OF THE DRAWINGS

The structure and operation of the invention, together with objects and advantages thereof, may best be understood by reading the detailed description to follow in connection with the drawings in which unique reference numerals have been used throughout for each part and wherein:

FIGS. 3A to 3C are schematic cross-sections through three stressed titania films of the invention and the underlying substrate, showing the stress in the coated titania layer, while

FIG. 30A shows a full band structure plot for the anatase structure, while

FIG. 42 shows X-ray diffraction patterns for three different anodized titanium film and illustrates the presence of anatase in all three films.

FIGS. 45A to 45D are graphs showing the rate of hydrogen generation of solar conversion efficiency of an apparatus as shown in FIGS. 16, 17 and 22 under varying conditions of temperature, illumination and bias voltage.

DETAILED DESCRIPTION

It is known that the bandgap of a semiconductor can be altered by (1) doping, (2) adding stress, and (3) adding heat. This invention makes use of the stress that is inherent in thin films, and specifically the tensile stress, to shift the bandgap of a semiconductor further into the visible spectrum. Bandgap-shift from local heating from self-focusing of the illuminant in the film is also disclosed as contributing to the effect, but this appears to be a secondary effect in this invention. For example, the energy bandgap of GaAs, or gallium arsenide, requires a 900° C. change in temperature to drop only 0.4 eV, from 1.5 eV at 100° C. down to 1.1 eV at 1000° C. On the other hand, significantly higher magnitude changes in stress can be achieved in this invention, and so stress is the predominant factor in the lowering of the bandgap energy.

Figure 1:
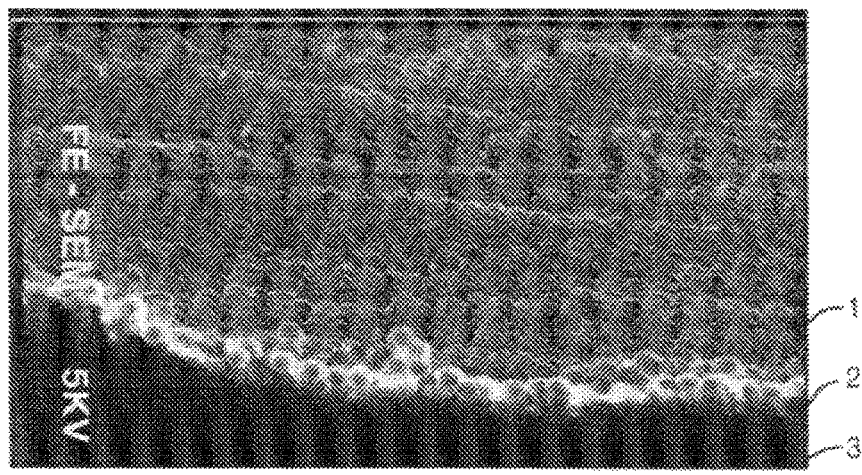
FIGS. 1, 2A and 2B are scanning electron micrographs of titania films of the present invention on substrates
Figure 2A:
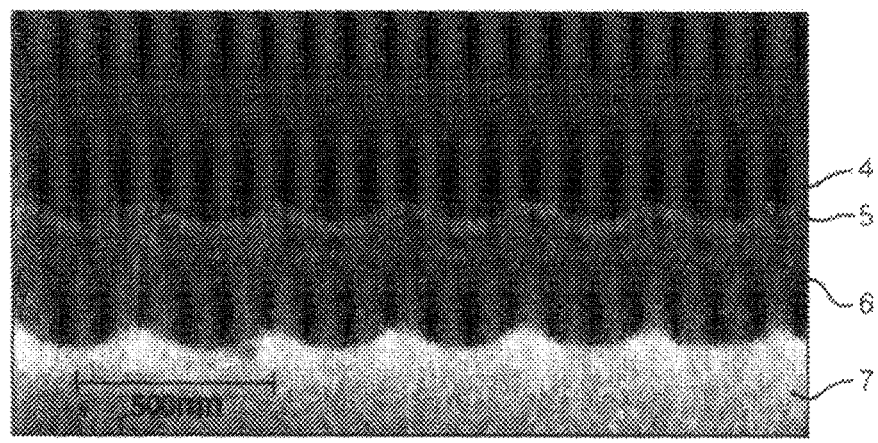
Figure 2B:
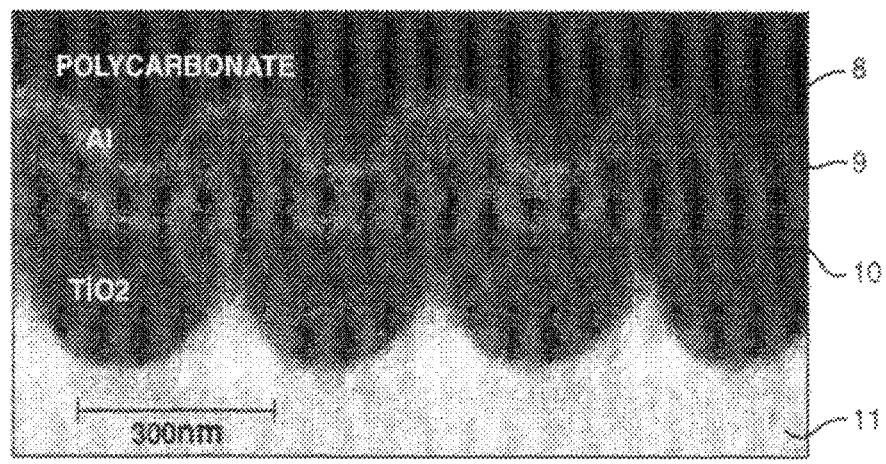

When tensile stress is applied to or caused in a semiconductor, the inter-atomic spacing increases directly. An increased inter-atomic spacing decreases the potential seen by the electrons in the material, which in turn reduces the size of the energy bandgap. The same effect occurs with increased temperature, because the amplitude of the atomic vibrations increases with the increased thermal energy, thereby causing increased inter-atomic spacing. The main feature of this invention, accordingly, is that the stress is carefully controlled to achieve the desired bandgap shift, and further managed to prevent delamination, by introducing periodic three-dimensional nano-scale surface features into or onto the substrate. These features act as a template such that the film that is grown onto the template takes on a similar shape. FIG. 1 is a scanning electron micrograph of a titania film 1 grown onto a polycarbonate template 3 comprising a close-packed three dimensional sinusoid surface 2, much like an egg carton, with a spatial period of 300 nanometers (nm) or 0.3 microns. FIG. 2A is a scanning electron micrograph of a cross-section of another polycarbonate template 4, in which the surface geometry comprises cylinders 5 with a spatial period of 300 nm, which result in stressed titania layer 6, which is immersed in air 7 in this figure. This is an example of a conformal coating, in which the undulations in the titania layer have the same shape and profile as in the substrate. FIG. 2B is a scanning electron micrograph of a cross-section of yet another polycarbonate template 8, in which the surface geometry 9 again comprises cylinders with a spatial period of 300 nm, but the peak to valley depth is larger than in FIG. 2A. This results in the titania coating 10 having a final shape that is more cylindrical than sinusoidal, an example of a non-conformal coating, which in turn changes both the stress characteristics in the film as well as the optical self-focusing characteristic. The titania coating 10 is facing a medium 11 that is air in this image, but for photoelectrolysis this would be an aqueous or hydrogen-bearing liquid.

Figure 3A:
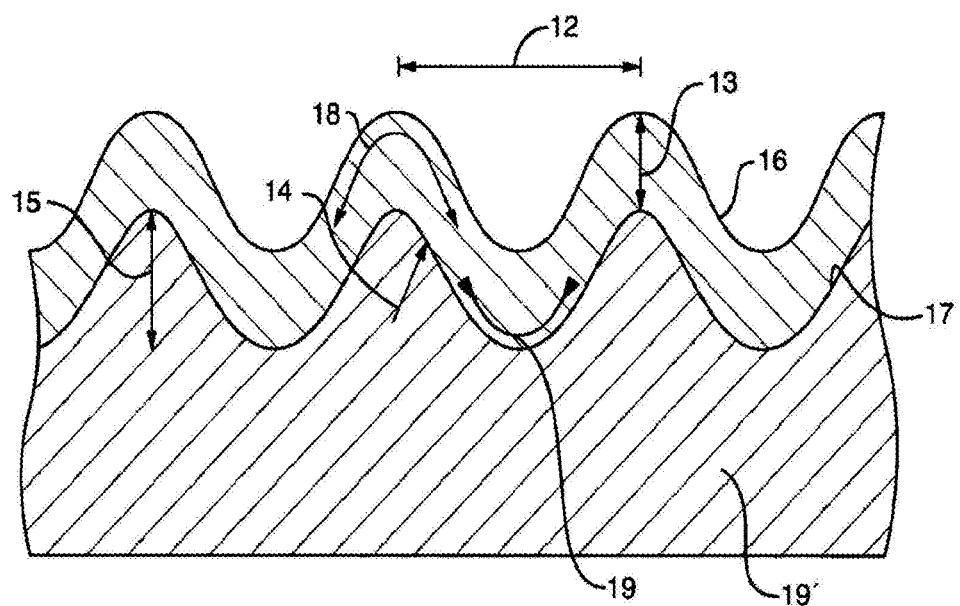

FIG. 3A is a cross-section showing a substrate 17' having undulations 17 on its surface that transfer to a titania coating 16 applied by a vacuum technique. The titania coating has a film thickness 13 of about 200 nm, although it can be thinner or thicker depending on the coating conditions and the geometry of the substrate. As was seen in FIG. 2, the titania coating undulations can be made conformal, i.e. they can follow the curves in the substrate exactly, but they can also be made non-conformal, more like adjacent hemi-cylinders, with sharp cusps in between, depending on the coating film growth conditions and target to sample geometry, and the substrate undulation geometry: peak to valley height 15, radius of curvature 14, and pitch 12. With a polycarbonate substrate 17', the thermal contraction of the polycarbonate after coating is larger than of the titania thin film, resulting in very high stresses in the titania layer, namely tensile stress (indicated at 18) at the apices of the undulations, and compressive stress (indicated at 19) in the troughs. Such compressive and tensile stresses are present in thin film coatings on planar substrates as well, depending on whether the substrate grows or shrinks, respectively, relative to the film after coating, and such surfaces are within the scope of this invention when applied to stress-induced bandgap shifting, particularly of titania.

Figure 3B:
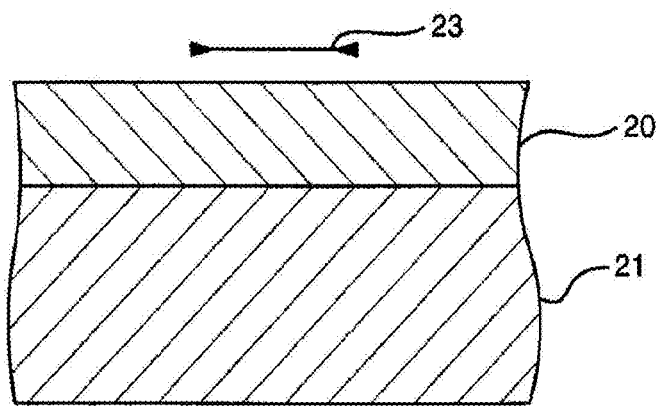
Figure 3C:
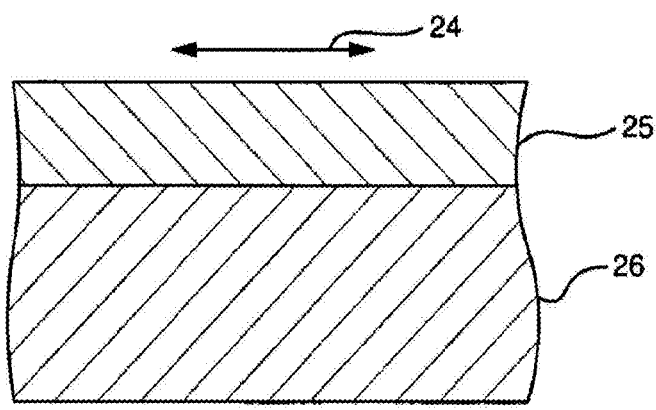
Figure 3D:
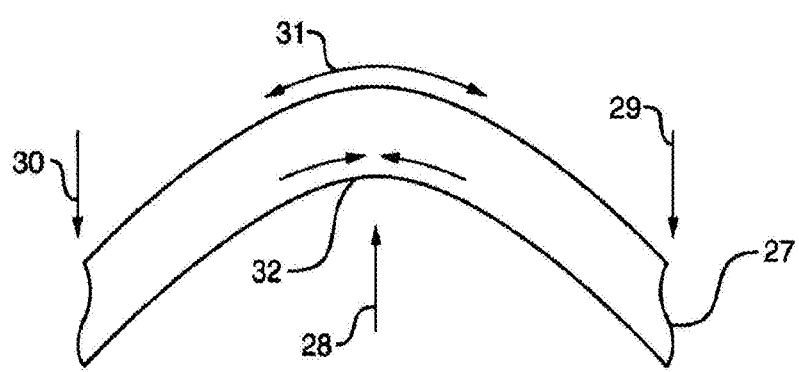
FIG. 3D is a schematic cross-section through a bent planar film showing the stresses in the film.

FIG. 3B is a cross-section through such a planar substrate 21 and titania coating 20, in which the stress (indicated at 23) is compressive, while FIG. 3C is a similar cross-section through a planar substrate 26 and planar coating 25 in which the stress (indicated at 24) is tensile stress. FIG. 3D is a cross section of a planar film 27 that is bent by upward force 28 and downward forces 29 and 30, which results in tensile stress 31 and compressive stress 32. These bending stresses are the basis for the stress induction in this invention. The undulations in the preferred embodiments create much higher tensile stresses because of the introduction of very small localized bending radii, such as the radius 14 in FIG. 3A. In addition, in some embodiments of the invention the undulations provide a mechanical lock between the substrate and the coating, which allows high stresses to exist without delamination.

The resulting bandgap-shifted semiconductor, titania in the preferred embodiment, is then applied to photoelectrolysis for hydrogen production, or for photovoltaic electricity production, or photocatalysis for detoxification and disinfection, as described below. Other semiconductors, including but not limited to strontium titanate, amorphous silicon, hydrogenated amorphous silicon, nitrogenated amorphous silicon, polycrystalline silicon, and germanium, and combinations thereof, will also exhibit a shift in their respective band-gaps toward a more favorable part of the solar spectrum with this applied stress.

Thin films, whether for optical, magnetic, semiconductor, or other application, and whether of dielectric, metallic, semiconductor, or other material, are typically inherently stressed as applied. Stress in thin films can lead to delamination of the film from an adjacent layer, also known as adhesion failure, and can also change the optical, magnetic, or electronic properties of the film. Therefore, stress in thin films is normally thought of as something to be managed or tolerated rather than as something useful. In films produced by one process described in the parent application, in which the film is formed by vacuum coating onto a shaped substrate, stress is controlled by, and herein also induced by, the following non-limiting factors: (1) film thickness; (2) rate of application (film growth) measured in angstroms/second; (3) mean free path and vacuum level; (4) e-beam energy; (5) match of film and substrate mechanical and thermal coefficients; (6) shape of the substrate on both a nanometer and macro level; (7) target material from which the film is evaporated; (8) distance of the substrate to the source (tooling factor); (9) the presence or absence of mitigating layers; and (10) implanting ions during or after deposition to change the material and stress. Stress in the film can be made to be either tensile or compressive, and is induced also by bending. Stress in the film can also be photo-induced, especially if the film is self-formed into internally or self-focusing optics.

The films described here are contiguous thin films, rather than particles. However, it is known in the art than on a nano and micro scale all thin films exhibit some crystalline structure, particulate aggregation, and porosity. Also, small polymer or other particles, such as titanium in the present application, can be coated with titania or have the titania grown into and onto them to cause the stress-inducing band-gap shifting on a particle level, and these particles can be applied through, for example, a spray, or in a suspension applied by inkjet, or simply painting them on, suspended in a binder. Further, a titania coating can be applied to fibers, especially polymer fibers, to achieve the same stress-induced benefits. These fibers can then be woven into protective fabrics for garments, into air filters, or into paper for antibiotic envelopes.

Titania films can be formed with chemical vapor deposition, sol-gel, or vacuum coating, for example. With chemical vapor deposition, the material is deposited as an ash, which then coalesces into a contiguous film upon application of heat from, typically, a gas flame. Sol gel coatings have the titania particles in a solvent that is spun coated or dipped or otherwise applied to a substrate. If the solvent is driven off, the film that remains is a porous matrix of titania particles. This is done typically for the dye-adsorbed solar application of titania. The film can be several microns thick, and the dye within the porous cavities increases the amount of surface area for interaction. If this film is baked, the titania particles will coalesce into a reasonably contiguous film.

While it is possible to induce the required stress with the above coating approaches, thin film vacuum deposition is preferred for inducing the highest stress and with the lowest amount of material. Typical vacuum deposition methods include sputtering, electron-beam, and ion deposition, for example. The inventors' earlier work with these structures, which at this size are nano-optics, for the application of increasing optical data storage density, has shown that they indeed focus incident light and increase the power density at their focal plane (rigorous electromagnetic modeling, thermal finite element modeling, and empirical results with phase change materials placed at the focus plane all corroborate this). Further, their sinusoidal to cylindrical shape naturally gives rise to significant tensile stress. One or both of these factors cause the bandgap to drop to a level at which spontaneous photoelectrolysis of water can occur in a spectral region that is abundant in sunlight. Stress in thin films can be controlled by a combination of film thickness, substrate-to-film match or mismatch of thermal and mechanical coefficients, micro or nano-scale shape, and by the addition of other thin films.

While there is certainly a benefit to having the stress-inducing shape perform also as a light concentrator, it will be clear that other stress-inducing template profiles may be used, even if they do not also act as light concentrators.

Stress in thin films can be as low as 2 MPa (MegaPascal), but is more typically up to 100 MPa, and can reach into the GigaPascal region depending on the coating conditions, the thin film or thin film stack, and the substrate. The stresses can be so high that a thin dielectric film only a couple of hundred nanometers thick can cause a substrate as thick as a millimeter to be noticeably distorted by bending, and in fact this distortion is used to monitor stress optically by observing deflection of light from such a bending substrate during coating.

The stress in the thin film $\sigma$ can be expressed to first order as the intrinsic film stress $\sigma_i$ caused by the coating conditions plus stress $\sigma_e$ from an external bending force F (in Newtons N):

$$\sigma = \sigma_i + \sigma_e \qquad (3)$$

where it is assumed that the Young's moduli of film and substrate are equal. However, additional stress can be induced in the thin film when Young's moduli of film and substrate are decidedly unequal. Moreover, if the substrate/film interface is undulating on a spatial scale of the same order of magnitude to the thickness of the coating, such unequal moduli result in significant bending forces on the film. The relation of the external stress $\sigma_e$ to the bending force F is:

$$\sigma_e/F = 12 \text{ MPa/N} \qquad (4)$$

It can be seen from Equation (4) therefore, that even small external forces are leveraged into large stresses in the film. A film of titania only 125 nm thick, deposited on a thick polycarbonate substrate having a surface embossed or otherwise formed into a sinusoidal, hemispherical, or hemicylindrical geometry with a spatial period of 370 nm, can experience stress in the GigaPascal range or higher, sufficient to significantly alter the bandgap. Such stresses in planar thin films can cause the films to crack and even delaminate from the substrate, where in the compressive stress case the film behaves much like the earth's crust in plate tectonics, and literally explodes away from the surface, leaving a gaping crack (see FIG. 9a in the aforementioned Guerra, "Photon Tunneling Microscopy Applications"). In the tensile stress case, the film pulls away from itself, leaving a crack in the coating that scatters light (see FIG. 8b in Guerra, "Photon Tunneling Microscopy Applications"). Scientists in the thin film coating world usually strive to reduce stress in thin films, accordingly. However, it is recognized that some level of stress will always be present in a thin film, and so when stresses cause delamination, they refer to this as adhesion failure, in recognition that controlling and increasing adhesion between the layer and the substrate will allow the layer to remain intact in the presence of modest internal stress if the adhesion is high enough. In one aspect of this invention, the corrugated substrate not only causes the film to be in a highly stressed state, but also locks the film to the substrate and prevents delamination, even though in a highly stressed state.

As described above with reference to FIG. 3A, titania at the apex of a sinusoidal surface experiences tensile stress, while the titania in the trough of the sinusoidal surface experiences compressive stress. Thus, in photoelectrolysis, detoxification, and disinfection, the desired photocatalytic activity is induced in the titania at the part of the surface (apex) closest to the object of photocatalysis. Because the stress varies continuously from tensile to compressive, the bandgap is not only shifted but broadened as well. Further, more of the film is in a beneficially stressed state than would be the case for a bulk form of the titania, where the stress would be largely near the surface and a comparatively much smaller percentage of the bulk volume of the semiconductor.

Figure 4:
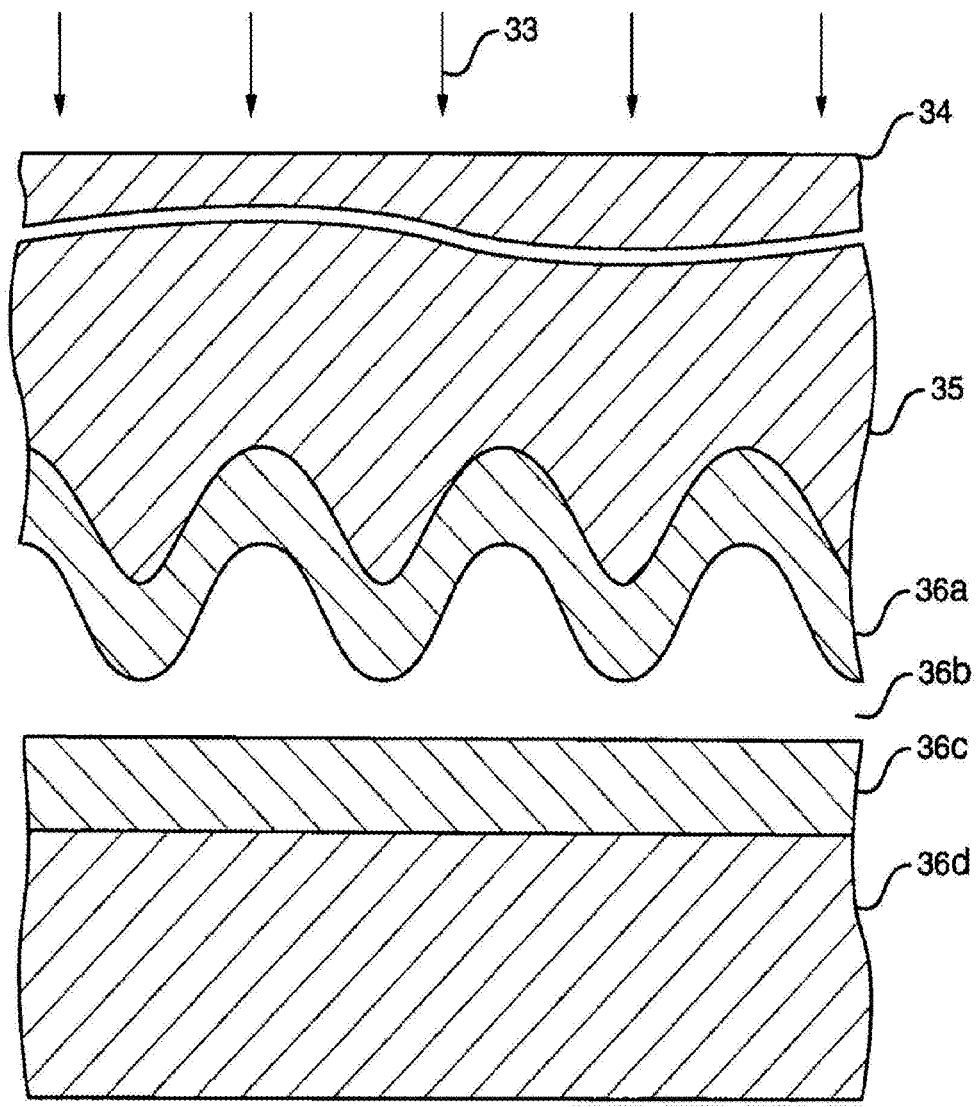
FIG. 4 is a schematic cross-section through a titania film and substrate of the present invention and shows the directions of illumination used in experiments described below.

The description of an illustrating experiment and results follows, and is shown in FIG. 4.

It is known that the bandgap of a semiconductor can be markedly decreased by (1) applying tensile stress and/or (2) elevating its temperature. In fact, in semiconductor devices this is known as "package shift", in which for example a bandgap reference is shifted in voltage after packaging in plastic, from the package-induced stresses resulting from the thermal coefficient mismatch between the encapsulating plastic and the silicon device. Unlike that example, however, in which the effort and desire is to reduce the stress and resulting bandgap shift, herein the shift is a beneficial effect that one would like to amplify and control. So, one would like a surface coated with $TiO_2$ that applies tensile stress to the $TiO_2$ layer (and perhaps elevates the temperature as well). For this photoelectrolysis application, $TiO_2$ 36a was coated onto a polycarbonate surface 34 into which had been formed, by molding replication from a nickel stamper, undulations 35 in the form of sinusoidal to cylindrical profiles. The $TiO_2$ grows on this template shape during the vacuum coating process to form lenses. For this experiment the lenses happened to be cylinders arranged in a continuous spiral track, with the pitch of the cylinders, and therefore their width, being 370 nm. The polycarbonate substrate is 0.6 millimeters thick, and the titania film is 210 nanometers thick.

The experimental apparatus comprised a Nikon optical microscope with a tungsten-halogen 50 W light source. A 40×0.6 numerical aperture (N.A.) objective focused the light 33 down to the polycarbonate substrate 34, with the planar surface facing the microscope. The corrugated surface (370 nm pitch) coated with the 210 nm thick $TiO_2$ faced a first-coated aluminum 36c on glass 36d mirror. Tap water 36b was dripped into the interface, forming and aluminum/water/$TiO_2$ sandwich. Focus was adjusted to cause the brightest back-reflection, and then the experiment was visually checked periodically through the microscope.

After an elapsed time of 10 minutes, bubbles were observed inside but near the edge of the illuminated field. These bubbles rapidly increased in number over the next few minutes until they began to merge. Eventually, the merged bubbles created a zig-zag geometry similar to that observed when free surface coatings de-wet from the surface. The orientation of the zig-zag stripes were observed to be perpendicular to the cylinder axis, and this repeated in subsequent experiments. This zig-zag pattern is also consistent with modeled bandgap change in strained semiconductors (Yang).

At lower power, Newton fringes were observed on a larger scale surrounding the zig-zag pattern, which was limited to the field of view. These fringes indicated a convex bulging distortion of the sandwich, caused by gas pressure.

With a green filter (540 nm) in place, the experiment did not repeat, thereby placing an upper limit on the degree of bandgap shifting in this case. The lower limit was determined by measuring the spectrum of the illumination at the focus of the microscope with an Ocean Optics spectrophotometer, which showed no significant illumination below 490 nm, and therefore one would not expect any photocatalytic action to be observed in the titania, which requires illumination of about 390 nm wavelength because of its 3.0 eV bandgap.

In the flat $TiO_2$ coated areas of the same disc (i.e., where there are no corrugations), nothing happened even after hours of exposure. Similarly, nothing happened with $TiO_2$ coated glass witness samples. This indicates that the corrugated surface profile is necessary, whether for the tensile stress or the optical temperature elevation it causes, or both.

Other lensed surfaces were tried. GaP and $ZnS/SiO_2$ showed no activity after hours of exposure, indicating the semiconductor bandgap property of $TiO_2$ was required.

Other thickness $TiO_2$ coatings showed various results. At 190 nm, no activity was observed. At 230 nm, activity was observed but took longer. This is consistent in that the stress in an optical thin film is dependent on, among other parameters, the film thickness. However, this may indicate that the optical focusing is also important, along with the temperature elevation associated with optical focus.

That the activity was restricted to the area inside the field of view indicates that this is in fact a light-driven process.

The spectral output at the focus of the microscope was similar to sunlight, with no significant radiation below 490 nm wavelength. The power output at the focus, measured with a Newport photodiode with peak sensitivity at 520 nm, was 0.1 Suns.

The same sandwich was placed in sunlight, with a mask covering a portion. Once again, bubbles were observed even by eye and subsequently under the microscope, and the bubbles stopped at the edge of the mask.

It should be noted that no attempt was made to make the $TiO_2$ a conductive n-type semiconductor, as was done in earlier studies, by heating to drive off oxygen (although, such films on planar glass, typified by their blue color, did not work here). Also, the water was just tap water, and not intentionally an electrolyte such as $H_2SO_4$ or NaOH. Further, no attempt was made to contact the anode to the cathode to complete the cell. There may also have been an aluminum oxide overcoat on the aluminum mirror. Any dissolved oxygen in the water was not purged.

In the prior art discussed in the Background, when titania was used as the photocatalyst, it was typically in the rutile form, and n-type, and was a wafer cut from a rutile crystal. Others have used hot pressed titania in a polycrystalline form, and others have used the anatase form, reporting a slightly better efficiency. No one is disclosing the use of titania in the form of a vacuum deposited thin film, and no one is disclosing thin films of titania deposited onto plastic substrates with or without corrugations on the surface. In such a vacuum deposited thin film of titania as is being disclosed herein, the film can have several material states: polycrystalline, amorphous, anatase polymorph, and rutile polymorph. How many and what kind of states exist and coexist in the film, and in fact even the stoichiometry, are determined by how the film is deposited (e.g. ebeam), what substrate it is deposited onto, and what conditions were used in the coating process (substrate temperature, deposition rate, pressure, and starting target, for example). These same conditions also control the level of stress in the film. For example, titania films deposited with e-beam evaporation are typically amorphous, with higher refractive index n than with titania films deposited by, say, ion assisted deposition. On the other hand, energetic ion- and plasma-based deposition produces denser titania films that are also less rough than those deposited with e-beam. It is further known that substrate temperatures above 380° C. result in polycrystalline titania films of primarily the rutile phase, while substrate temperatures of between 310° C. and 380° C. produce polycrystalline titania with both anatase and rutile phases. Titania can be formed with a TiO or even Ti target and oxygen bleed-in during the deposition, and this reactive evaporation results in predominantly rutile titania, while starting with a $Ti_3O_5$ target results in anatase titania. Other features of the titania film, such as density, roughness, resistance to water adsorption, and stress are also highly dependent on the starting target material. For example, the $Ti_3O_5$ target is chosen because films made from it are lower stress, which is not a desirable feature in this application. Optical absorption is another property controlled by the starting material, and is reduced by a factor of 10 with TiO as the target material, and by a factor of 100 with $Ti_2O_3$ or $Ti_3O_5$ as the target. Of course, the science of coating, and in particular the coating of titania films, is very complex and not completely predictable, and is largely outside the scope of this application. Nevertheless, it should be recognized that this invention includes titania films formed by a number of different coating techniques, coating parameters, and starting materials. The discussion included here is only to indicate some of the controls that are available and possible to form titania with a specified material state or states.

Figure 5:
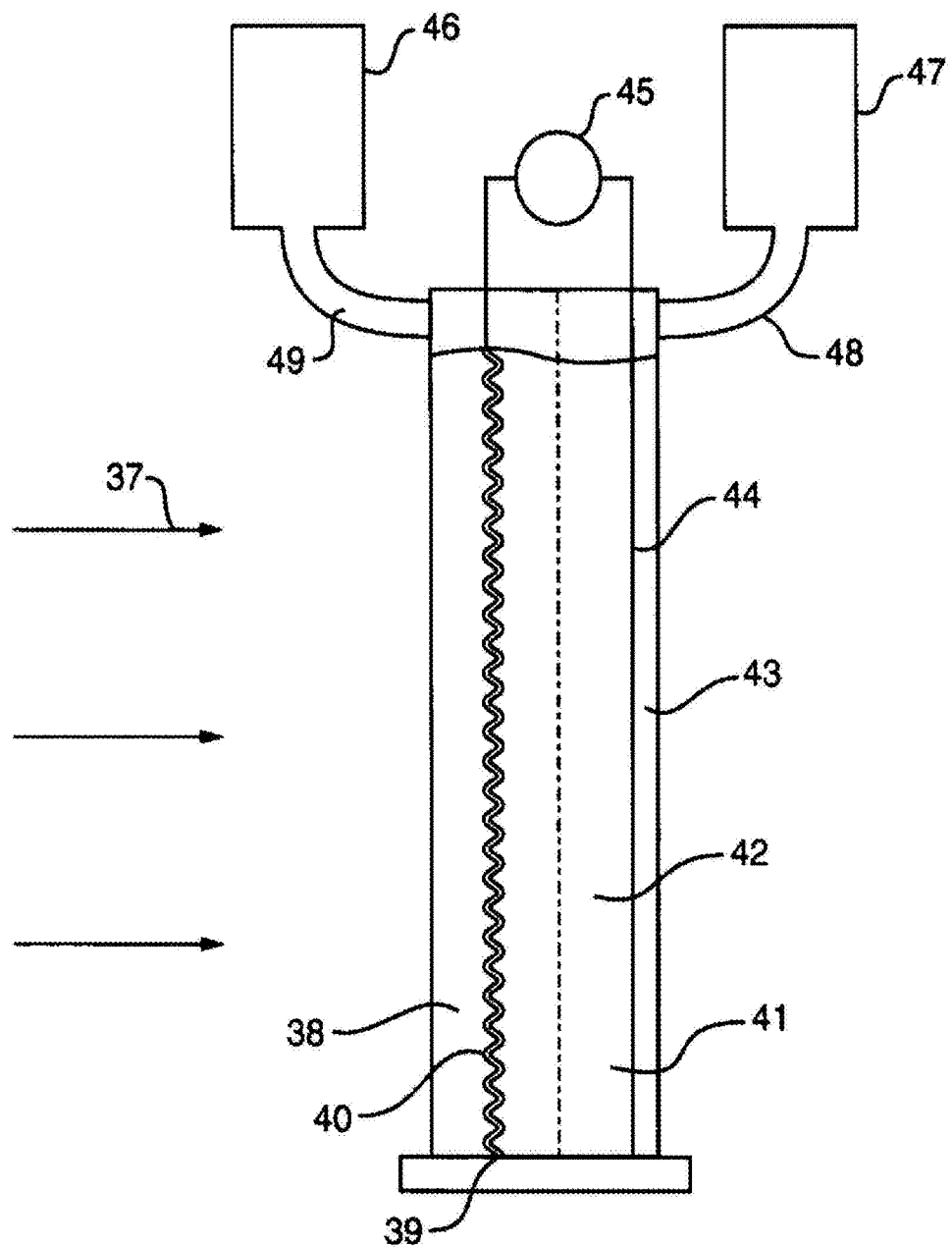
FIG. 5 is a schematic cross-section through a photoelectrolysis cell of the present invention.

FIG. 5 is a cross-sectional drawing of a complete photoelectrolysis cell employing stress-induced band-gap shifted titania as one of the electrodes. Light 37 illuminates the polycarbonate substrate 38 that also comprises one side of the cell. The polycarbonate has a distal surface 40 that has been embossed with undulations as have been described in this specification, and coated with titania 39. The second half of the cell is provided by wall 43, which may also be polycarbonate but can be other materials as well. The second electrode 44 is aluminum, platinum, or aluminized thin film coating on a substrate, for example. A separator membrane 41 is shown, to allow the hydrogen and oxygen gasses released in photoelectrolysis to be collected separately. Further, this controls the amount of dissolved oxygen that is present in the water, to make the photoelectrolysis reaction more efficient and predictable. An optional bias voltage source 45 is shown connected to the electrodes to adjust the redox potential for best electrolysis efficiency, but a redox-mediating electrolyte can also be used to reduce hole/electron recombination if necessary. Reservoirs 46 and 47 collect the separated hydrogen and oxygen gases.

Figure 6:
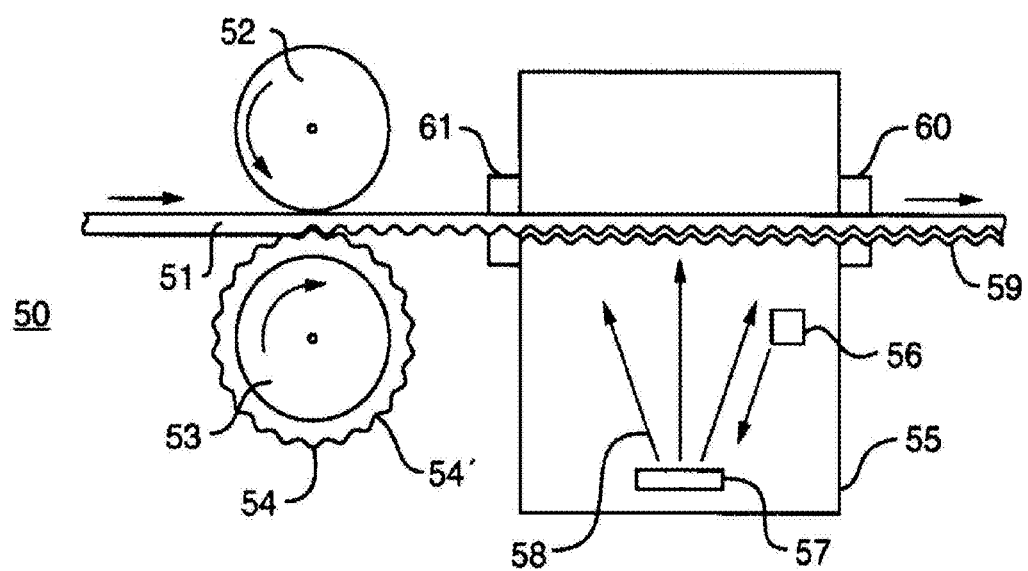
FIG. 6 shows an embossing and vacuum coating process for forming the nano-structures and the titania of the present invention.

FIG. 6 illustrates schematically one method for large scale manufacture of photoactive electrodes of the present invention comprising titania films on undulating substrates. In FIG. 6, a polycarbonate substrate or a titanium foil (also known as a coil in the industry) 51 is delivered from a roll (indicated at 50) into an embossing machine, in which a stamper 54 containing the desired undulation shape and pattern 54' and wrapped around roller 53, is embossed into the polycarbonate or the titanium coil using known embossing techniques that may include heat and/or solvents to varying degrees. The stamper is typically a nickel replica grown from a master, and may be coated with a harder material such as diamond-like carbon coating when working with titanium coil. The master is typically a photoresist or photoablative polymer on a glass or silicon substrate, into which the desired undulations have been formed by one of the following methods: contact lithography, projection lithography, interferometric lithography, or laser beam recording. Finally, the embossed polycarbonate web is coated in a vacuum chamber 55 with e-beam 56 (the preferred method, although others can of course be used) sputtering, ion-assisted deposition, or thermal evaporation, from a target 57. Material 58 from the target then deposits onto the web 51. The result is that the polycarbonate or titanium emerges from the chamber coated with, in this example, titania 59. In FIG. 6, sealing means 60 and 61 are provided to maintain a vacuum lock on the web, but the entire roll can alternatively be in the coater at one time. Sol gel or chemical vapor deposition are also possible means of coating. Also, instead of roll manufacture, the polycarbonate substrates can be injection/compression molded to the stamper. All of these techniques are known in the optical data storage and other industries. It is an important advantage of the present invention that bandgap-shifted titania can be manufactured with existing infrastructure in low-cost mass production methods, because any solar energy conversion application requires large area, low cost devices. However, in the case where the base material is titanium foil, it will be seen that it is advantageous to use a titania forming method other than vacuum coating.

Figure 7:
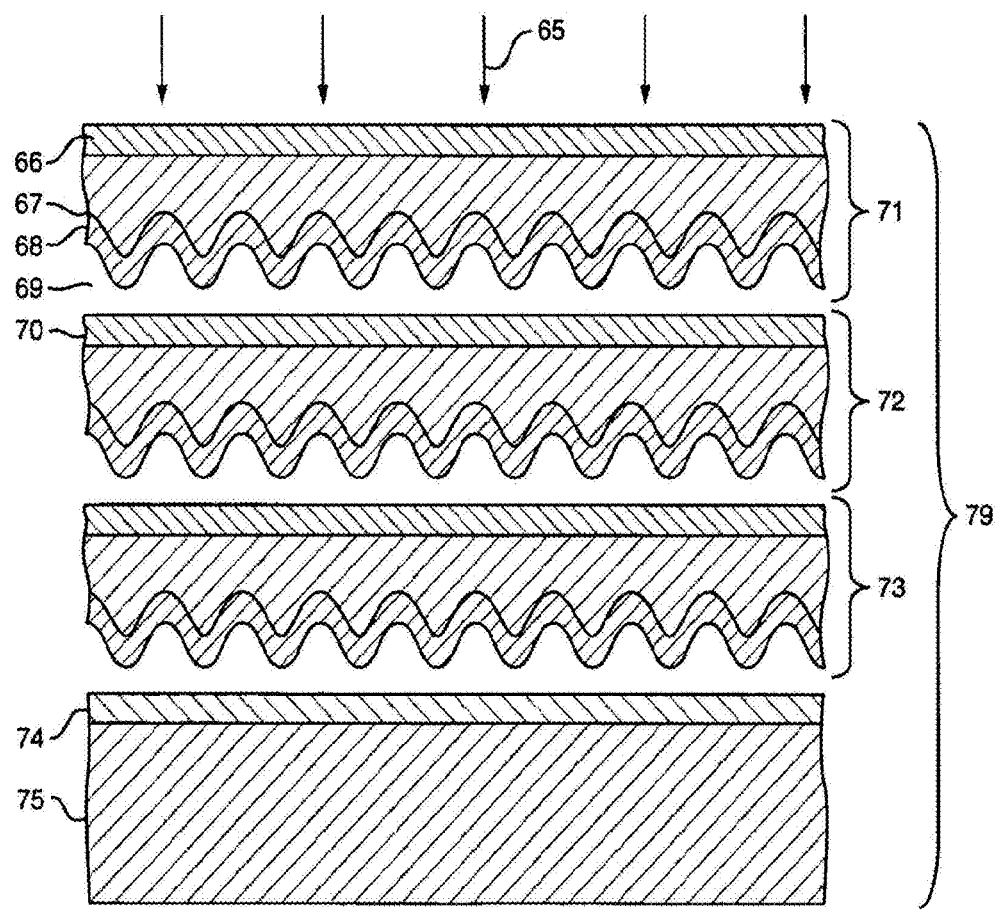
FIG. 7 is a schematic cross-section through stacked photoelectrolysis cells of the present invention.

FIG. 7 is a cross-section through a multi-layer device 79, comprising individual cells 71, 72, and 73, in which the conductive anode or cathode is not aluminum or platinum, but transparent indium tin-oxide (ITO) 70. In this way, a single web 66 is coated with ITO 70 on the incident flat side and $TiO_2$ 68 on the corrugated anode side 67, and then this web is cut up and layered so that the water 69 can flow, or at least wick or capillary, between the layers. The final bottom surface 75 is metallized with aluminum 74 or other high-reflectance metal. Also, the edges of the films may be connected electrically with aluminum or platinum or other metallized mount, although that is not shown here to preserve clarity. Photoelectrolysis occurs when light 65 from, for example, the sun, illuminates the cell. Means for collecting the hydrogen gas are not shown here.

Figure 8:
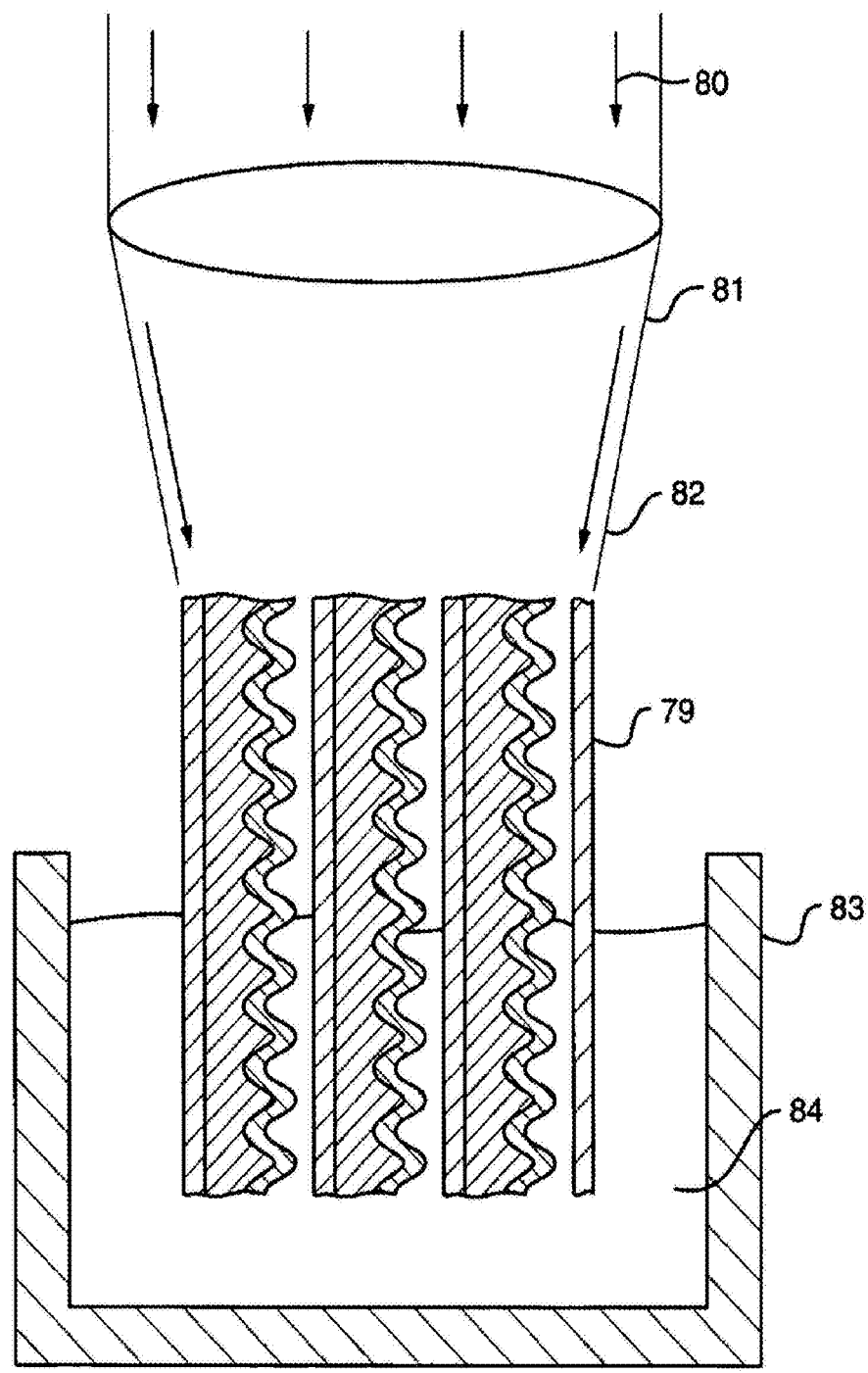
FIG. 8 is a schematic cross-section through vertically-oriented edge-illuminated photoelectrolysis cells of the present invention.

In another embodiment, the $TiO_2$ corrugated sheet anodes are arranged vertically in parallel in a tank or cell, with the light coupled in from a common concentrator via total internal reflection wave-guiding (edge illumination) within the anode. FIG. 8 shows the same multi-layer device 79 but arranged to be vertical in a tank 83 of aqueous solution 84, and for which the light 80 required for photoelectrolysis is focused or concentrated by lens 81 into a cone 82, which then couples into the edge of the multi-layers and travels down the titania surface via optical wave-guiding. Lens 81 is intended to be generally representative of light concentrating optics, and can also be a Fresnel lens or a mirror, for example.

Figure 9:
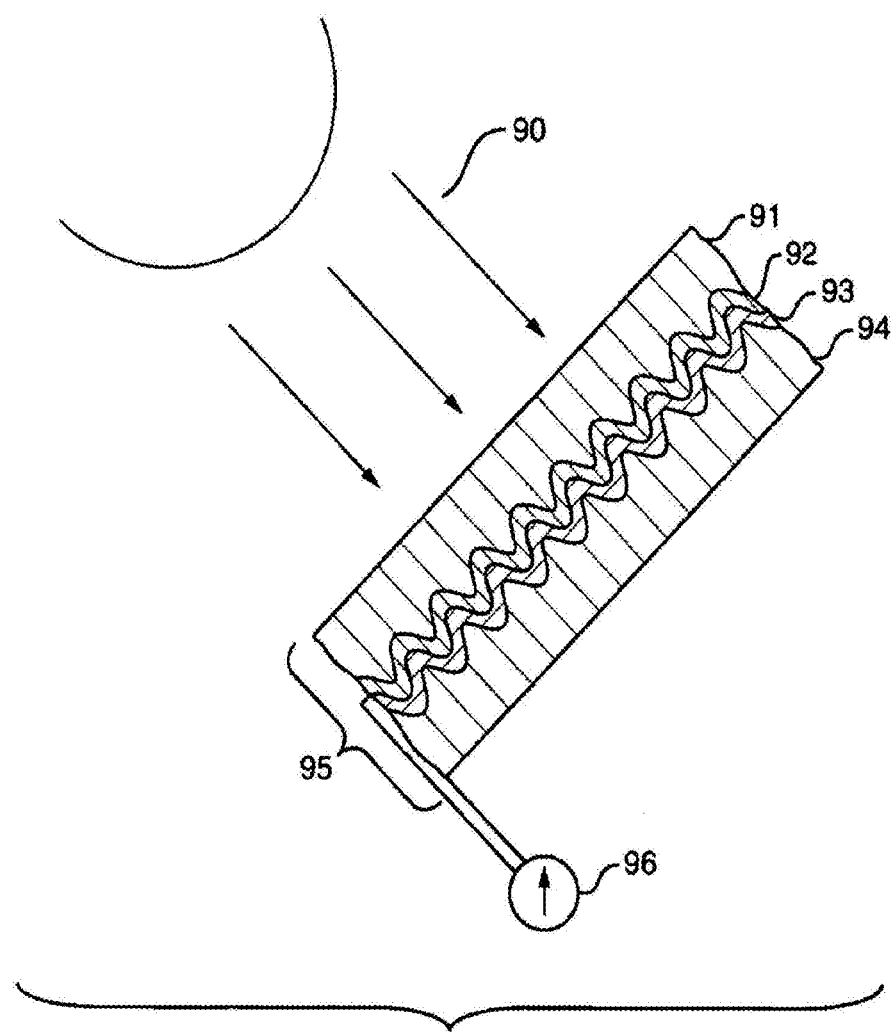
FIG. 9 is a schematic cross-section through a photovoltaic cell of the present invention.

FIG. 9 is a cross-sectional view of a solar photovoltaic cell 95 that uses titania whose bandgap has been shifted into the more abundant part of the solar spectrum, by employing stress as taught in this invention. Light 90 from the sun is incident onto a polycarbonate cover 91, which has the stress-inducing undulations. A transparent indium tin oxide (ITO) conducting layer 92 is first applied to the polycarbonate, which is then followed with the titania layer 93 and conducting backplane 94, producing voltage V 96.

Figure 10:
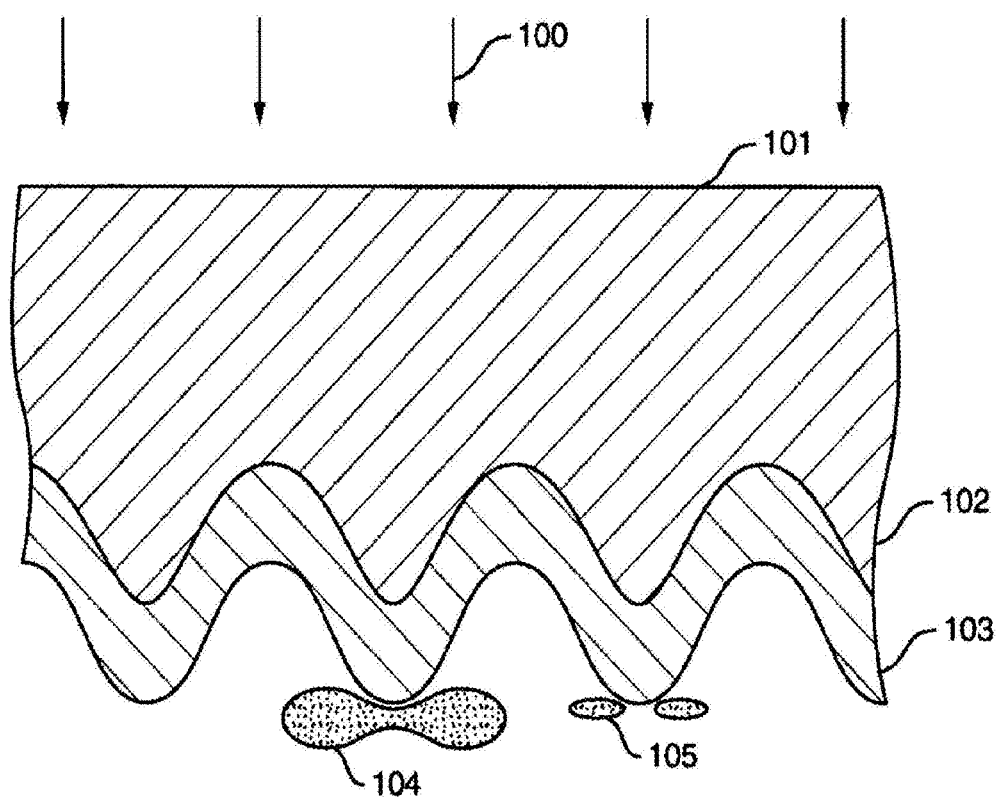
FIG. 10 is a schematic cross-section through a photocatalytic surface of the present invention being used for detoxification and/or disinfection.

Also within the scope of this invention is the use of this same photocatalytic effect, combined with and enhanced by our template grown photocatalyst with stress-induced band shifting, for the application of detoxification and/or disinfection. In these applications, shown in FIG. 10, harmful toxins or germs and bacteria 104 are reduced to harmless compounds 105 through oxidation by the following process: when a photon 100 of the required energy strikes the titania ($TiO_2$) 103, an amount of energy equal to the bandgap of the semiconductor is absorbed. This results in an electron from the valence band of the semiconductor being pushed up into the conduction band resulting in formation of an electron-hole pair. The hole accepts an electron from an adsorbed $OH^-$ ion resulting in the formation of $OH°$, i.e., an OH radical. This free radical is an extremely powerful oxidizing agent, and can oxidize most organic compounds that come into contact with the photocatalytic surface. With the titania bandgap lowered through this invention, i.e. undulations 102 in polycarbonate substrate 101, detoxification and/or disinfection will occur more efficiently in visible light, whether artificial or sunlight.

Figure 11A:
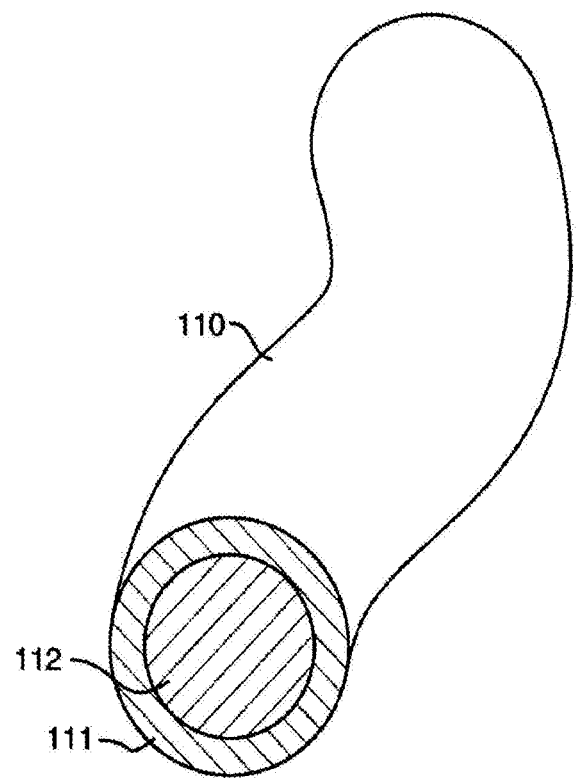
FIGS. 11A and 11B are schematic cross-sections through a fiber and a spherical particle respectively coated with titania.
Figure 11B:
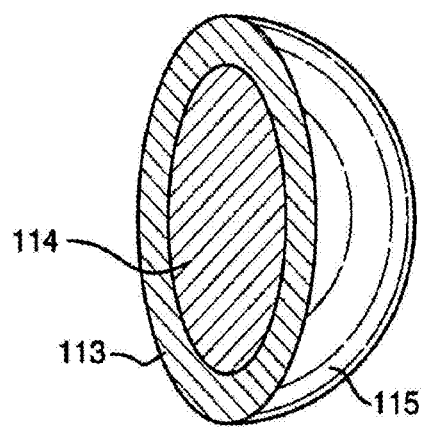
Figure 12:
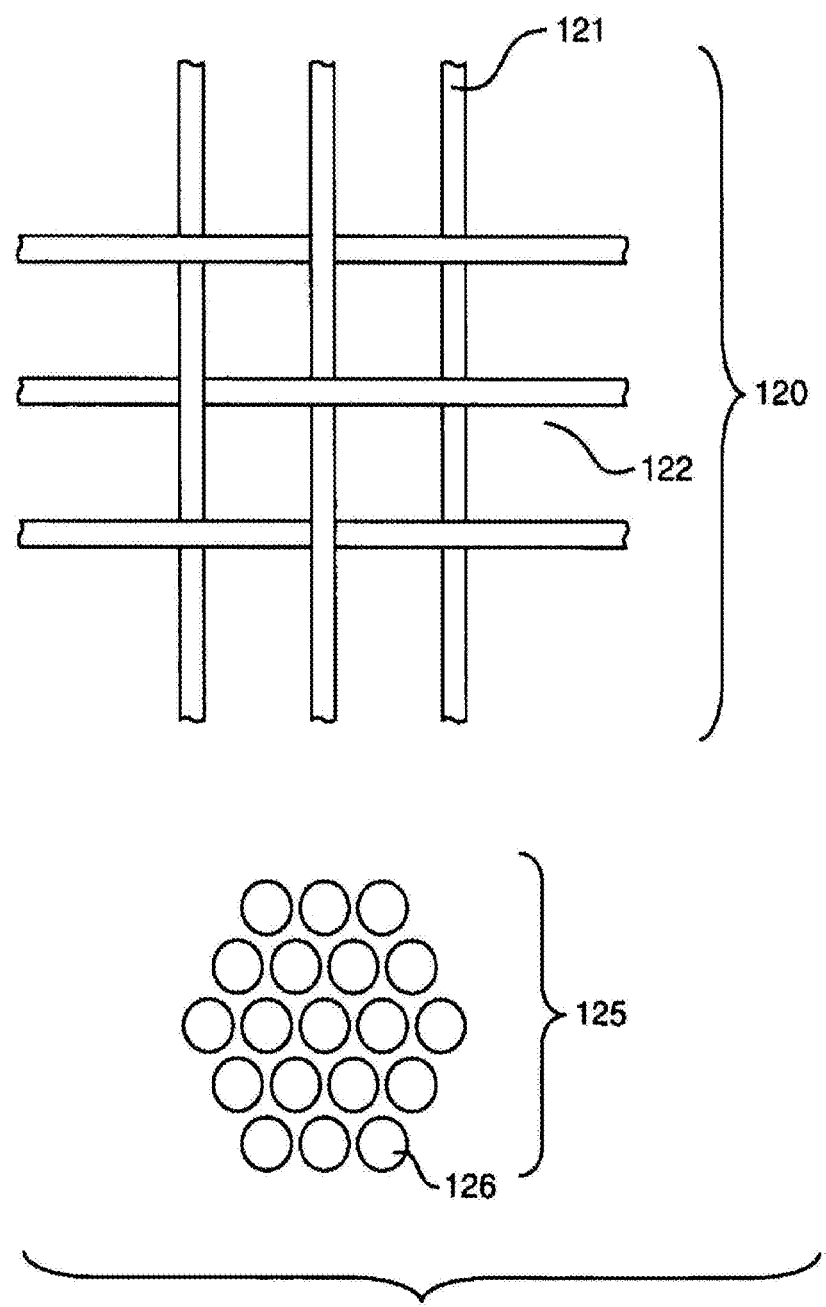
FIG. 12 shows fibers and spherical particles similar to those shown in FIGS. 11A and 11B respectively arranged in the forms of a fabric and a filter.

FIG. 11A illustrates an extension of the invention in which the substrate is a polymer fiber 110 with circular cross section 112 coated with titania 111. FIG. 11B illustrates an extension of this aspect of the invention in which the substrate is a polymer sphere 115 with circular cross-section 114 coated with titania 113. In both cases the titania thin film, because of the curvature of the substrate and the thermal mismatch between the substrate and the titania film, is highly stressed, as in the case of the corrugated substrate before. In FIG. 12, a multitude of titania-coated polymer fibers 121 and 122 are woven or otherwise assembled into a fabric 120 for protective clothing, in which the bandgap shift is used for photocatalysis, disinfection, or detoxification. Or, the fibers can be woven into filters for air and water purification, or into paper for, say, envelopes that are easily and effectively disinfected in the presence of light. Similarly, the titania-coated polymer spheres 126 can be assembled into a filter mesh 125, or can be sprayed or otherwise applied to clothing and other surfaces for passive disinfection and detoxification in the presence of light.

There are other benefits that this photoelectrolytic surface, with its nano-optics formed by and embedded into polymer surfaces, brings to any conversion of solar energy.

First, the cost is low because the technology exists now for embossing and coating acres of polymer web at very high rates of speed. The semiconductor material is very thin and therefore contributes very little to the cost. The simple one-layer structure cathode, without more exotic and costly semiconductors, also keeps down the cost, although even multilayer semiconductor structures would still be inexpensive with this method.

Second, this process easily makes continuous large sheets with no "dead" areas, and in solar conversion detector area is paramount.

Third, the focal surface is corrugated, so that the effective active area is even larger than the projected footprint area, by a factor of about 1.4× for sinusoid cylinders, and 2× for hemispheres.

Fourth, the corrugated substrate causes the film to be more robust by providing mechanical locking, and so prevents the cracking, crazing, and delamination common to other coating of plastic, and allows the film to exist in a highly stressed state.

Fifth, there is no need for tracking mechanism because the nano-optics have a large angular field of view, and can keep the sun focused on the interface over much of the day.

Sixth, the materials are not toxic, and have long lifetimes if a U.V. resistant polymer is chosen.

Seventh, the substrate is very thin and pliable, and is easily rolled up into a compact volume for unfurling later in space deployment, for example.

Eighth, the concentrated light makes for better performance of the semiconductor under low light conditions, where normally low light conditions allow the electron and hole pairs to recombine. Yet, the concentration, in the vicinity of 10 suns, is not so much as to cause charge saturation.

Ninth, the corrugations can be designed with a pitch to wavelength ratio for which light at that wavelength is very efficiently absorbed, as in photonic bandgap crystal-type anti-reflection coatings, for higher efficiency. In this case, the pitch of the surface template profile is designed to increase solar absorption and decrease solar reflection. The geometry can then considered to be a 2D photonic bandgap crystal. Also, the pitch, when sub-wavelength, causes very low scatter loss.

Alternately, the thickness of the titania itself can be chosen to be a quarter wavelength antireflection filter for the predominant wavelength of the bandgap. If stress is not sufficient for this thickness, the template profile or deposition conditions or substrate thermal/mechanical coefficients may be altered accordingly.

Devices utilizing this photoelectrolytic surface provide hydrogen directly for the coming hydrogen-based energy world, and also provide a way to convert solar energy into a form that can be stored, i.e. in the form of hydrogen. In addition, the simple and low-cost implementation is well suited to help energy-impoverished third world countries.

Finally, the clean desalinated water that results from local power generation with fuel cells fueled by the photoelectrolysis can be used for crop irrigation and other human consumption.

While the primary illuminant considered to this point has been the sun, and the primary benefit the use of free sunlight to passively produce hydrogen gas fuel, clean and desalinated water, and detoxification, via stress-induced bandgap-shifting of titania, in particular, to be photoactive in the solar spectrum, there is merit in using other illuminants as well.

For example, for the application wherein stressed titania is woven into fabrics, envelopes, and other surfaces for detoxification and disinfection, artificial illuminant sources that are rich in blue light but less so in ultraviolet, such as xenon flash lamps and xenon continuous light sources, are more efficiently used than with titania in an unstressed condition.

Figure 13:
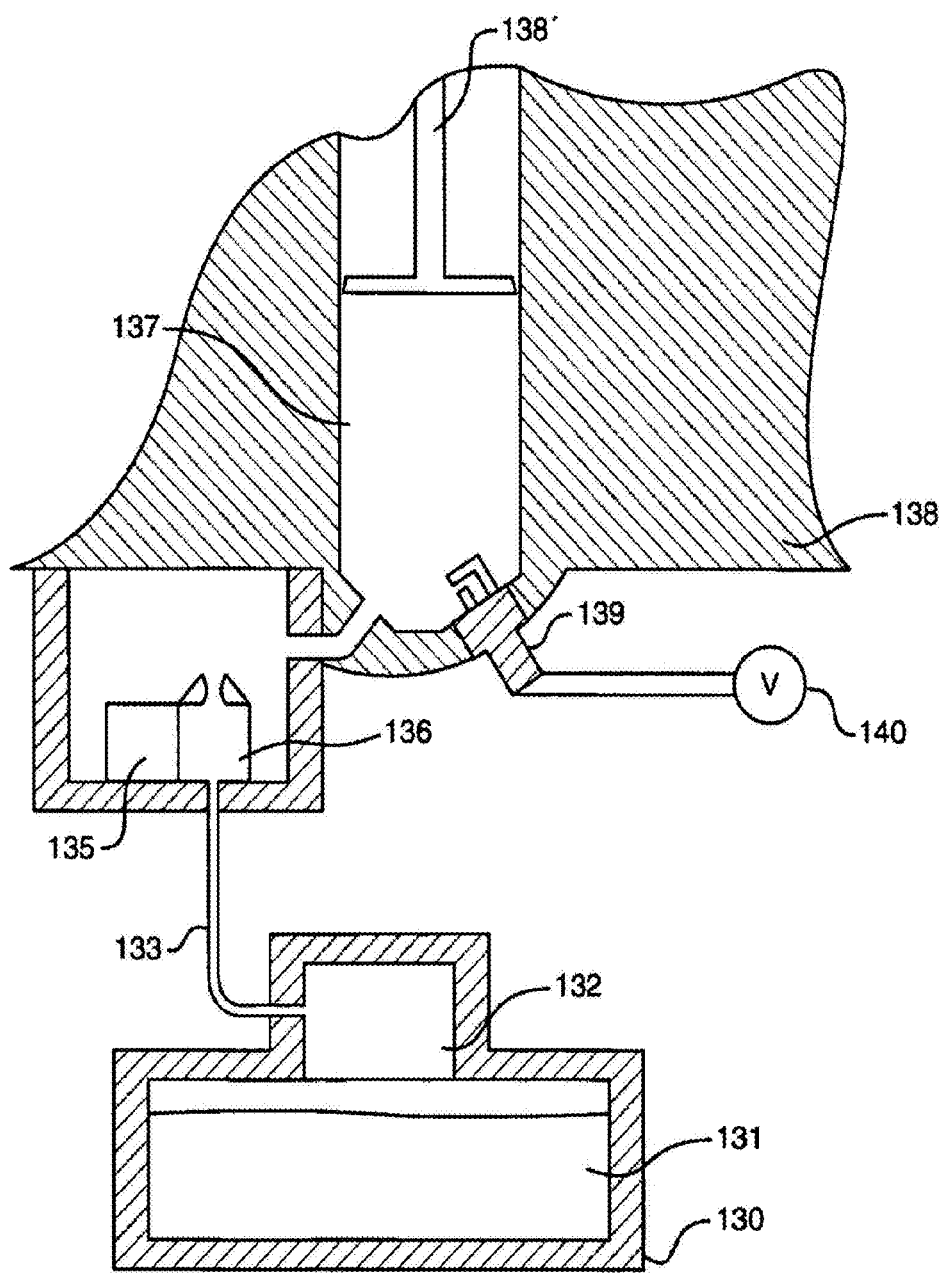
FIG. 13 is a schematic cross-section through a point-of-use photoelectrolysis apparatus of the present invention being used in combination with an internal combustion engine.

Another important artificial light source is the blue laser diode. Lifetimes of blue laser diodes have improved to commercial levels, and their brightness has increased, while costs have gone down. Shorter wavelength blue lasers, however, still have lifetime, brightness, and cost problems. And ultraviolet laser diodes do not yet exist. Combining the blue laser diodes with the present invention, however, makes possible point-of-use photoelectrolysis. FIG. 13 shows a schematic for point-of-use photoelectrolysis, in which a blue laser diode 135, or diodes, illuminates a stress-induced bandgap-shifted titania photocatalyst 136, such that a small injected stream of water or other aqueous solution 131 delivered by fuel pump 132 from fuel tank 130 is dissociated into hydrogen and oxygen gas by the laser-illuminated titania 136, where it can be used directly in the cylinder 137 of an internal combustion engine, shown partially as 138. Ignition is provided by spark plug 139 and high voltage 140, with the resulting combustion of the hydrogen in the cylinder drives the piston 138'. The energy for the laser diode can be from batteries recharged by braking, as is done today with hybrid electric/combustion cars, or just from the alternator recharging if the efficiencies work out to allow this. A holding tank 134, or "capacitor," would likely be an advantage and would allow sufficient hydrogen to build up before release into the cylinder, or else additional laser diode and titania photocatalyst combinations could be employed.

Figure 14:
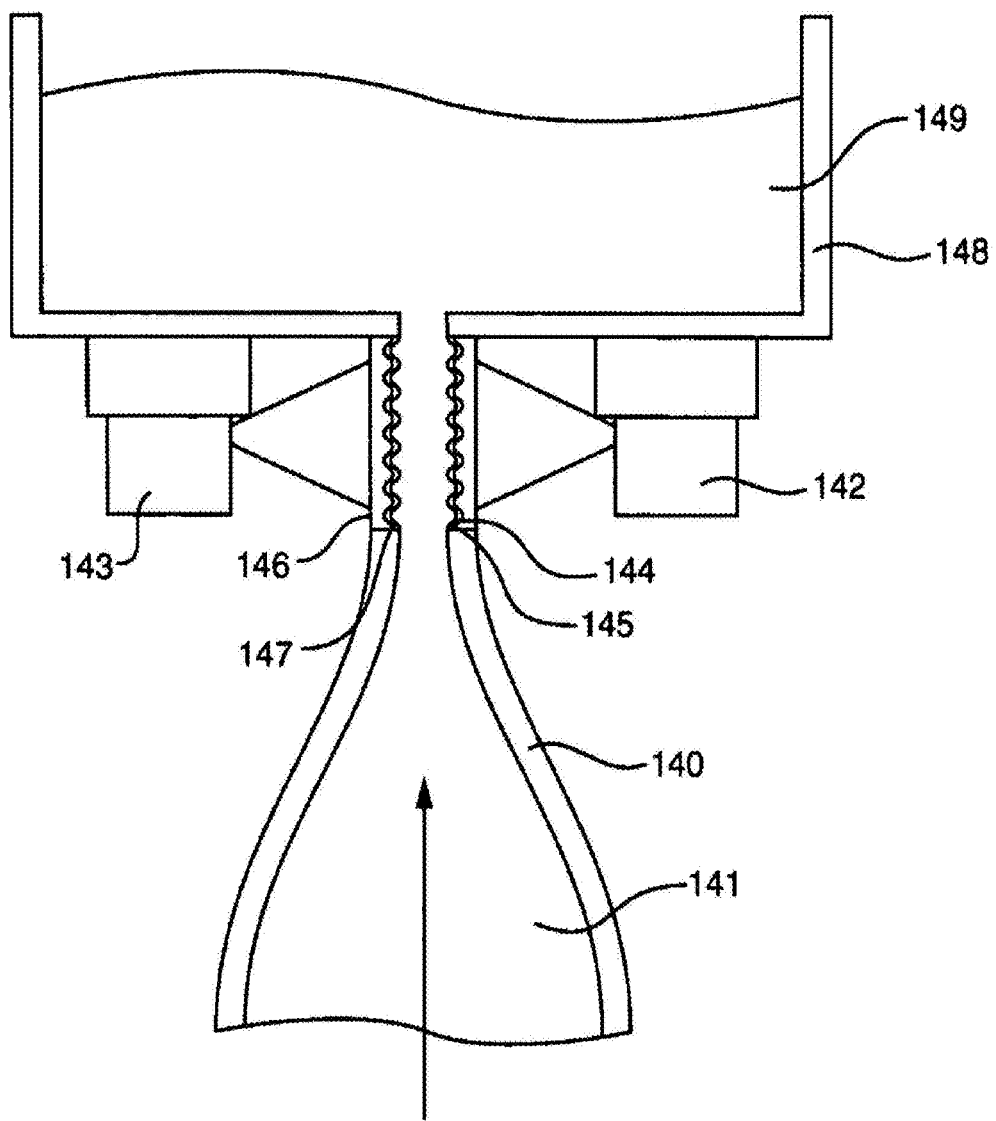
FIG. 14 is an enlarged cross-section of a portion of the apparatus shown in FIG. 13 illustrating the photocatalytic surface thereof.

A detailed view of one way to combine the photodiode and the titania photocatalytic surface is shown in FIG. 14. Water 141 is injected into and between titania photocatalytic surfaces 145 and 147 on substrates 144 and 146, respectively. Blue laser diodes 142 and 144 illuminate the titania, activating the photoelectrolysis of the water. The resulting hydrogen 149 is injected into reservoir tank 148, or directly into the cylinder. Such a point-of-use hydrogen production could also be used with gasoline as the source of the hydrogen. Further, the hydrogen could be used to run fuel cells for electric vehicles, rather than for combustion engines. In any case, on-board storage of hydrogen, and losses associated with release of hydrogen from such storage means as metal hydrides, for example, are eliminated.

Figure 15:
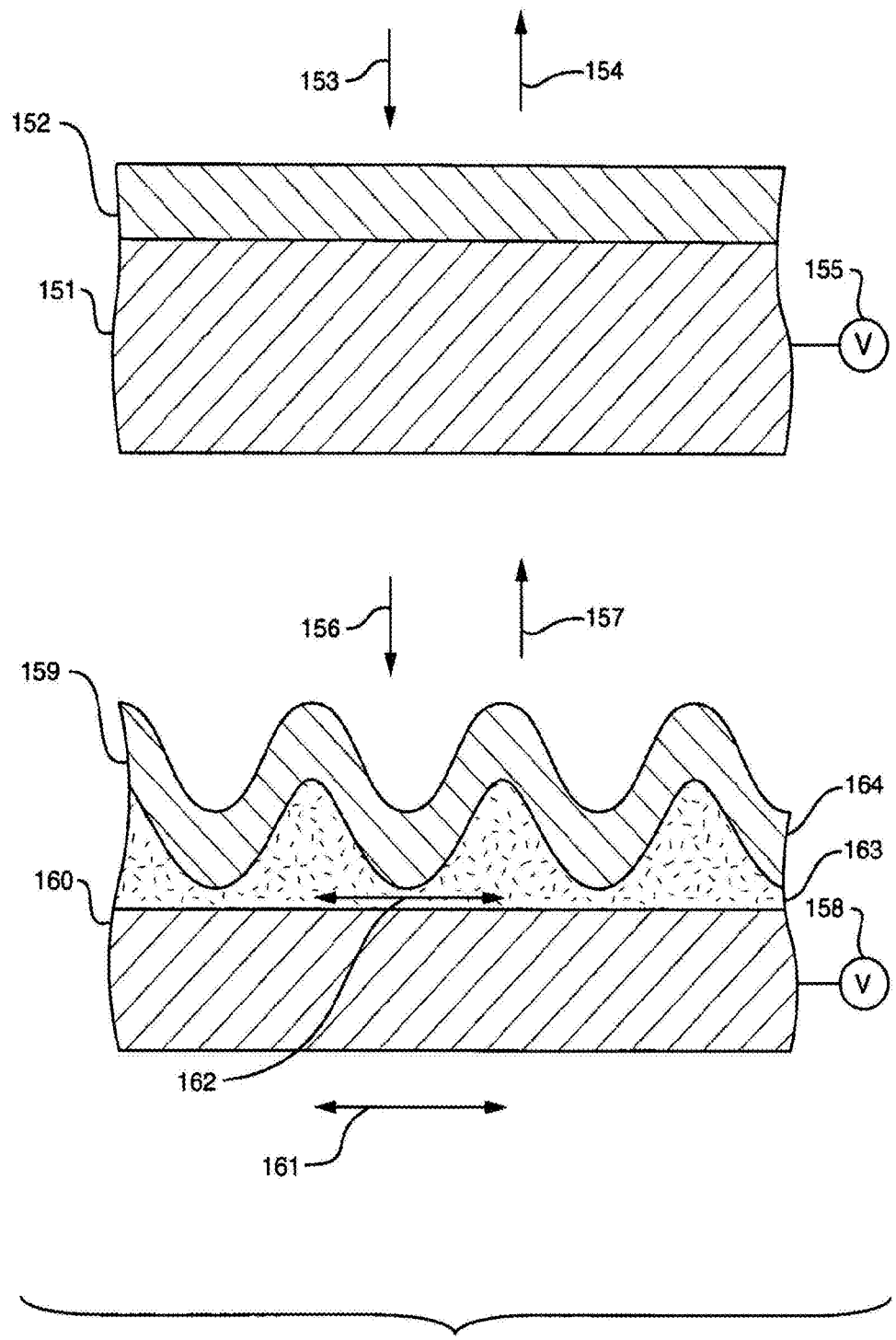
FIG. 15 is a schematic cross-section through a film of the present invention in which the substrate is a piezocrystal

To this point, the stress induced in the titania layer is largely static and intrinsic to the substrate. FIG. 15 shows an application in which the substrate is a piezo crystal 151 and 160. Application of voltage V 155 and 158 causes the piezo crystal substrate to grow by a controlled and calibrated amount 161, which in turn causes tensile stress 162 in the titania layer 164 that is coated onto the undulating substrate 163 that is laminated to the piezo crystal, or in titania layer 152 that is coated directly onto the piezo crystal 151. Both devices shown in FIG. 15 will direct incident light 153 and 156 differently according to the amount of stress applied and therefore the amount of bandgap shifting, so that light 154 and 157 is redirected in a controlled manner. Such devices can be used for switching and tuning in photonic applications, including telecommunication network devices.

In summary, this invention provides for shifting the optical bandgap of a semiconductor into longer optical wavelengths by stressing the semiconductor, where the semiconductor is a thin film, and where the stress is caused by some or all of the following: conditions under which the thin film is coated, the shape of the substrate on a nano, micro, or macro scale, and the mechanical, chemical, and thermal properties of the substrate. The self-focusing of the illuminant also creates local heating, which also serves to shift the bandgap into longer wavelengths which are more abundant, for example, in the solar spectrum. Titania is the preferred semiconductor photocatalytic embodiment, but the invention applies to any semiconductor that is photo-active, such as silicon, germanium, and their alloys, and compounds that include, in addition, gallium. The stress-inducing template profiles also provide a mechanical lock to the coating so that the stress can exist without causing delamination of the coating from the substrate. In addition, the stress-inducing template profiles create additional surface area without increasing the footprint area of the surface, which creates higher efficiency in photocatalytic, photovoltaic, and photoelectrolytic action.

The source of hydrogen for the photoelectrolysis to act on can be water, sea water, an aqueous solution with electrolytes, or other hydrogen-bearing liquids such as gasoline.

The illumination is from the sun, the illumination is from artificial light, the illumination is further concentrated by the stress-inducing template shape by self-focusing, the concentration of the illumination is largely independent of incident illumination angle, thereby reducing or eliminating the need to track the sun in the sky, the stress-inducing profiles in the substrate may be one-dimensional or two-dimensional, the pitch of the stress-inducing profiles may be chosen relative to the desired illumination wavelength such that absorption is increased and reflection is decreased as in a photonic bandgap crystal, the thickness of the titania layer is chosen to be ¼ of the wavelength of the desired illumination, thereby acting as an anti-reflection filter and increasing absorption and decreasing reflection, the substrate surface profiles are chosen to be a certain shape, depth, and radius so that the titania film grows as lenses over the profiles, the thickness of the titania is chosen so that the focal plane of said lenses is coplanar with the distal surface of the titania layer, the additional effective surface created by the substrate stress-inducing profiles facilitates and improves heat dissipation, the semiconductor is vacuum coated onto or into the shaped substrate, the semiconductor is applied as a sol gel, the semiconductor is applied with chemical vapor deposition, the semiconductor is a contiguous film, the semiconductor is a matrix of particles such as spheres, the substrate can be polymer, glass, silicon, stainless steel, copper, aluminum, or substrate material, the photocatalyst is used to detoxify a medium in contact with it, the photocatalyst is used to disinfect a medium or biological agent in contact or proximal with it.

The substrate may be transparent, reflective, or flexible; the substrate and titania coating are compatible with a roll-to-roll web manufacturing process, the substrate profiles may be embossed into the substrate with a master, molded into the substrate, or caused by reticulation in the substrate or in a layer applied to the substrate.

The titania-coated substrates can be stacked in layers to increase efficiency for a given area, and said titania-coated stacked substrates may be pre-coated on the opposite side with a transparent conducting electrode such as indium tin oxide (ITO). The titania-coated substrates may be edge-illuminated; the semiconductor may be strontium titanate ($SrTiO_3$), amorphous silicon, or other semiconductor. The titania-coated substrate(s) may function as the anode in a photoelectrolytic cell, which further comprises some or all of the following: a housing, an aqueous electrolyte, a separation membrane, a cathode, and a bias source, where the photoelectrolysis converts solar energy into a chemically storable form, e.g. hydrogen, and may be further combined with a metal hydride or other adsorber.

Self-focusing may be provided by the nano-lens shape of the titania on the corrugated substrate improve performance in low light level applications.

The invention applications include both terrestrial and space environments

The illuminant may be a laser diode or laser, a spark between electrodes, or a flashlamp.

Hydrogen may be produced at point-of-use by artificial illumination

The substrate shape may be used to increase or otherwise control the stress in the titania film, where the shape can be concave or convex or a mix of both, and the scale of pitch or radius of curvature can be from nanometers to meters. Or, the substrate may be a piezo device such that the amount of stress induced in the titania film, and therefore the bandgap, is tunable over a range, for use in photonics. Or, the substrate may be temperature controlled, such that by changing the temperature the substrate contracts or expands and causes a tunable bandgap shift in the titania or other photocatalyst layer. The substrate can also be a very small sphere, typically several microns in diameter but as small as tens of nanometers in diameter, and the material is a polymer, glass, metal, or other material, and is coated with titania or other suitable semiconductor, said sphere is one of many applied to a surface or surfaces, or are in suspension in a fluid, and can be applied by spraying, painting, or inkjet deposition. The substrate can also be a small diameter polymer or other fiber, and the titania-coated fiber is woven into fabrics for protective clothing or into paper for envelopes that are readily anti-biotic when illuminated with daylight or artificial light, where the application is photovoltaic, and the stress is enabling (titania) or improving (amorphous silicon).

Applications of the present invention include photoelectrolysis, detoxification, disinfection, point-of-use photoelectrolysis for use in a hydrogen-based internal combustion engine, water desalination (where the product of combustion of the hydrogen and oxygen gases from photoelectrolysis is desalinated water), and point-of-use photocatalyst device is used in a hydrogen-based internal combustion engine, continual tuning of stress and bandgap properties for telecomm devices, and alteration and improving magnetic properties of thin films applied to hard drive disks for data storage.

This invention provides a corrugated substrate to which a desired titania or other thin film will adhere under stress but will not cause scatter or diffraction due to its sub-wavelength spatial period, thereby allowing low temperature deposition onto polymers, and where the sinusoidal interface at the high and low index thin film and substrate respectively further cause an effective index that varies gradually from one index to the other, with gradient index benefits of improved transmission and reduced reflection, The fact that the photocatalyst is a thin film reduces the probability of recombination of the hole and electron pairs that occurs in bulk semiconductors in the absence of an anode (or cathode) and electrolyte. The titania coating is evaporated from a titania target, a titanium target with oxygen bled into chamber, or a $Ti_xO_y$ target such as $Ti_2O_3$.

The titania coating may comprise rutile and/or anatase and/or other polymorphs, as well as amorphous titania. Additional thin films may be applied between the titania and the substrate in order to promote adhesion or to further modify the stress in the titania. Although the preferred embodiment has been described herein, it will be understood that surface features with other dimensions and shapes, substrates of other materials that are not polymers, substrates in non-planar shapes, and other semiconductors (such as $SrTiO_3$), even those requiring a bias voltage, are within the scope of this invention. For example, in amorphous silicon solar cells, the use of the corrugated template/ substrate to cause the amorphous silicon film to be undulating would create stresses within the silicon layer sufficient to shift, decrease, and broaden the band-gap in the film, and thereby allow more efficient conversion of the solar spectrum of light into electricity.

Figure 16:
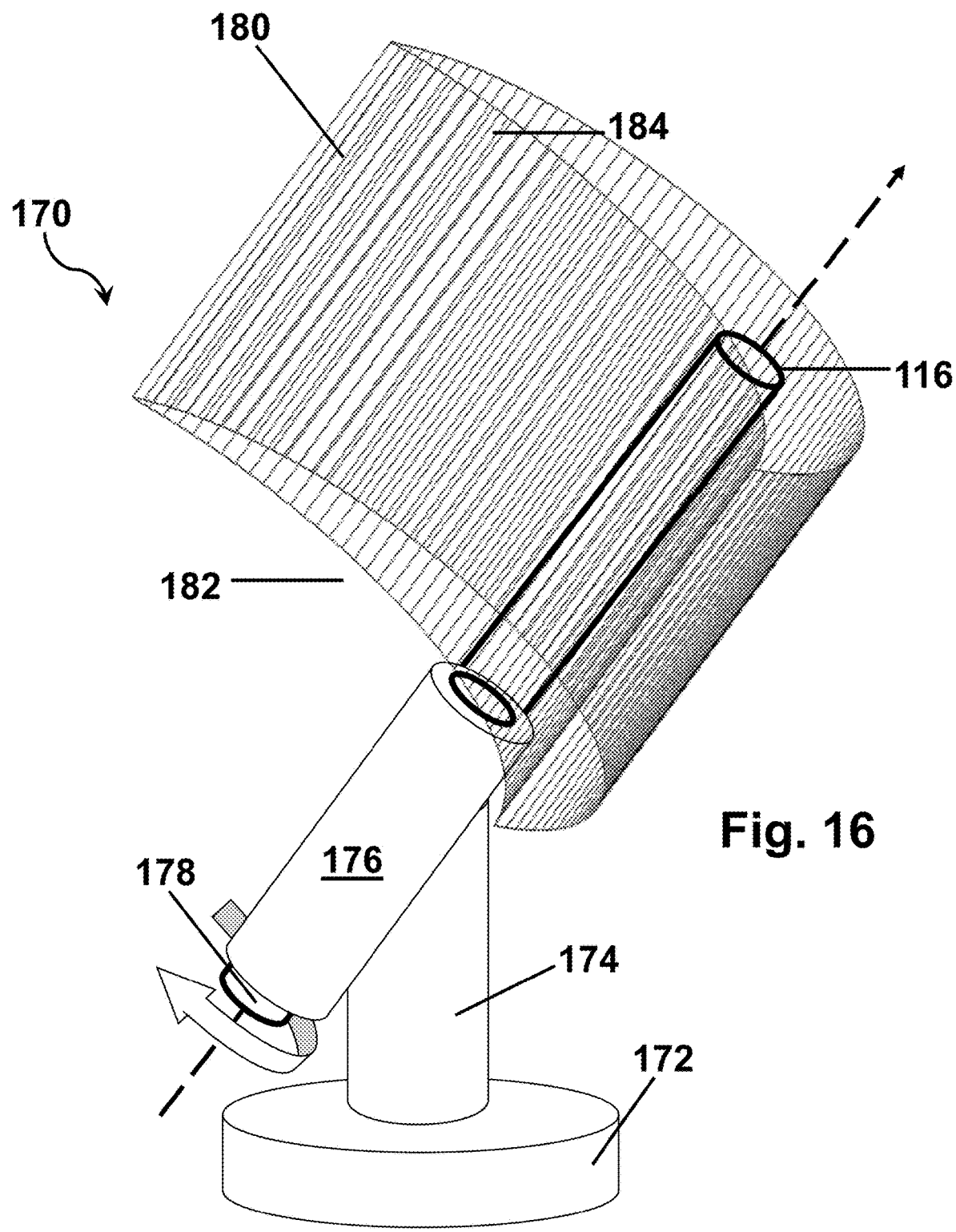
FIG. 16 is a perspective view of a preferred apparatus for generating hydrogen by photolysis of water using a titania electrode of the present invention, or various types of prior art photoactive electrodes.

FIG. 16 of the accompanying drawings illustrates a photolysis apparatus (generally designated 170) using a titania electrode of the present invention (although other known photoactive electrodes can also be used) for the production of hydrogen and oxygen from water. The apparatus 170 comprises a squat cylindrical base 172; when the apparatus is installed in a fixed location, this base 172 may be installed directly on the ground or, for example, on a concrete pad, which may be equipped with power lines for driving the apparatus 170 as described below. Alternatively, if it is desired to make the apparatus 170 mobile, the base 172 may be mounted on a wheeled platform (not shown) which may be equipped with jacks or chocks (also not shown) for holding the wheeled platform stable at any desired location.

A cylindrical support member 174 extends vertically upwardly from the base 172, and a polar housing 176 runs across the upper end of support member 174, the housing 176 being inclined so that its axis is parallel to that of the earth at the location where the apparatus 170 is being used. For simplicity, the housing 176 is shown as fixed relative to the support member 174. However, since the optimum angle of inclination of the housing 176 to the support member 174 will vary with the latitude at which the apparatus 170 is to be used, in the case of a mobile apparatus 170 it may be desirable to provide means for varying the inclination of the housing 176 to the support member 174.

The polar housing 176 has the form of a hollow cylinder, and a polar shaft 178 is rotatably mounted with the housing 176 by means of radial bearings (not shown), so that the shaft 178 can rotate about the axis of the housing 176, as indicated by the arrow in FIG. 16. Rotation of the shaft 178 relative to the housing 176 is effected by a electric motor (not shown) located within the support member 174. A reflector assembly 180 provided with end caps 182, 184 and core assembly 186 are mounted via thrust bearings (not shown) on the shaft 178, so that by rotating the shaft 178, which is pointed at the North star and thus extends parallel to the axis of the earth, the reflector can follow the motion of the sun during the day. The reflector assembly 180 concentrates solar radiation on the core assembly 186 in a manner well known to those skilled in solar technology.

The single-axis mount shown in FIG. 16 is the presently preferred mount; adjustments for the seasonal variation in solar elevation can be made by using an oversized photocatalyst, which can accommodate changes in focus with the seasons, within the core assembly 186, as described in detail below. A two-axis mount can alternatively be used to allow direct adjustment of the position of the reflector assembly 180 to allow for seasonal variation in solar elevation.

The core assembly 186 will now be described in more detail with reference to FIGS. 17A and 17B. As most easily seen in FIG. 17A, the core assembly 186 comprises inner and outer hollow concentric tubes 202 and 204 respectively, which are formed of borosilicate glass, and polycarbonate respectively, although quartz or ultraviolet-transmissive acrylic polymer could alternatively be used for the outer tube 204, and other materials can be used for the inner tube 202 depending on the desired operating temperature and pressure. The lower ends of the tubes 202 and 204 are received within a cylindrical recess in a lower endcap 206, formed of poly(vinyl chloride); an annular seal 208, formed by injecting silicone rubber around the tube 204, extends around the outer tube 204 within the recess in the endcap 206 to provide a liquid-tight seal around the tube 204. The upper end of outer tube 204 is received within a cylindrical central aperture in a flange member 210, and an annular seal 212, similar to the seal 208, provides a liquid-tight seal around the tube 204.

The upper end of inner tube 202 extends beyond the upper end of outer tube 204 and is solvent welded within shallow cylindrical recess in a top plate 214, which lies parallel to and adjacent flange member 210. The top plate 214 is secured to flange member 210 by multiple bolts 216, only two of which are visible in FIG. 17A. An O-ring 218 is disposed between top plate 214 and flange member 210 radially outwardly of the upper end of outer tube 204.

The core assembly 186 further comprises a counter electrode 220 provided with a contact 222, in the form of a titanium screw, which extends through the center of the top plate 214 to provide a negative terminal for the core assembly 186. The counter electrode 220 is cylindrical and extends along the axis of the inner tube 202. The counter electrode 220 is formed of carbon or graphite, although any material which is inert to the hydrogen generated at this electrode when the apparatus 170 is operating may be used, for example reticulated glassy carbon, or stainless steel, such as stainless steel 316; obviously, it is desirable to keep the counter electrode 220 as simple and inexpensive as possible. However, it may be desirable to roughen or otherwise increase the surface area of this electrode to improve the efficiency of the apparatus 100. A hydrogen tube 224 extends from the upper end of inner tube 202 through the top plate 214 to provide a route for the hydrogen generated at the counter electrode 220 to leave the core assembly 186.

The second electrode of the core assembly 186 is a bandgap-shifted titania coated electrode 226 of the present invention, although as noted above other photoactive electrodes can be substituted. As best seen in FIG. 17B, the titania coated electrode 226 has the form of a thin titanium sheet curved into substantially the form of an arc of a hollow cylinder, the curved sheet extending the full length of, and being wrapped around a portion of, the inner tube 202 so as to leave a small gap between the electrode and the inner tube (this gap is somewhat exaggerated in FIG. 17B for ease of illustration). The electrode 226 is in electrical contact with a titanium screw 228 (FIG. 17A), which is generally similar to the screw 222 previously described, extends through the top plate 214, and acts as the positive terminal for the core assembly 186. When the core assembly 186 is operating, oxygen is evolved at the electrode 226, and this oxygen passes through the chamber formed by the facing surfaces of the flange member 210 and the top plate 214 and the O-ring 218, and leaves the core assembly via an oxygen tube 230 similar to and extending parallel to the hydrogen tube 224 already described. The top plate 214 is also provided with an electrolyte supply tube (not shown) used for filling and refilling the core assembly 186 with electrolyte (described below). For reasons discussed below, the hydrogen and oxygen tubes 224 and 230 are provided with pressure relief valves (not shown) at locations further from the top plate 214 than is capable of being illustrated in FIG. 17A.

Figure 17A:
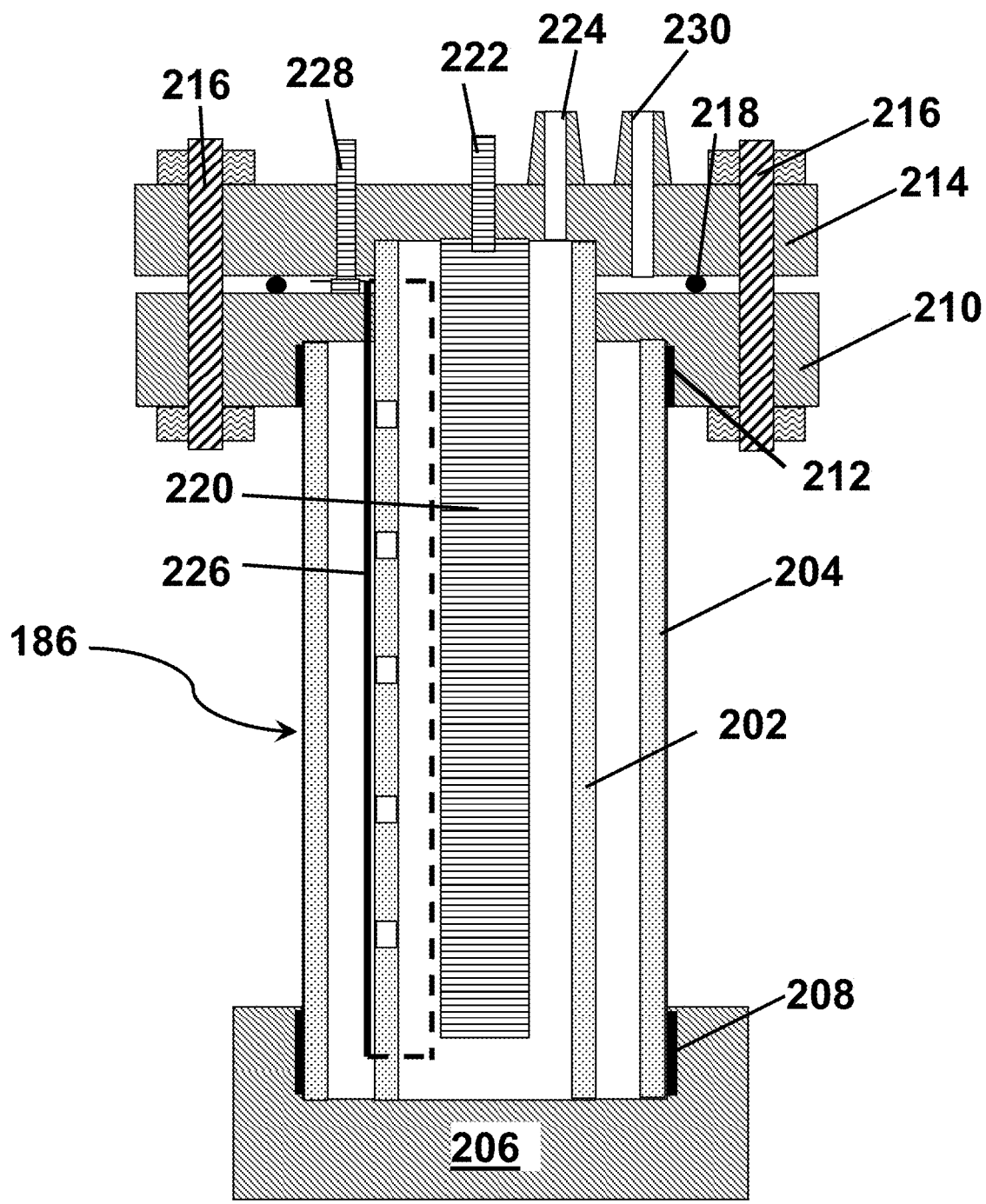
FIG. 17A is a schematic cross-section through the cylindrical core of the apparatus shown in FIG. 16, the cross-section being taken in a plane including the axis of the cylindrical core.
Figure 17B:
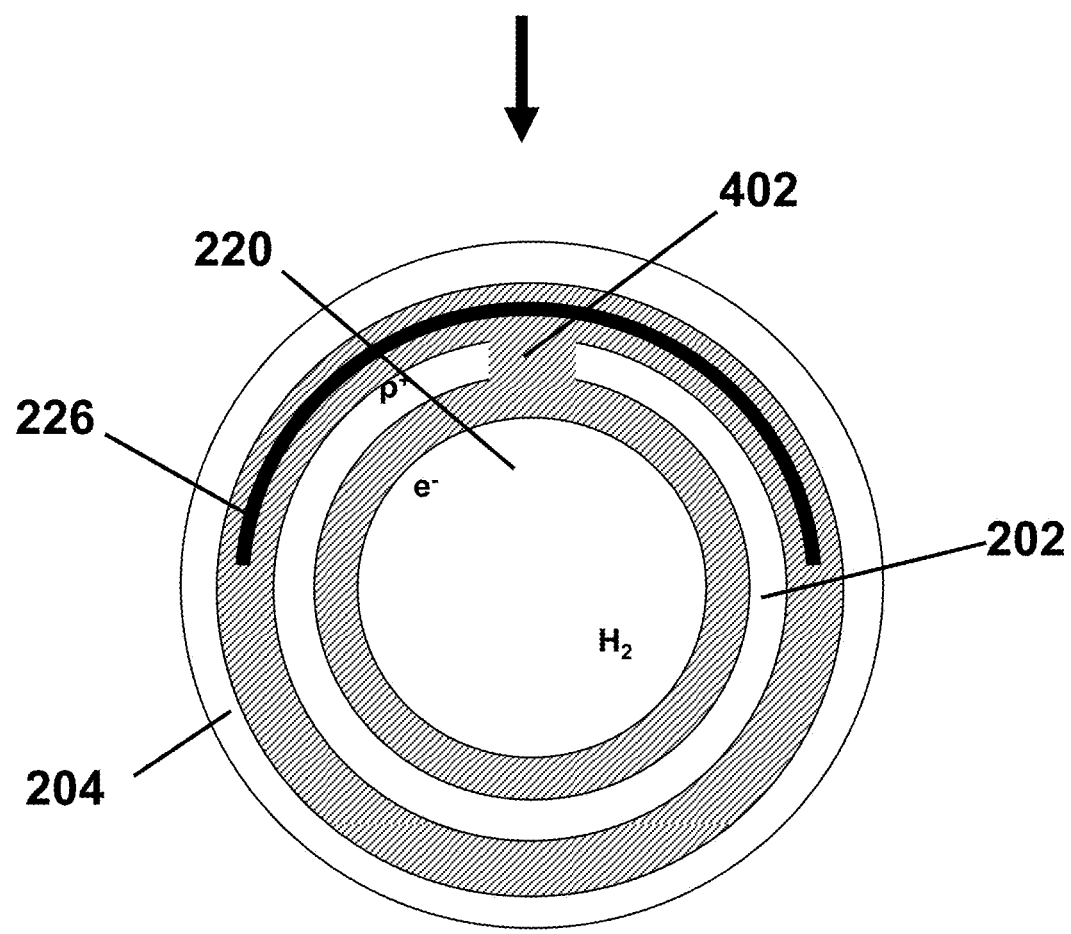
FIG. 17B is a schematic cross-section through the cylindrical core shown in FIG. 17A, the cross-section being taken in a plane perpendicular to the axis of the cylindrical core.

FIG. 17B shows a cross-section perpendicular to the central axis of the core assembly 186 shown in FIG. 17A, with the arrow indicating the face of the assembly which is intended to face the concentrated sunlight. The carbon counter electrode 220 has an outside diameter of 1 inch (25 mm). One provider is NAC Carbon Products, Inc., Elk Run Ave., Punxsutawney, Pa. The inner tube 202 has an internal diameter of 1.5 inch (38 mm) and an external diameter of 1.76 inch (45 mm). The outer tube 204 has an internal diameter of 2.18 inch (56 mm) and an external diameter of 2.365 inch (59 mm). The photoactive electrode 226 has a thickness of 0.010 inch (0.254 mm) and in practice fits somewhat more tightly around the inner tube 202 than is illustrated in FIG. 17B. Apertures 402 (discussed in more detail below with reference to FIG. 17C) passing through the inner tube 202 are 0.575 inch (15 mm) in diameter and disposed on 2 inch (51 mm) centers.

Figure 17C:
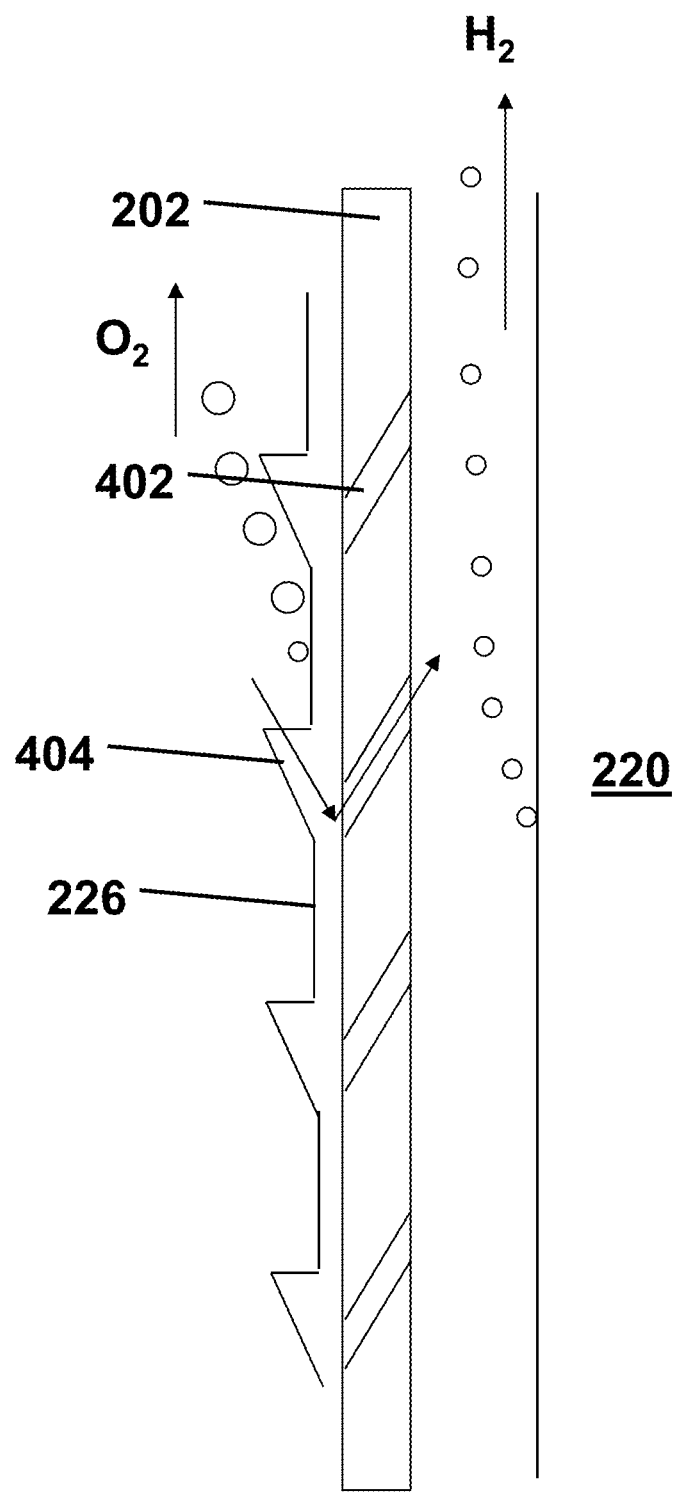
FIG. 17C is an enlarged cross-section taken in the same plane as FIG. 17A and illustrates the electrodes of the core, and the apertured tube lying between these electrodes, with this tube having louvered apertures.

In operation, the tubes 202 and 204 are completely filled with an electrolyte solution capable of being photolyzed to hydrogen and oxygen. As shown in FIG. 17C, to enable ions to flow between the electrodes 220 and 226, while keeping the hydrogen and oxygen evolved at these electrodes separate, the inner tube 202 is provided with a series of apertures 402 lying beneath the electrode 226, these apertures extending downwardly and radially outwardly, while the electrode 226 itself is provided with a series of vent louvers 404. As indicated by the diagonal arrows in FIG. 17C, the combination of the louvers 404 and apertures 402 provides a short, large effective cross-section path for ion flow between the electrodes 226 and 220 through the inner tube 202, while keeping the evolved hydrogen and oxygen flowing separately upwardly, as indicated by the vertical arrows in FIG. 17C, separated by the inner tube 202. For additional insurance that the hydrogen and oxygen are kept separate, the apertures 402 may be covered by a fluoropolymer membrane, such as that sold commercially by E. I. du Pont de Nemours & Co. under the Registered Trade Mark "NAFION". Such a membrane may be wrapped around the inner tube 202 and sealing, especially if hydrogen and oxygen pressures are equalized. Microporous materials such as ceramic or glass fits or a methacrylate (contact lens plastic) permeable to oxygen may alternatively be used, and such microporous materials can sustain substantial pressure differences between the two tubes. However, it has been found that satisfactory separation of gas can be achieved without providing such a membrane over the apertures.

Figure 18A:
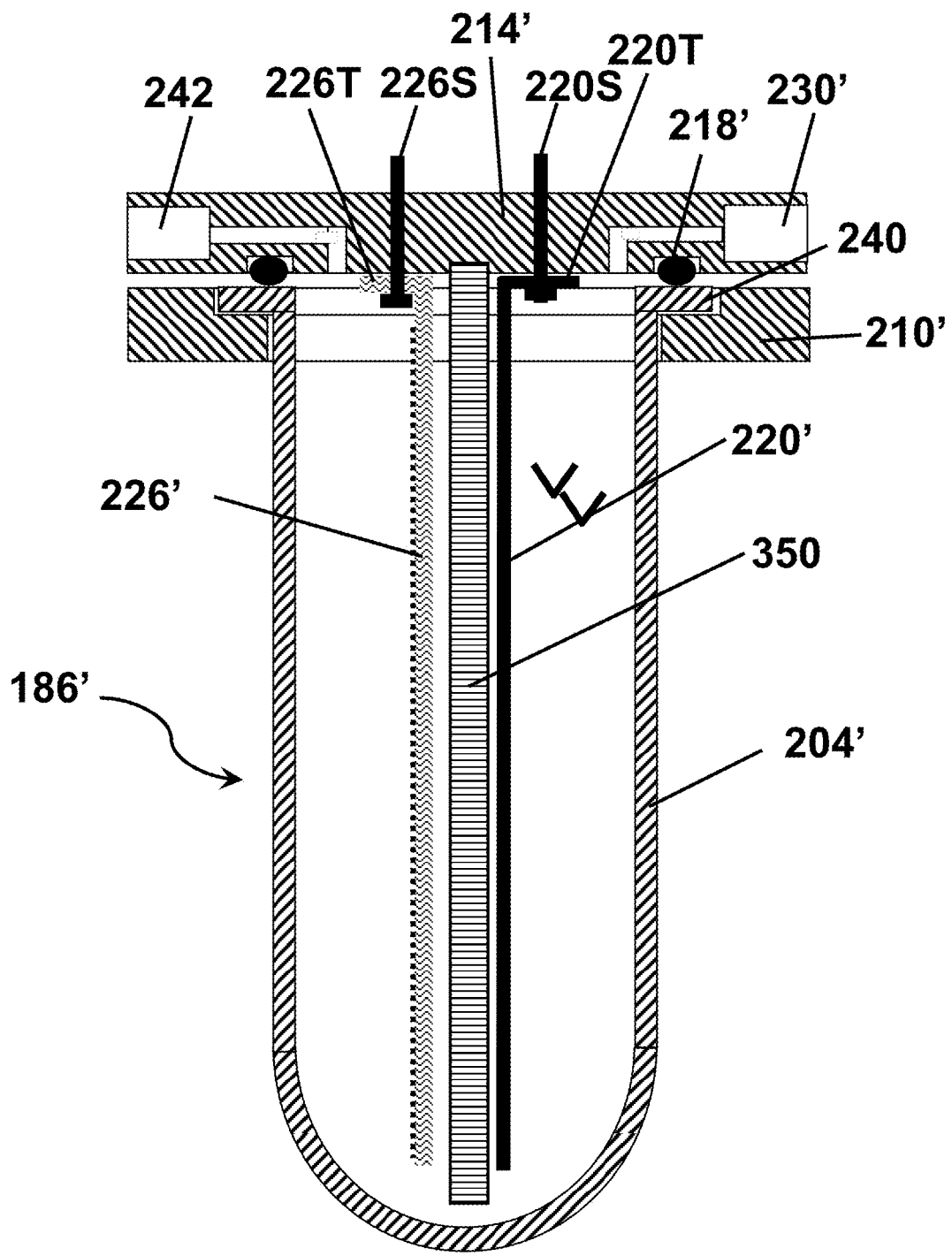
FIG. 18A is a schematic cross-section similar to that of FIG. 17A through an alternative cylindrical core which can be substituted for the core shown in FIG. 17A.

FIG. 18A shows as modified version (generally designated 186') of the core assembly 186 shown in FIG. 17A. In this modified version, the outer glass tube 204' has a rounded, sealed lower end and is provided at its upper end with an outwardly-extending flange 240, which is ground flat to accept an O-ring seal 218'. An annular backplate 210' with threaded holes is positioned below the flange 240, and an upper plate 214', having a groove which receives the O-ring seal 218' is bolted to the backplate 210' to form a seal. The upper plate 214' provided with an entrance port 242 for electrolyte and exit ports (only one exit port 230' is shown in FIG. 18A) for gases generated.

Figure 18B:
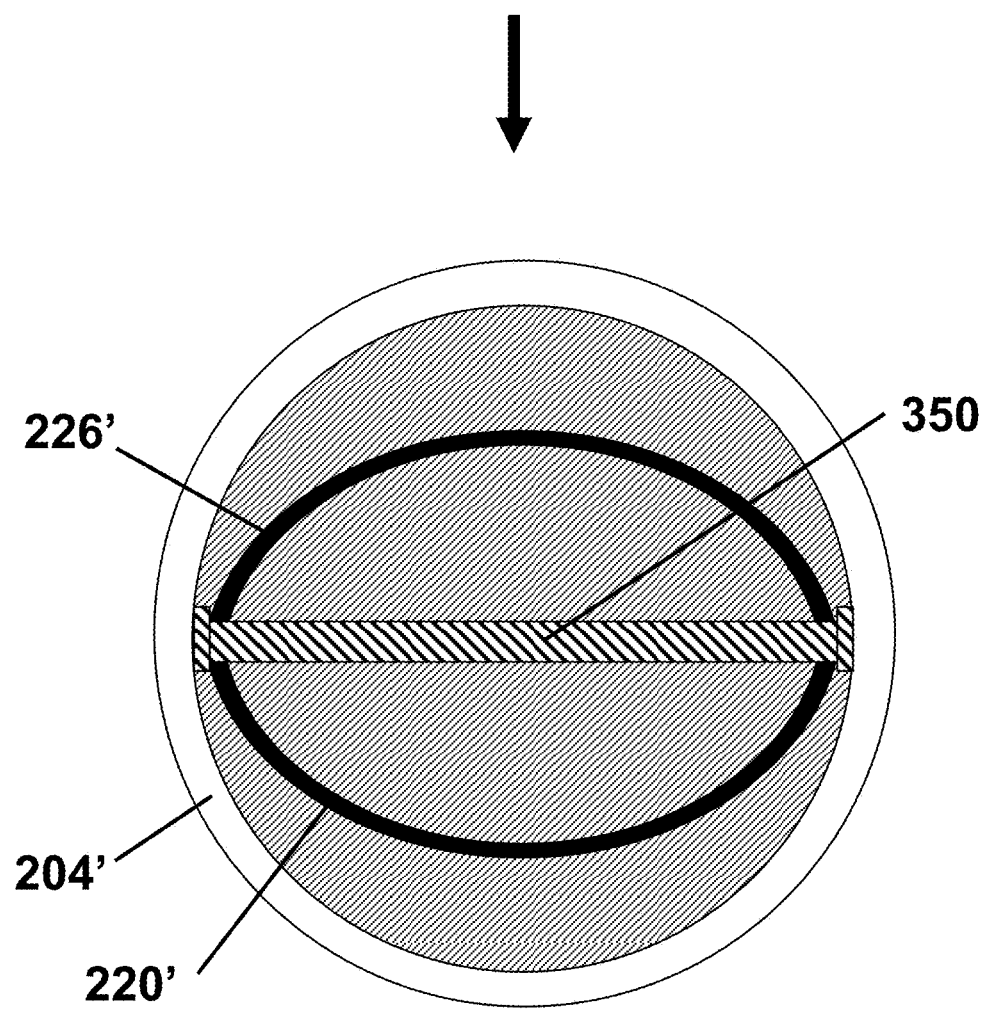
FIG. 18B is an enlarged cross-section, similar to that of FIG. 17B, through the alternative core shown in FIG. 18A showing the forms of the electrodes, which are substantially planar but are oppositely curved and are separated by a flat septum.

In the core assembly 186' of FIG. 18A, the inner tube 202 present in the core assembly 186 shown in FIG. 17A is eliminated, and instead a planar central septum 350, extends diametrically across the tube 204', effectively dividing this tube into two substantially hemi-cylindrical chambers, as most easily seen in FIG. 18B. Note that the septum 350 does not make sealing contact with the lower end of the tube 204'. A titania/titanium electrode 226' and a counter-electrode 220' are mounted on opposed sides of the septum 350. (For ease of illustration, FIG. 18A does not accurately represent the forms of these electrodes, which will be explained below with reference to FIG. 18B.)

Each of the electrodes 220' and 226' is provided at its upper end with a tab (designated 220T and 226T respectively), each tab extending horizontally and thus perpendicular to the main part of the electrode. Titanium screws 220S and 226S respectively pass through the tables 220T and 226T respectively and the secure the electrodes 220' and 226' respectively to the upper plate 214'. To ensure proper sealing around the screws 220S and 226S, O-rings or other sealing means may be provided where the screws pass through the upper plate 214', but such conventional sealing means are omitted from FIG. 18A for clarity. The upper ends of the screws 220S and 226S protrude above the upper surface of the plate 214' and are shaped and spaced to form a standard male plug size. This male plug may be connected via a female plug and cable to a photovoltaic strip (described below with reference to FIG. 22) in order that the photovoltaic strip can provide a bias or over-voltage to the electrodes 220', 226'.

The planar septum 350 isolates the electrodes 220', 226' from each other to prevent a short circuit and also, as already noted, effectively divides the interior of the tube 204' into two substantially hemi-cylindrical chambers, with one electrode being present in each chamber. The upper end of the septum plate is received within a groove in, and sealed to the upper plate 214'. The necessary seal to the polycarbonate upper plate 214' may be formed by solvent welding, ultrasonic welding, heat welding, or a mechanical seal with or without silicone rubber adhesive sealant. The septum can be made of polycarbonate, polytetrafluoroethylene, silicone rubber, silicone rubber foam (closed or open cell) or other high temperature and inert material or plastic or combinations thereof, such as a polycarbonate septum with a sealing edge comprising silicone rubber tube that is split along its length and applied to the polycarbonate edges, or silicone rubber foam.

As shown in FIG. 18B, the electrodes 220', 226' have substantially the form of parts of thin, hollow cylinders, with the vertical edges of the electrodes in contact with the septum 350 but with the central portions of the electrodes spaced from the septum.

The counter electrode 220' shown in FIGS. 18A and 18B (and the similar counter electrode shown in FIG. 19) will typically not be formed of carbon, as is the counter electrode shown in FIGS. 17A-17C; instead the counter electrode 220' will typically be formed of a planar electrode material such as stainless steel mesh, titanium mesh (platinized or not), TDA carbon strip or reticulated glass carbon. The TDA carbon strip is made from sheets that are reinforced with conducting carbon fiber and were obtained from TDA Research, 12345 W. $52^{nd}$ Ave., Wheat Ridge, Colo. The edges of the septum 350 make contact with the inside wall of the tube 204' by press-fit. The photoactive electrode 226' and the counter-electrode 220' are formed into the illustrated arch shape by making the electrodes with a width slightly larger than the inside diameter of the tube 204'. However the electrodes can also lie adjacent to the septum surface and even be bonded to the septum for ease of replacement of the entire assembly comprising septum, both electrodes, and top plate 214'. The arches of the electrodes can be concave or convex as it faces the concentrating reflector.

Figure 18C:
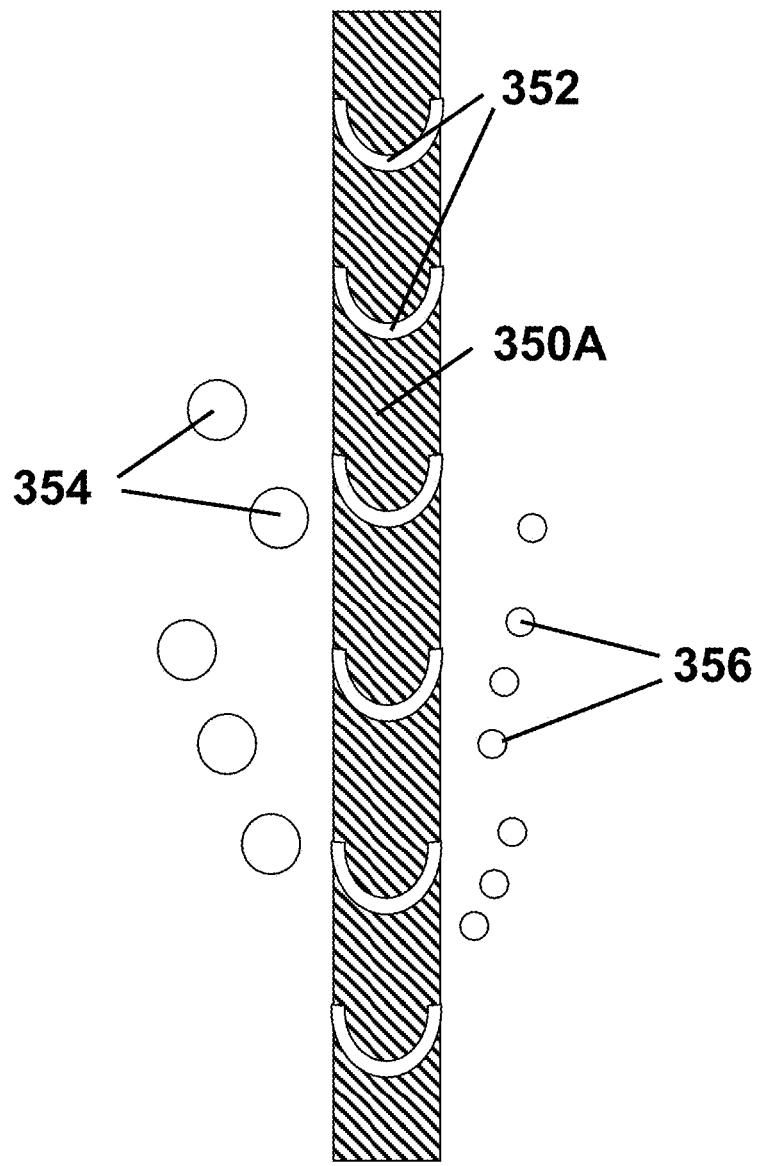
FIG. 18C is a detailed view of one side faced of the flat septum shown in FIG. 18B showing the grooves provided in the side faces of the septum.

Obviously, it is necessary to provide for ionic conduction pathways between the electrodes 220' and 226'. However, unlike the inner tube 202 shown in FIG. 17C, the main part of the septum is not provided with apertures. The ionic conduction pathway provided by the gap between the lower end of the septum 350 and the lower end of the tube 204' is not, by itself, adequate for this purpose. Accordingly, to provide additional ionic conduction pathways, the side faces (designated 350A in FIG. 18C) of the septum 350 in contact with the inner wall of the tube 204', are interrupted periodically by slots or grooves 352 that are cut into the side faces 350A. The grooves 352 may be substantially semi-circular, as illustrated in FIG. 18C, "V"-shaped or linear and cut at an angle, preferably of 45° or more. The grooves 352 create a short ionic conduction pathway, similar to that provided by the apertures 402 shown in FIG. 17C, while preventing the oxygen and hydrogen gases (indicated schematically at 354 and 356 respectively in FIG. 18C) from mixing due to buoyancy. Further, the grooves 352 can be alternating such that they impart a helical or screw effect to the flow of the electrolyte for enhanced convective flow.

Alternatively, if the septum 350 is formed of (for example) a silicone rubber open cell foam strip 0.25-0.5 inch (6 to 13 mm) thick; the grooves 352 are not needed to create ionic conduction pathways since the open cell structure of the foam allows ionic communication to occur without allowing mixing of the gaseous products. In all cases the septum material must be capable of surviving temperatures of at least 100° C. and electrolytic solutions containing salts, acids, or bases. All of the materials discussed herein meet these requirements. Where adhesive is used to bond the titanium to the septum, acrylic adhesive is used. The titanium/titania electrode 220' can also itself act as a septum, if edge guides are provided that effect a seal to the tube 202' except in the area of the grooves 352.

Figure 19:
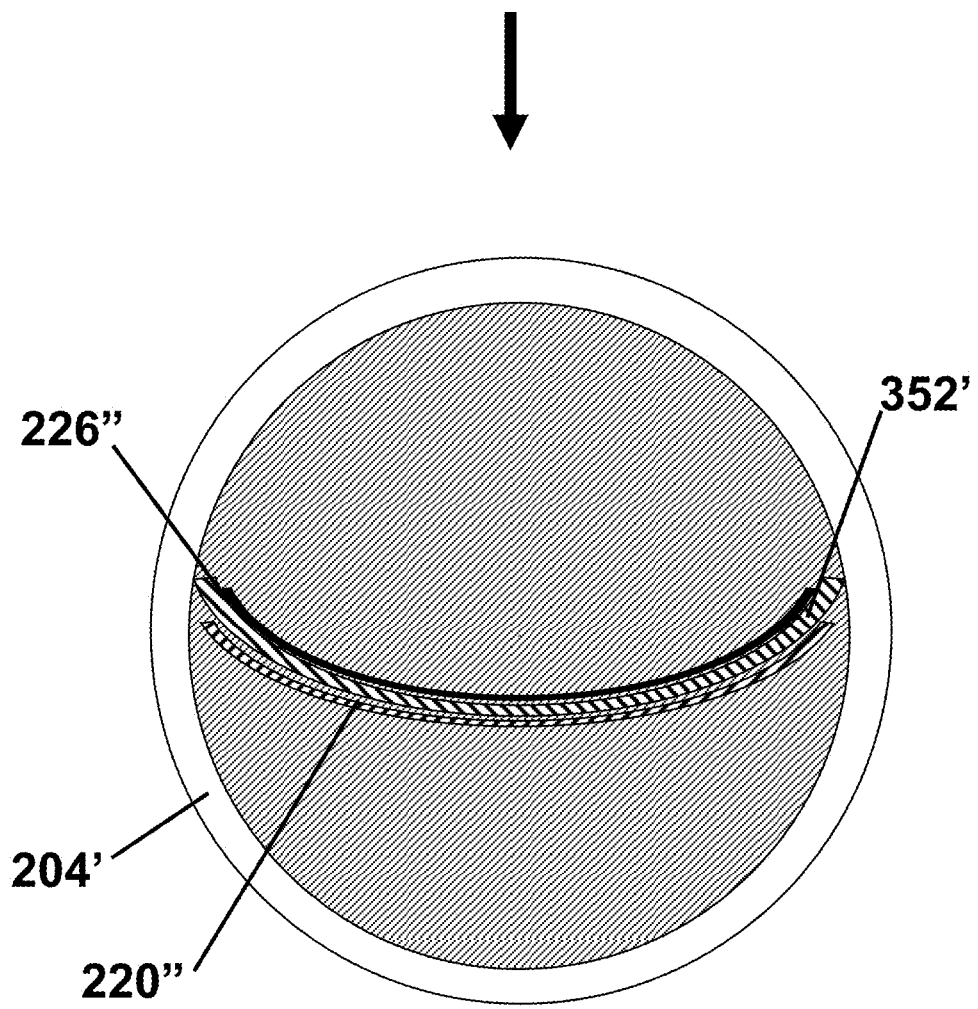
FIG. 19 is a schematic cross-section, similar to that of FIGS. 17B and 17B through a third core assembly, in which the electrodes are substantially planar but are together curved the same way with the septum so as to better form a seal with the inside of the tube.

FIG. 19 illustrates a radical cross-section, similar to that of FIG. 18B, through a modified version of the apparatus of FIGS. 18A-18C in which the septum (designated 352') is a flexible strip that seals to the inside wall of the borosilicate glass tube 204' by intimate contact. The titania/titanium electrode 226" and the counter electrode 220" are of substantially the same arcuate form as the septum 352' and are laminated thereto. Angled grooves (not shown in FIG. 19) providing ionic conduction pathways are again formed into the edges of the septum 352'. This embodiment allows for a lighter core assembly that can have higher aspect ratios (i.e., the length to diameter ratio of the core assembly can be much higher) which is preferred for roof-top mountings, where the reflectors can be smaller in width for overall lower profile height.

Figure 20:
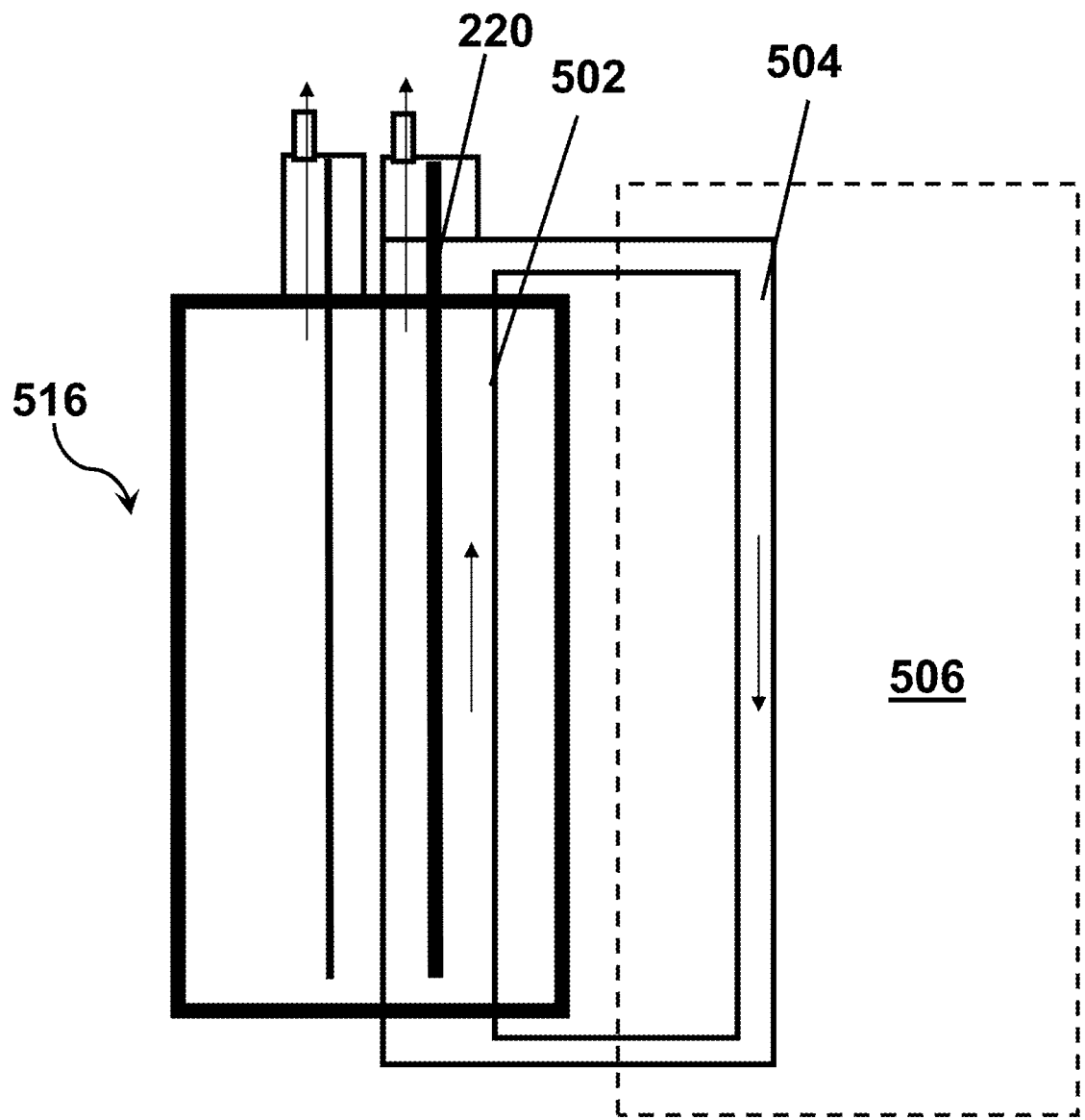
FIG. 20 is a schematic side elevation of a modified cylindrical core and associated apparatus for making use of excess heat generated within the core during operation and for reducing temperature gradients along the core axis.

When any of the apparatus shown in FIGS. 16-19 is operating, there is a natural convective flow of electrolyte parallel to the axis of the core assembly. This convective flow can be used to cool the electrolyte in order to maintain a desired operating temperature and/or to remove from the core assembly heat which can usefully be employed elsewhere, for example in space heating, thus improving the overall efficiency of use of the radiation incident upon the apparatus 170. FIG. 20 illustrates schematically a modified core assembly (generally designated 516) having the same central carbon anode 220 as previously described. However, the inner tube 502 of the modified core assembly 516 has a U-shaped external tube 504 joining its upper and lower ends. As indicated by the arrows in FIG. 20, electrolyte circulates upwardly through the inner tube 502 and downwardly through the external tube 504, being cooled within the external tube 504 by a heat withdrawing apparatus indicated schematically at 506. The external tube 504 can be formed of Grade 2 titanium tubing for resistance to corrosion, for increased tolerance to heat, and for increased hydrogen pressure. By a further modification of the apparatus shown in FIG. 20, the external tube 504 could be continuous with the titania electrode 226 (FIG. 17A) with the relevant portion of the titanium tube being treated to form a titanium photocatalyst of the present invention. This arrangement allows for reducing the temperature gradient along the photoactive portion of the titanium tube for more even operation along the length of this photoactive portion. Obviously, the core assemblies shown in FIGS. 18A-18C and 19 can also be modified as illustrated in FIG. 20.

A closed convective loop is also present within the tube containing the carbon electrode and where the hydrogen is produced; this convection circulates the electrolyte in the "carbon" chamber past the interface with the "titania" chamber. As already noted, the interface between the two chambers can be a series of open holes, grooves, or a microporous material such as ceramic, fitted glass, or an ion exchange membrane such as fluoropolymer. This architecture enables higher differential pressures between the hydrogen and oxygen, in addition to increasing the rate of production and the production efficiency. The output is restricted by a ceramic frit to the pressure required, but keeps the aqueous electrolyte contained and circulating. Gas separation is achieved by common ports between the two electrolyte chambers that may be open holes, or the aforementioned microporous materials. The hydraulic pressure at the ports is substantially equal between the chambers so as not to damage the separation membrane, or if open holes are present, to avoid liquid flow across the holes.

Although not shown in FIG. 16, the apparatus 170 also comprises a photovoltaic strip disposed along the axis of symmetry of the reflector assembly 180, and the apparatus is designed so that each of the core assembly 186 and the photovoltaic strip can make maximum use of the wavelengths of incident radiation which they are best equipped to use; as discussed in more detail below, the photolysis reaction carried out by the electrode 226 (FIG. 17A) makes use of near ultraviolet and shorter wave visible (blue-green) wavelengths of radiation, whereas the photovoltaic strip makes use of wavelengths from about green in the visible range through red. For reasons explained below, in the preferred apparatus 170, it is important that the outer tube 204 (FIG. 17A) transmit radiation of all the wavelengths used by both the electrode 226 and the photovoltaic strip, and this is one reason for forming the outer tube 204 of Type 3 borosilicate glass, which transmits radiation of all frequencies from infra-red to ultra-violet.

Figure 21:
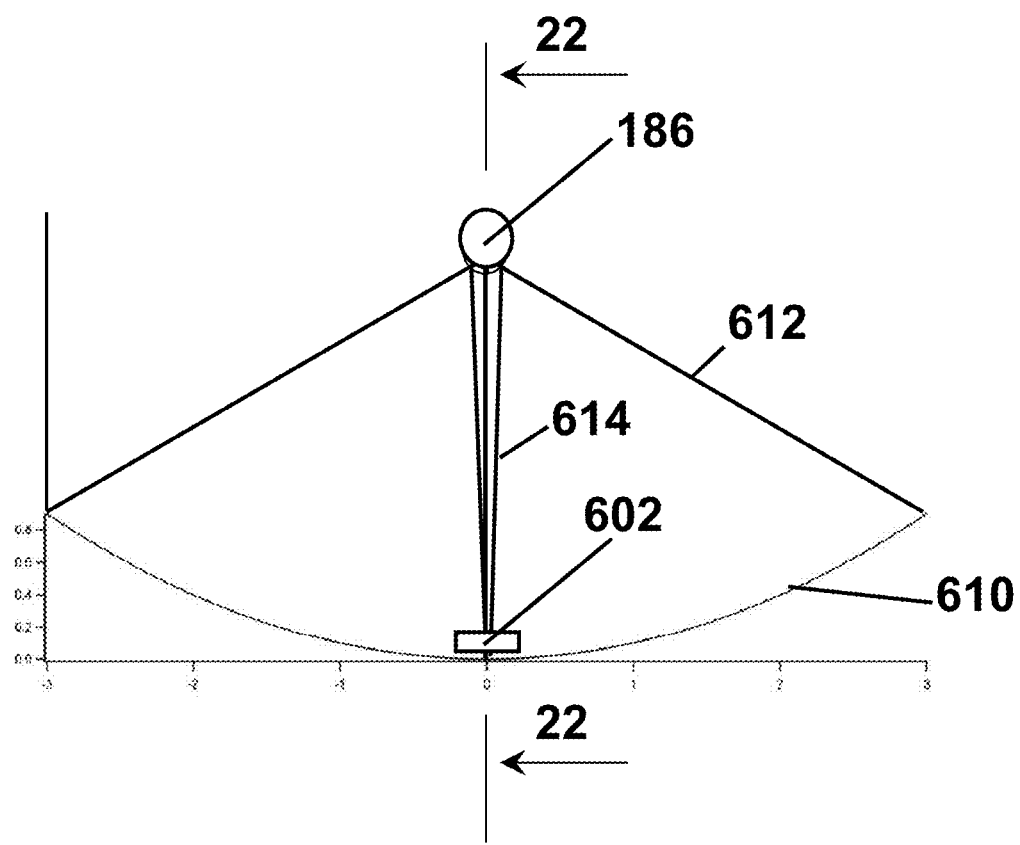
FIG. 21 is a schematic cross-section, taken perpendicular to the axis of the cylindrical core, through the reflector and core of the apparatus shown in FIGS. 16-20 to show the location of a photovoltaic strip.
Figure 22:
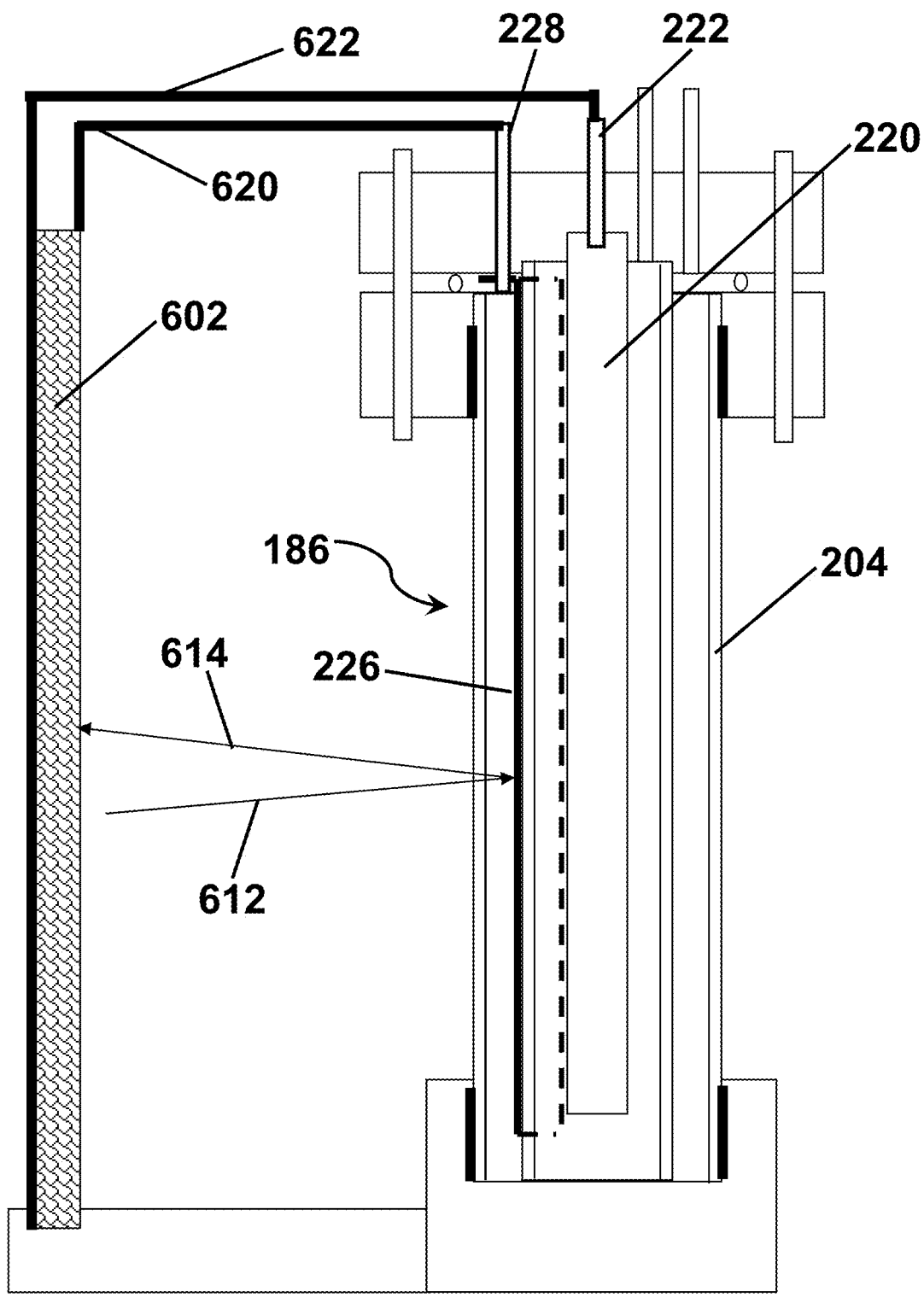
FIG. 22 is a schematic cross-section along the line 22-22 in FIG. 21, with part of the reflector omitted for clarity.

As may be seen from FIGS. 21 and 22, the photovoltaic strip 602 is disposed along the axis of symmetry of the reflector assembly 170 and is mounted on a mirrored elliptical reflector member 610 which reflects solar radiation. Solar radiation from the reflector member 610 travels, as indicated at 612, to the core assembly 186, where the ultraviolet and short wave visible radiation is absorbed, while the remaining radiation is again reflected and travels, as indicated at 614, to a secondary focus at the photovoltaic strip 602.

The reflection of the "unused" radiation (i.e., radiation not used by the titania electrode 226) from the core assembly 186 can be achieved in various ways, and one such way is illustrated schematically in FIG. 22, where the radiation 612 from the reflector member 610 passes through the outer tube 204 (hence the need for this tube to transmit all the wavelengths used by both the electrode 226 and the photovoltaic strip 602) and strikes the electrode 226. The longer wavelength (green through red) radiation is reflected from the part-cylindrical electrode 602, passes back through the outer tube 204 is travels, as indicated at 614, to a secondary focus at the photovoltaic strip 602. Although, as described in more detail below, the electrode 226 has minor undulation or other surface roughness needed for its photovoltaic efficiency, its surface is still sufficiently smooth to reflect and focus most of the unabsorbed longer wavelength radiation used by the photovoltaic strip 602. For greater efficiency, the photovoltaic strip 602 may be covered by a coating which reflects the shorter wavelength radiation as well as the near-infra red used by the core assembly 186 to that core assembly.

Placing the photovoltaic strip 602 on an "outrigger" (the reflector member 610) to the core assembly 186, as shown in FIG. 22, ensures that the strip 602 does not occlude reception by the titania photoelectrode 226 of any of the concentrated light from the collector, so that the strip 602 is in the shadow of the core, while being close enough to receive substantially all of the diffuse reflection of unabsorbed solar radiation from the core. In this way, the cost of a dichroic spectral separator is eliminated, and the titania electrode itself reflects unused parts of the spectrum to the photovoltaic strip, which is optimized for the unused solar spectrum parts. The core assembly 186 shown in FIG. 22 may of course be the core assemblies shown in FIGS. 18A, 18B and 19.

As already indicated, it is not essential that the back reflection of the radiation to the photovoltaic strip be effected by the electrode 226. Reflection may, for example, occur at the outer surface of the outer tube 204, by coating this surface with either a dichroic mirror or filter comprising a thin film optical stack (typically alternating layers of high refractive index and low refractive index metal oxide layers, such as titania and magnesium fluoride or silicon dioxide) coated directly onto the outer tube, or a holographic mirror. Obviously, whatever reflective coating is used on the outer tube 204 should be wavelength selective such that the wavelengths required by the electrode 226 pass into the core assembly 186 through the outer tube 204 and only the longer wavelengths needed by the photovoltaic strip 206 are back reflected on to this strip. Alternatively, the necessary wavelength selective reflector can be coated on to an additional tube surrounding the core assembly 186; the provision of such an additional tube may also be useful for preventing mechanical damage to the core assembly and/or protecting persons or apparatus near the core assembly 186 from injury should the pressurized core fail during operation.

As already indicated, the apparatus 170 uses a Dall-Kirkham reflective design, with an elliptical primary reflector, the reflector member 610, and a cylindrical secondary reflector, the electrode 226. In practice, this type of reflective design allows radiation concentration of about 30 suns without the need for precise optics, thus allowing a low cost, robust, light weight apparatus. Similar results can be achieved with a Cassegrain reflective design, with a parabolic primary reflector and a hyperbolic secondary reflector. The apparatus of the present invention may also may use of Newtonian (spherical primary and flat secondary reflectors, or a refractive concentrator, for example a Fresnel lens in preferably lenticular form that is manufactured from a UV-transparent material such as UVT (ultra violet transmitting) acrylic or borosilicate 3.3 glass.

As shown in FIG. 22, the photovoltaic strip 602 is used to apply a bias voltage as well as over voltage across the electrodes 220 and 226. Bias voltage is required for the hydrogen production to proceed vigorously, while the overvoltage overcomes the various electro-chemical resistances in an electrolysis cell. For this purpose, opposed sides of the photovoltaic strip 602 are connected via conductors 620 and 622 to contacts 228 and 222 respectively and thence to the electrodes 226 and 220 respectively, with the positive conductor going to the electrode 226 and the negative conductor to the electrode 220. Under typical practical conditions, the photovoltaic strip 602 will apply a bias voltage plus overvoltage varying from about 0.5 V to 8 V (direct current) across the electrodes 220 and 226; as demonstrated below, it has been found that a bias voltage plus over-voltage of about 5.5 V provides optimum efficiency for solar assisted photolysis of water.

Obviously, a bias voltage and over-voltage can be applied to the electrodes 220 and 226 from a source other than a photovoltaic strip. Mains electricity can be used for non-solar electrolysis, or for solar-assisted electrolysis, after conversion of the high voltage AC mains electricity to low voltage direct current, which can then be supplied to the core assembly using the same conductors as for the photovoltaic strip. In this way, low cost over-capacity nighttime mains power can be used produce hydrogen; to generate hydrogen in the absence of illumination, the core assembly must be supplied with electricity at a voltage greater than the diode breakdown voltage of the core assembly, which is typically about 12 V. The mains electricity could, for example, be supplied by a wind farm (most wind farms produce the majority of their electricity at night), tidal generator or other generating apparatus the output of which varies with environmental conditions, thus providing a way to store the intermittent output from such a generating apparatus in the convenient form of hydrogen (with optional output of oxygen).

In the apparatus 170 described above, the core assembly 186 is disposed at the primary focus of the reflector assembly 180 and the photovoltaic strip 602 at the secondary focus. It will readily be apparent to those skilled in radiation collection systems that the locations of the core assembly and photovoltaic strip could be reversed. Moreover, placing the core assembly at the secondary focus allows (optional) mounting of the core assembly within the reflector assembly. An apparatus (generally designated 800) of this type will now be described with reference to FIGS. 23 and 24.

Figure 23:
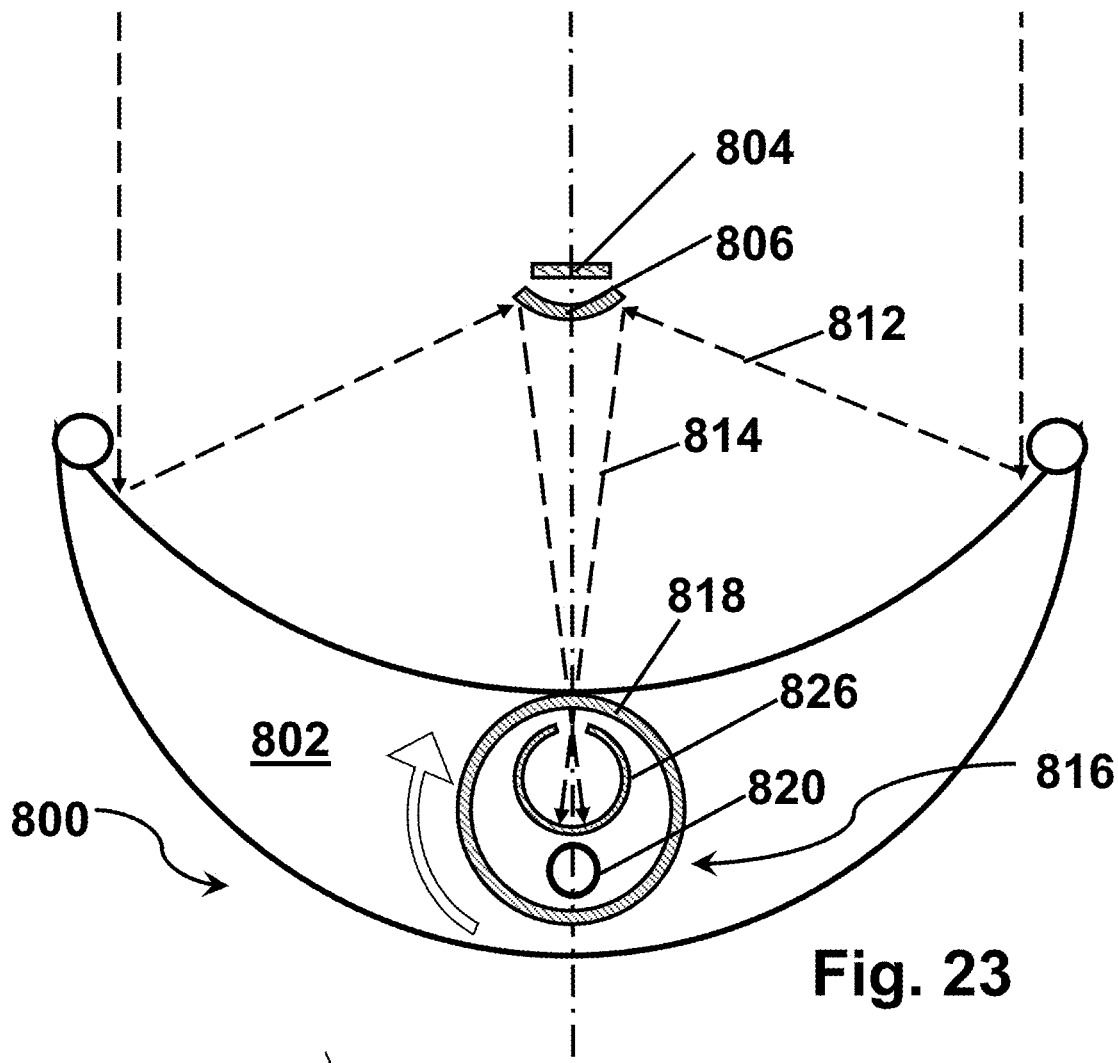
FIG. 23 is a schematic cross-section, similar to that of FIG. 21, through a second modified form of the apparatus shown in FIG. 16; in this second modified form, the core is disposed within the reflector.
Figure 24:
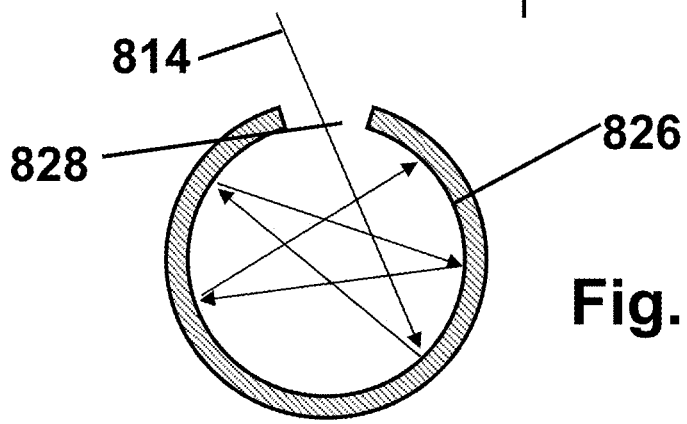
FIG. 24 is an enlarged cross-section through the photoactive electrode of the apparatus shown in FIG. 23, in which the optical integrating cylinder feature is seen in more detail.

As shown in FIG. 23, the apparatus 800 is of the Cassegrain type, with a parabolic main reflector assembly 802 and a hyperbolic secondary reflector 806, which is wavelength selective to reflect only shorter wavelengths and which overlies a photovoltaic strip 804. As indicated by the broken lines in FIG. 23, incoming solar radiation is reflected from the main reflector assembly 802 as indicated at 812 and (if of appropriate wavelength) is further reflected from the secondary reflector 806 as indicated at 814 to a core assembly (generally designated 816) mounted within the reflector assembly 802. This arrangement allows the core assembly 816 to be placed close to or within the main reflector assembly for easier access and interconnection, and enables easier, lower energy solar tracking with very little need for counter-balancing; the core assembly can be co-axial with the rotation axis of the main reflector assembly.

Placing the core assembly at the secondary focus also allows for an advantageous modification of the form of this assembly. As schematically indicated in FIG. 23, the core assembly 816 comprises a transparent outer tube 818 similar to outer tube 204 (FIG. 17A) of apparatus 170, but the internal arrangement of the core assembly 816 differs from that of the core assembly 186 of apparatus 170; in core assembly 816, there is no inner tube and the electrodes 820 and 826 extend parallel to but spaced from each other. As most easily seen in the enlarged view of FIG. 24, the photoactive electrode 826 is formed as an "integrating cylinder", that is to say the photoactive electrode 826 is substantially cylindrical with the photoactive surface on the inside, and having a slit 828 running axially along to cylinder such that the tightly focused light 814 from the secondary reflector enters the cylinder and is able to undergo multiple reflections within the cylinder multiple times until substantially completely absorbed by the photoactive surface. This increases the efficiency of photon conversion by the electrode 826.

The apparatus 800 is well adapted for construction as an extruded or molded plastic ribbed reflector design, with all features for mounting the core assembly 816 and other components molded in. The main reflector assembly can, for example, use a rear-surface silver ultra-violet reflecting layer on ultra-violet transmissive acrylic polymer, and be epoxyovercoated. Acrylic polymers can be flexed into the parabolic or hyperbolic main reflector shape, as required, and provide a smooth optical surface which is durable against hail and other weather.

The main reflector assembly is typically one of two main types. In the first type, the end caps or end wings determine the shape of the mirror. The two end caps are connected to each other by a series of tubes, with one tube at each tip of the end caps, and one or more tubes in between. The tubes are solvent-cemented or otherwise secured connected to the end caps, and a tension rod can run down the center of the tube for added strength. Cross bracing between the tubes can be added for additional stiffness under wind loading. A slotted guide is attached to the facing inside surfaces of the end caps to define the shape of the main reflector. The main reflector material is inserted into the slotted guides. The main reflector material is made sufficiently flexible that it follows the shape determined by the guides faithfully, while also smoothing out any irregularities in the manufacture of the end caps or guides. The end caps are typically blow-molded of recycled plastic, and the molding process allows for many features to be easily integrated into the end caps, including the guides, mounting flanges, stiffening ribs, product identification, and safety and other information. The main reflector mounting material may, as already indicated, be ultra-violet resistant plastic, or may be powder coated or painted to resist ultra-violet degradation. The main reflector material can be an ultra-violet transmitting acrylic polymer such as poly(methyl methacrylate), known commercially as Plexiglas, with a mirror coating applied to its rear surface, this coating being optimized for reflection of ultra-violet as well as the visible and infra-red radiation. Alternately, the main reflector material can be an acrylic or polycarbonate sheet about ⅛ inch (about 3.2 mm) thick with a layer of sheet metal reflector adhered to its front surface facing the sun. The metal reflector in this case can be an anodized polished aluminum product, for example MIRO produced by Alanod GmbH. This product is overcoated with silicon dioxide and then titanium dioxide for improved ultra-violet reflection, the titanium dioxide also provides self-cleaning properties and ruggedness, since the hydrophilic nature of titanium dioxide causes rain to remove accumulated dirt from the surface, thereby reducing maintenance and improving lifetime. The metal dents easily, so in case of hail, the main reflector assembly is inverted, so that the acrylic polymer absorbs and deflects shocks caused by impact of hail.

In the second type of reflector assembly, the assembly is an form or molded form having the cross section seen in FIG. 23, typically formed of a recycled plastic, and has edge receivers built in to receive either the mirror or the metal mirror sheet. For reflectors about 2 meters wide and 3 meters long, the acrylic backing mirror material should be about ⅛ inch to 3/16 inch (about 3.2 to 4.7 mm) thick, providing the optimum ratio of flexibility to stiffness for a smooth continuous optical curve.

The apparatus 170 and 800 previously described are freestanding units provided with their own supporting members and intended to be disposed in open areas away from other structures. However, the apparatus of the present invention can also be designed to be mounted on a building wall or roof, and FIGS. 25 and 26 illustrate two different embodiments of this type.

Figure 25:
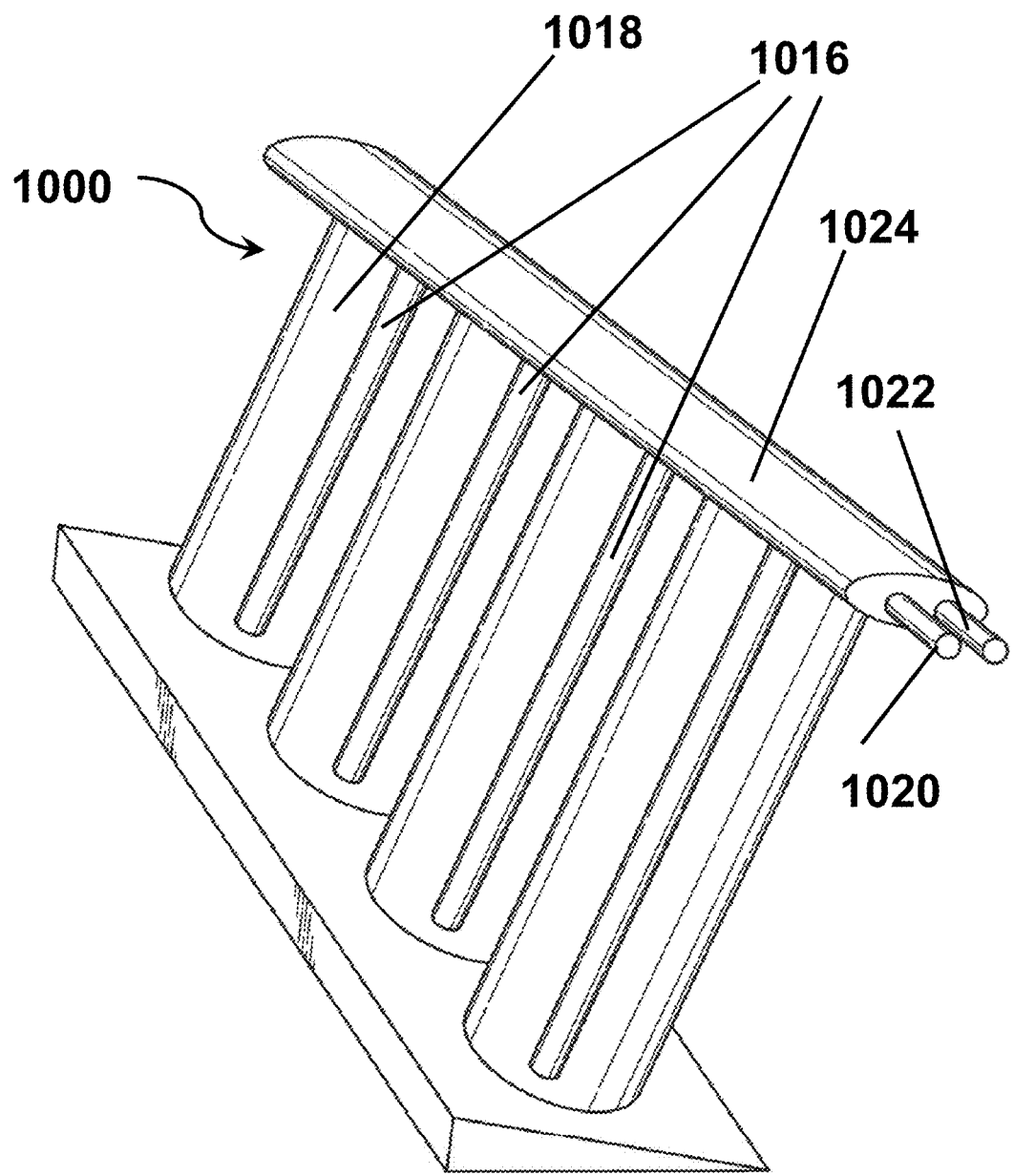
FIG. 25 is a perspective view of a multiple core photolysis apparatus, optimized for vertical installation against a building wall or for use with heliostats.
Figure 26:
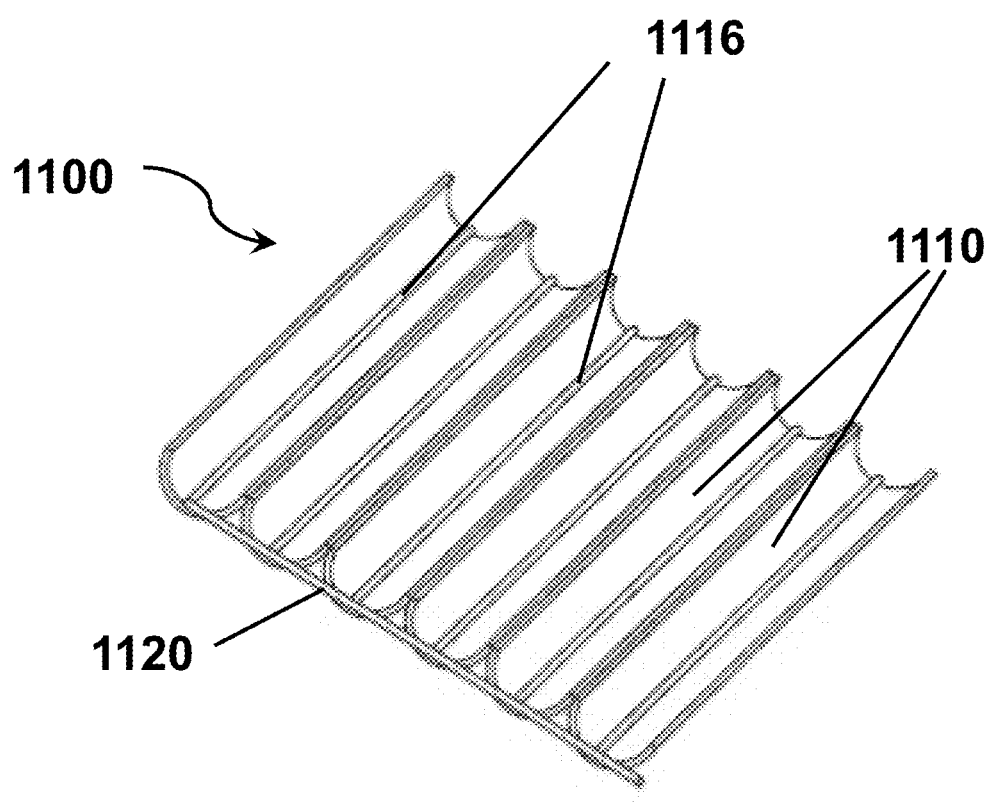
FIG. 26 is a perspective view of a second multiple core photolysis apparatus suitable for mounting on the roof of a commercial or residential building.

The apparatus (generally designated 1000) shown in FIG. 25 is of a "tower" type intended to be supported on a building wall. The apparatus 1000 comprises a plurality of elongate parallel core assemblies 1016, each similar to the core assembly 186 shown in FIGS. 17 and 22; for simplicity, FIGS. 25 and 26 do not show the internal components of their core assemblies. Each core assembly 1016 extends along the axis of an outer cylinder 1018, which is formed of an acrylic polymer capable of transmitting ultra-violet and visible radiation. Each outer cylinder 1018 is sealed at its lower end and its upper end is covered, and the cylinder is filled with water, so that is acts as a focusing lens concentrating sunlight on to the core assembly 1016 running along its axis. Advantageously, the water within the outer cylinders 1018 is mixed with sufficient glycerol to raise its refractive index from the 1.33 of pure water to match the 1.45 refractive index typical of acrylic polymers, thus improving the performance of the cylinder in concentrating solar radiation on the core assembly 1016. The glycerol also acts as an antifreeze to prevent damage to the apparatus 1000 if the apparatus is exposed to freezing temperatures. Alternatively, a Fresnel lens formed of an ultra-violet transmitting polymer can replace the fluid-filled cylinder 1018, and the use of such a Fresnel lens may be advantageous when the apparatus is to be mounted in a location (for example, on a roof which is not capable of supporting large loads per unit area) where the weight of the fluid-filled cylinders may be a problem. The outer cylinders 1018 also act as containment vessels should a core assembly fail during use, and thus allow operation of the core assemblies 1016 at higher pressures than would be safe if the outer cylinders were not present. Oxygen and hydrogen are removed from the apparatus 1000 via tubes 1020 and 1022 respectively, these tubes being housed within a protective manifold 1024.

In the apparatus 1000, it is advantageous for the photoactive electrode to occupy a greater proportion of the hollow cylinder than the less than hemicylindrical electrode 226 shown in FIG. 17; using a photoactive electrode which occupies more than a hemicylinder allows good use of solar radiation without the need for solar tracking such as that carried out by the apparatus 170 described above. For the same reason, the apparatus 170 typically does not incorporate a photovoltaic strip, since if such a strip is included the apparatus 1000 needs to be modified to allow the photovoltaic strip to remain at the secondary focus of the optical system.

So far as possible consistent with the mounting location being used, the axes of the cylinders 1018 shown in FIG. 25 should be tilted so as to parallel to the earth's axis, in the same way as the axis of the polar housing 186 of the apparatus 170 shown in FIG. 16. The cylinders 1018 should also be spaced apart so that they do not shadow each other.

In a variant of the apparatus 1000 shown in FIG. 25, the fluid-filled cylinders 1018 are modified by inserting a second sheet of ultra-violet transmitting polymer within each cylinder, this second sheet being solvent welded to the inside surface of the main cylinder 1018 so as to form a meniscus focusing lens, which is filled with an optical oil or glycerol having a refractive index close to that of the ultra-violet transmitting polymer. The external form of the cylinder 1018 is unchanged but the core assembly 1016 is moved from the axis of the cylinder 1018 to adjacent the back surface thereof (i.e., adjacent the surface on which the apparatus 1000 is mounted) where the new primary focus is located. A photovoltaic strip may be mounted in the center of the rearward surface of the meniscus focusing lens. This form of the apparatus does require solar tracking, but such tracking is readily achieved by mounting the cylinders 1018 on rollers which can be rotated by an appropriate motor.

The cylindrical tower apparatus 1000 shown in FIG. 25 is more resistant to high winds than the apparatus 170 shown in FIG. 16, and is more easily integrated into a building design. The apparatus 1000 may also be considered more architecturally attractive than the freestanding apparatus 170.

FIG. 26 illustrates a further multi-core apparatus (generally designated 1100) of the present invention which is generally similar to the apparatus 1000 shown in FIG. 25 but is adapted for roof mounting. The apparatus 1100 comprises a plurality of elongate parallel cores 1116 joined by a common manifold 1120; obviously, if desired, a second common manifold could be provided at the opposed ends of the cores 1116 from the manifold 1120. However, in the apparatus 1100, concentration of radiation is provided by a plurality of hemicylindrical, mirrored reflectors 1110; alternatively, a multiple Fresnel top sheet overlying the cores 1116 could be substituted for the reflectors 1110.

Figure 27:
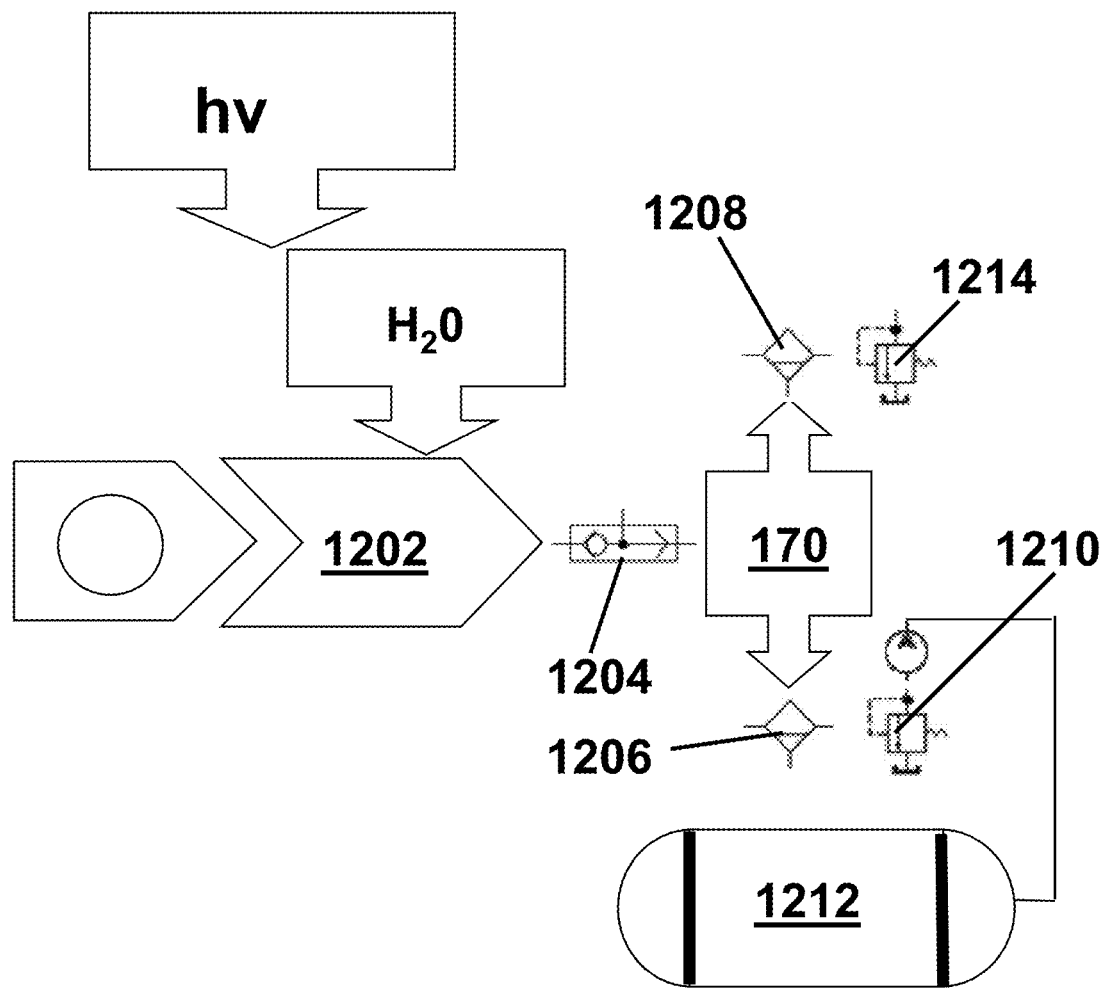
FIG. 27 is a block diagram showing various auxiliary apparatus used in conjunction with the apparatus shown in FIG. 16.

FIG. 27 illustrates schematically the various auxiliary apparatus which is used in conjunction with the apparatus 170 described above to collect and store the hydrogen and oxygen gases produced and to refill the apparatus with water to replace that electrolyzed. Although not shown in FIG. 17, the apparatus 170 is in fact provided with an additional tube extending through the top plate 214 through which additional way can be introduced into the apparatus, as schematically illustrated by "H$_2$O" in FIG. 27. As already described, the apparatus 170 is also supplied with solar (or other) radiation, as schematically illustrated by "hv" in FIG. 27. The additional water ("feedstock") can be ocean water. While the electrochemical potential for forming chlorine gas is very close to that of oxygen formation, it is still higher, so oxygen is formed preferentially over chlorine gas at low brine concentrations. Ocean water is only 3.5% sodium chloride by weight, which is a low concentration, and so chlorine is not formed. However, if ocean water is the sole replacement water, the salt concentration will grow within the apparatus 170 until it reaches saturation, or about 21% by weight, after which salt would precipitate out within the apparatus as sediment which have to be removed. However, because typically the formation of chlorine gas is not desired, the core assembly 186 (FIG. 17) is flushed with ocean water at intervals (at least annually) to keep the salt concentration low. As indicated schematically at 1202 in FIG. 27, the apparatus includes provisions for filtering incoming water to remove algae, rust, iron, chlorine, fluoride, and other contaminants. After filtration, the water passes through a float valve system 1204 during cool, low pressure condition of the core assembly 186 at night or at other times of low pressure within the core assembly.

As schematically indicated in FIG. 27, the hydrogen and oxygen gases leaving the apparatus 170 pass through pressure relief valves, 1206 and 1208 respectively, that provide both backpressure with the core assembly 186 and safety pressure release. The hydrogen then passes through compression apparatus 1210 and is stored under pressure in a tank 1212; the oxygen may be similarly compressed as indicated at 1214 and stored (storage tank not shown), or, depending upon the location of the apparatus 170 and commercial demand, may simply be vented to atmosphere. Those skilled in the art of gas collection will understand that a variety of additional apparatus may be included which is not shown in FIG. 27, for example thermal probes to monitor gas temperatures, and condensers and desiccants to conserve electrolyte and remove water vapor from the output gases.

In this connection, it should be noted that, in the multiple core apparatus of FIGS. 25 and 26, the pipeline connections to individual core assemblies are arranged in parallel rather than serially, so that a leak in one core assembly only affects the leaking core assembly and not the entire apparatus.

Although the apparatus has been described above principally as used to generate hydrogen and oxygen from water, the chemistry of the electrolyte can be altered to produce different electrolysis products that may be useful for manufacturing processes. For example, if the electrolyte is a brine with high salt concentration, the products will be hydrogen gas, chlorine gas, chlorine water (water containing dissolved chlorine gas) and sodium hypochlorite, a bleach. If sodium carbonate or bicarbonate are used, the gaseous products are hydrogen and carbon dioxide. Additionally, if carbon dioxide bearing electrolytes are used, such as carbolic acid and/or carbonated electrolyte, the product can be carbon monoxide. In this way, carbon dioxide from fossil fuel plants or other production can be sequestered in an electrolyte and then converted with sunlight to carbon monoxide. The carbon monoxide is then used as the feedstock to produce methane or even gasoline-like liquid fuels by adding hydrogen, as is well known. Such processes are Fischer Tropsch or variants of them. But in this case the carbon monoxide and the hydrogen are produced with sunlight and a photolytic reaction. A liquid fuel produced in this way is carbon neutral, in that it sequesters as much carbon as it releases upon being combusted. Further, the infrastructure for handling, transporting, and using liquid fuels already exists.

As already mentioned the preferred forms of the apparatus can use any photoactive electrode capable of photolysis of water to hydrogen and oxygen, or of the other photolytic reactions discussed in the preceding paragraph. However, this invention also provides preferred photoactive electrodes for use in the apparatus described above or similar apparatus; more specifically, this invention provides photoactive electrodes containing bandgap shifted titania (or a similar ceramic) and two different processes for the production of such photoactive electrodes; in the first process, a thin film of titania is formed on a substrate which is already provided with the sharply curved surfaces necessary to shift the bandgap of the deposited titania, while in the second process an acid etch of a titanium film (which can be a film of the relatively impure and inexpensive Grade 1 or Grade 2 titanium) is followed by conversion of the etched titanium film to titania by anodization or heat oxidation.

Figure 33A:
FIGS. 33A and 33B are schematic side elevations showing nano-structures formed on a preformed substrate (FIG. 33A) and by acid etching of a titanium metal film (FIG. 33B).

FIG. 33A is a schematic side elevation of a titania film grown on to a polycarbonate template comprising a close-packed three dimensional sinusoidal surface, much like an egg carton, with a spatial period of 300 nanometers (nm) or 0.3 microns. The resulting titania features or nanostructures are adjacent hemi-cylinders, at the apex of which the titania is in very high tensile stress (otherwise known as strain). It should be noted that there are essentially no gaps between adjacent nanostructures.

The second main method for the formation of photoactive electrodes of the present invention will now be discussed, this second method, as already mentioned, comprising etching of titanium metal to form nano-structures in the titanium, followed by anodizing or oxidation, or both, to convert the etched titanium to titania, preferably in the anatase form. As a preliminary matter, some theoretical discussion of the variation of titania bandgap with physical parameters will be given; this theoretical discussion is of course also applicable to nano-structured titania coatings produced by the first method of the present invention.

As already mentioned, it is well known that the bandgap of a semiconductor changes with change in volume of its lattice, this change of volume being caused by, inter alia, temperature change or applied pressure. To understand how this general principle applied to the anatase form of titania, changes in the bandgap of this material were modeled as a function of biaxial strain. To achieve quantitatively accurate results, the GW approximation was used to calculate the bandgap. The GW approximation (GWA) is an approximation made in order to calculate the self-energy of a many-body system. The approximation is that the expansion of the self-energy $\Sigma$ in terms of the single particle Green function G and the screened interaction W can be truncated after the first term. We used ABINIT software to achieve the GW approximation (ABINIT is a free software package for physicists, distributed under the GNU General Public License, whose main program allows the total energy, charge density, and electronic structure of systems made of electrons and nuclei (molecules and periodic/crystalline solids) to be calculated within Density Functional Theory (DFT), using pseudopotentials, and a plane wave basis.)

It was also important to determine the effective mass of the charge carriers in the semiconductor, since large effective mass charge carriers can lead to higher recombination of photogenerated electron-hole pairs and hence to reduce efficiency of the electrode. Accordingly, density functional theory modeling was used to produce complete band structure plots which could be used to estimate the effective mass of the charge carriers. Theoretically, the bands follow a quadratic relationship around the conduction band minimum and valance band maximum energies. The curvature of this quadratic is inversely proportional to the effective mass. Integrating ASTM International (originally known as American Society for Testing and Materials) solar irradiance data and assuming 100% photon conversion efficiency leads to the maximum achievable solar-to-hydrogen conversion efficiency. Using the GW modeling result from above further allows us to model this maximum efficiency as a function of total pressure. The band gap of anatase at zero pressure was assumed to be 3.2 eV, corresponding to a maximum efficiency of about 3.7%.

Figure 28:
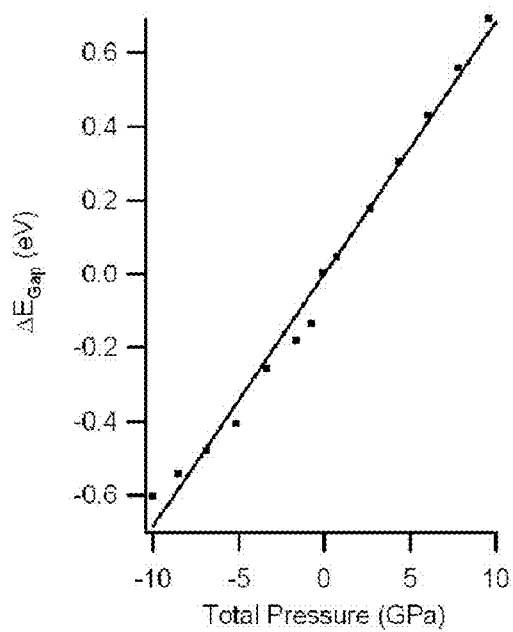
FIG. 28 is a graph showing the variation of the bandgap of anatase with applied pressure as calculated in the theoretical modeling described below.
Figure 29:
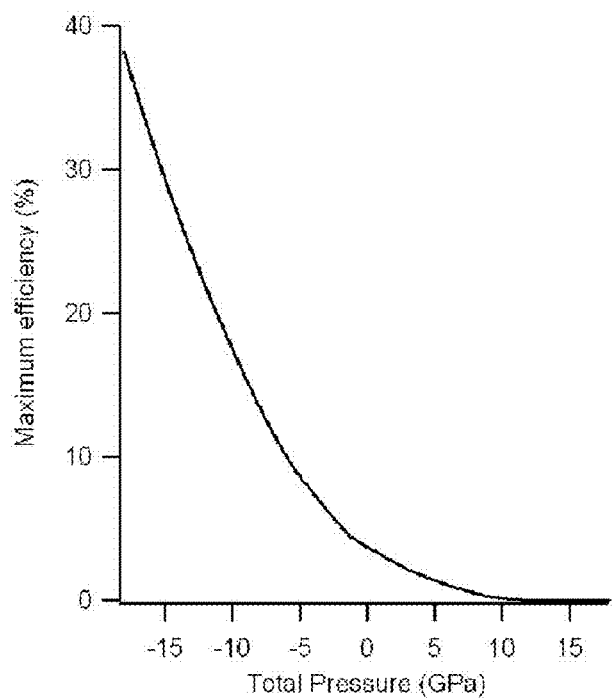
FIG. 29 is a graph showing the variation of efficiency of an anatase electrode with applied pressure resulting from the bandgap variation shown in FIG. 28.

FIG. 28 shows the change in bandgap $\Delta E_{Gap}$ with pressure derived from the GW approximation. The calculation indicates that the bandgap is expected to change linearly as a function of the applied pressure at a rate of 0.0686 eV/GPa. Thus, a pressure of about −10 GPa (a negative pressure denoting a material in tension) reduces the bandgap of anatase from 3.2 to about 2.5 eV. FIG. 29 shows the expected increase in photolytic efficiency resulting from the bandgap reductions with pressure shown in FIG. 28; it will be seen from FIG. 29 that negative pressure of about −10 GPa is expected to increase the efficiency of the electrode about five-fold, from about 3.7 percent to about 20 percent.

Figure 30A:
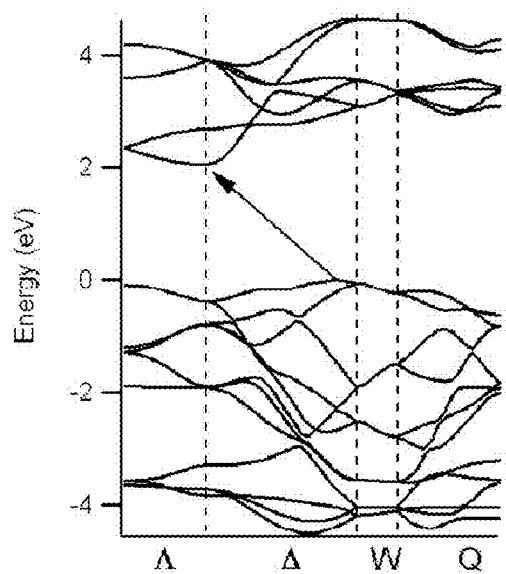
Figure 30B:
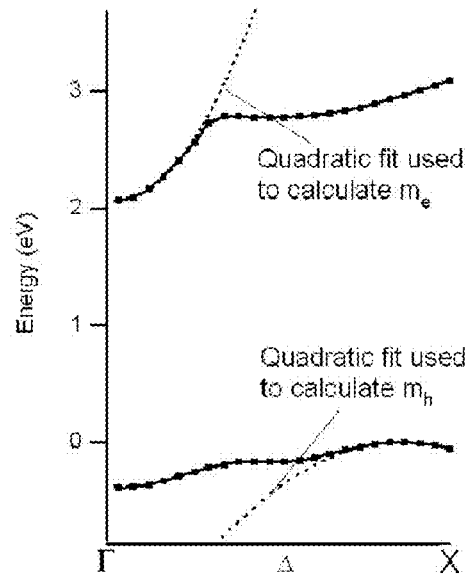
FIG. 30B shows an enlarged view of the portion of FIG. 30A indicated by the arrow therein and containing only the top of the valence band and the bottom of the conduction band, together with the quadratic fits used to calculate the effective mass of the charge carriers.

From the anatase structure, there can be derived the full band structure plot shown in FIG. 30A. FIG. 30B shows an enlarged view of the part of FIG. 30A indicated by the arrow, and shows only the top of the valance band and the bottom of the conduction band. FIG. 30B also shows the quadratic fits used to calculate the effective mass of the holes and electron charge carriers, denoted $m_h$ and $m_e$ respectively.

Figure 31:
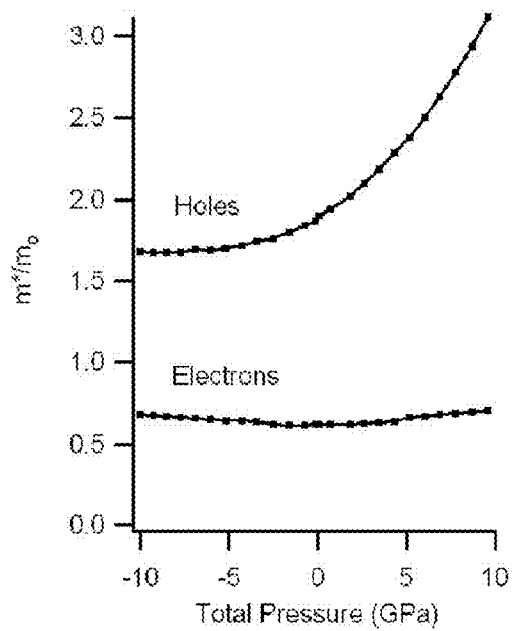
FIG. 31 is a graph showing the variation of the effective mass of the electrons and holes in anatase with pressure, as calculated from quadratic fits similar to those shown in FIG. 30A.
Figure 32:
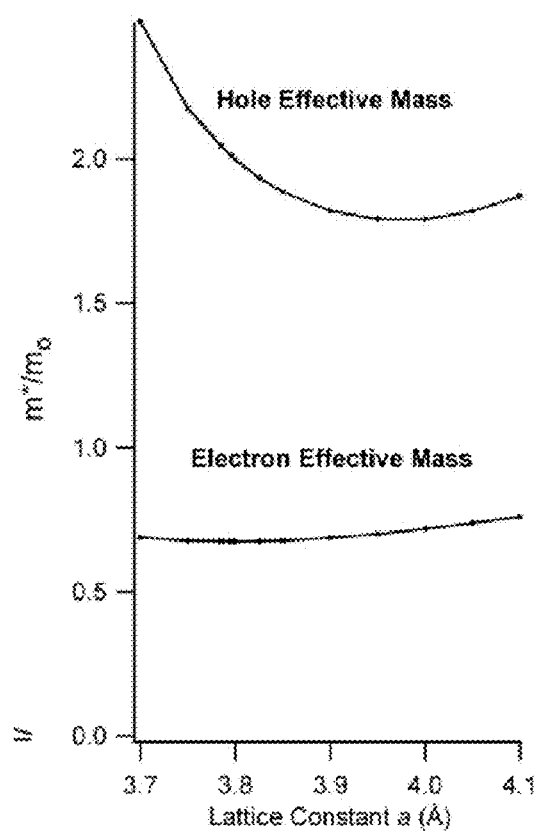
FIG. 32 is a graph showing the variation of the effective mass of the electrons and holes in anatase with lattice constant, as calculated from quadratic fits similar to those shown in FIG. 30A.

From plots such as those shown in FIG. 30B, the variation of the effective mass of the holes and electrons with applied pressure can be calculated, and the result is shown in FIG. 31 (FIG. 32 shows the results versus lattice constant; note that in FIG. 31 the total pressure is non-uniform to induce biaxial strain. From this Figure, it will be seen that (as expected) the effective mass of the electrons varies very little with pressure within the pressure region of practical interest, but the effective mass of the holes varies markedly with pressure. From FIG. 31, it will be seen that anatase subjected to negative pressures (i.e., placed until tensile stress) exhibits lowered effective mass of the holes. For reasons mentioned above, lowered effective mass of the charge conductors is desirable since it reduces recombination of electron-hole pairs, and thus further enhances the efficiency of the electrode.

The foregoing theoretical calculations can also show why titania formation, which is the second step of the present process, either by anodizing or thermal oxidation of metallic titanium normally results in titania having its bandgap shifted to higher values, corresponding to the ultra-violet portion of the spectrum. Both types of oxidation essentially force oxygen atoms into the metallic lattice, resulting in a lattice under compressive stress, with a consequently increased bandgap, requiring shorter wavelength radiation for photoactivity and essentially rendering the resulting titania useless for solar radiation based processes.

However, the first step of the present process is to wet etch the titanium substrate to form nanostructures of the desired geometric shape and size. These nanostructures form geometric boundaries that constrain the growth of the titania in the second step, thus giving rise to alternating regions of compression and tension in the resulting titania layer. The present invention is further to control this second step so that the final surface of the titania exposed to the electrolyte is in tension (strain). In this way, we are able to produce in a second step, by anodizing or heat oxidation of metallic titanium, titania having a bandgap shifted toward longer, visible wavelengths.

As previously discussed, the present invention provides nanostructures that are substantially hemispherical or hemi-cylindrical, as shown in the schematic cross-section in FIG. 33A, where one way of forming the nanostructured template for such geometry is the embossing and coating method shown in FIG. 6. FIG. 33C is a photomicrograph showing actual titania nanostructures that we formed in this way.

However, we have now found that higher aspect ratio nanostructures spaced from one another so that they are not touching produce much higher levels of strain in the subsequently formed titania layer, and so the bandgap is lowered substantially more than with the hemispherical structures. We have determined this experimentally by forming such structures as are seen in FIGS. 36A, 36B, 37A and 37B and measuring their bandgap.

Figure 33B:
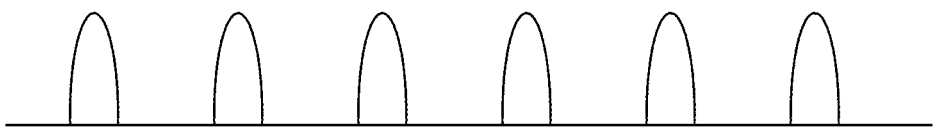
Figure 33C:
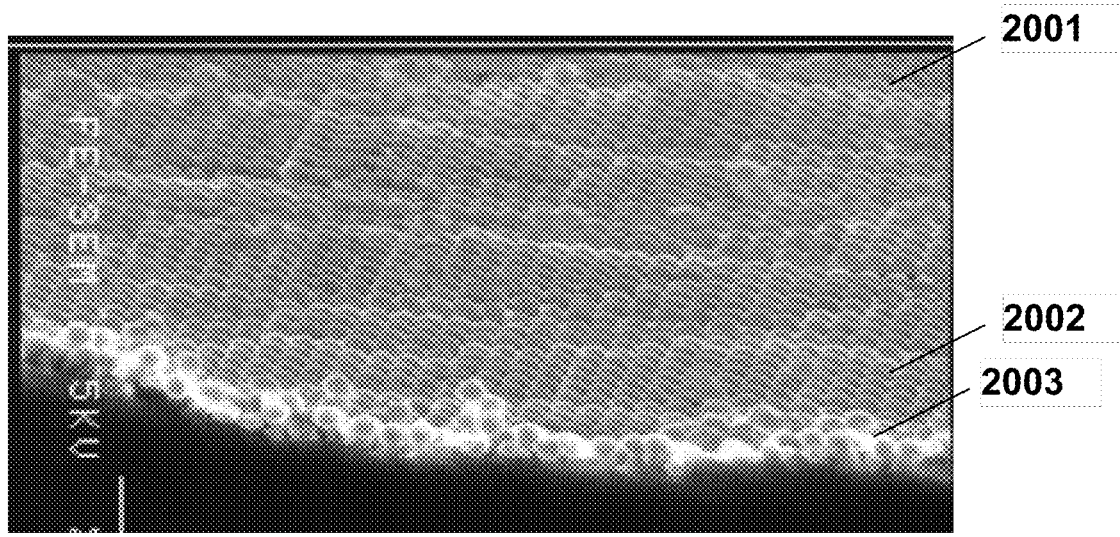
FIG. 33C is a scanning electron micrograph showing a section through titania coated on to a nano-hemispherical polycarbonate embossed template by the embossing and coating process shown in FIG. 6.

Further, we have used The Florida Object Oriented Process Simulator (FLOOPS) to calculate the actual strain levels in various structures including that shown in FIG. 33B. FLOOPS (release 2002 (see M. E. Law and S. Cea, Comp. Mater. Sci. 12, 289 (1998).)) is a finite element analysis tool for simulating many of the process steps typically employed for the development of silicon-based integrated circuit devices (Copyright Mark Law, University of Florida Electrical and Computer Engineering department). Of particular interest to us is the stress computation during simulation of the thermal oxidation of silicon. The thermal oxidation model described in B. E. Deal and S. Grove, J. Appl. Phys. 36, 3770 (1965) forms the basis of the FLOOPS simulation. Although this model was developed for the thermal oxidation of silicon, it can be applied to titanium for temperatures greater than 500° C. Titanium oxidizes at a much higher rate than silicon, but the functional time dependence is very similar. Therefore, adaptation of the model to simulate thermal oxidation of titanium is largely a change in the rate constants of the model. The stress computations in FLOOPS relate stress and strain through a viscoelastic constitutive equation. This is essentially achieved by modification of Hooke's law to include a temperature dependent viscosity, or damping, term. Hooke's law relates stress and strain by a stiffness matrix that is a function of the material crystal symmetry and mechanical properties (Young's modulus and Poisson's ratio). Simply changing the mechanical parameters from the default silicon and silicon dioxide values to the appropriate values for titanium and titanium dioxide provides a simple first order means to adapt stress computations to our system. Stress computations within the oxide layer are reported using a Young's modulus of 204.06 GPa and a Poisson's ratio of 0.31. To our knowledge there exists no reported experimental measurement of the Poisson's ratio(s) for the anatase polymorph of titania, but our results to date indicate that the stress computation is not strongly dependent on this parameter. The stress is reported as a total pressure by using the standard definition of averaging the longitudinal components (familiar extension and compression components of the stress matrix as opposed to shear terms).

Figure 34A:
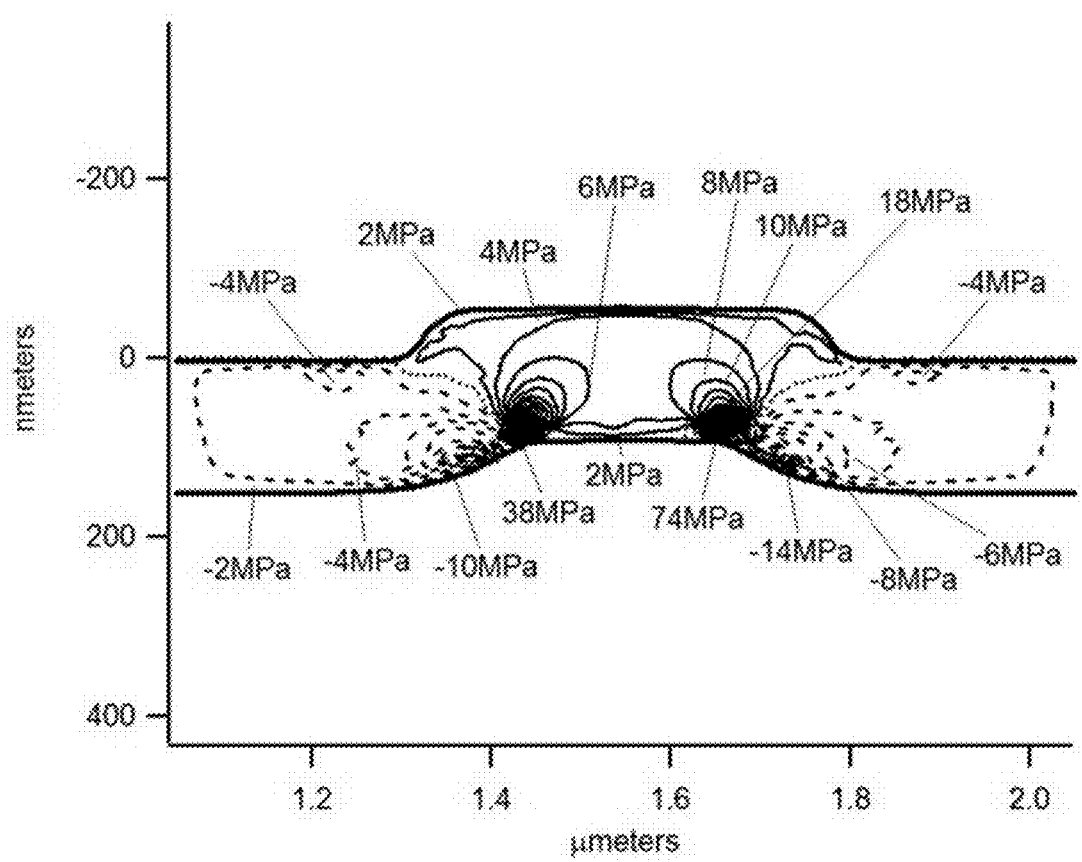
FIGS. 34A to 34D shows strain calculations and thermal oxide titania growth modeling obtained with FLOOPS.
Figure 34B:
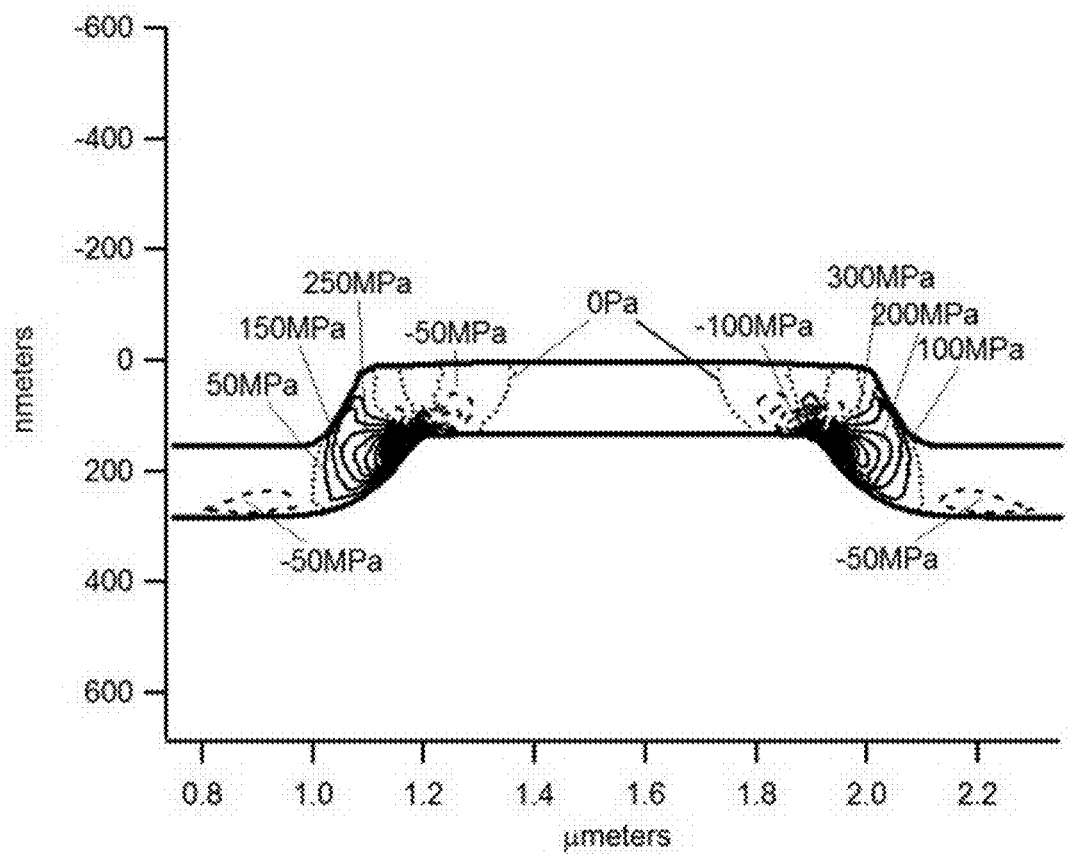
Figure 34C:
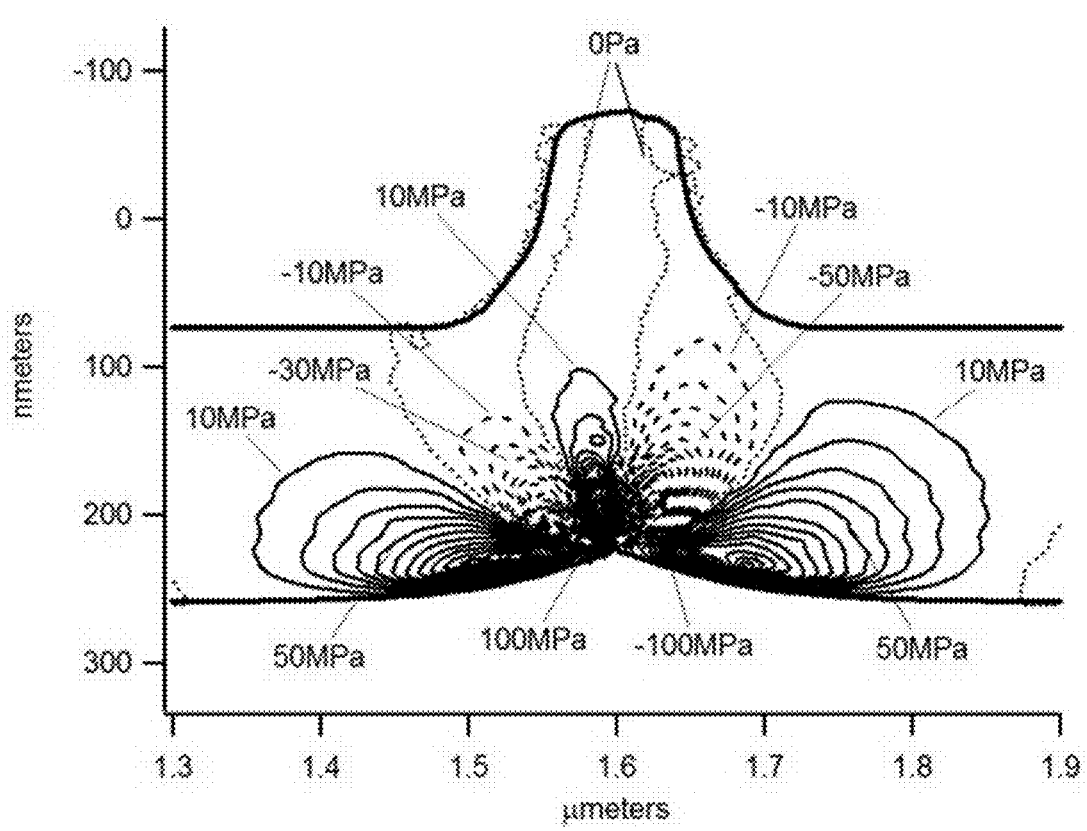
Figure 34D:
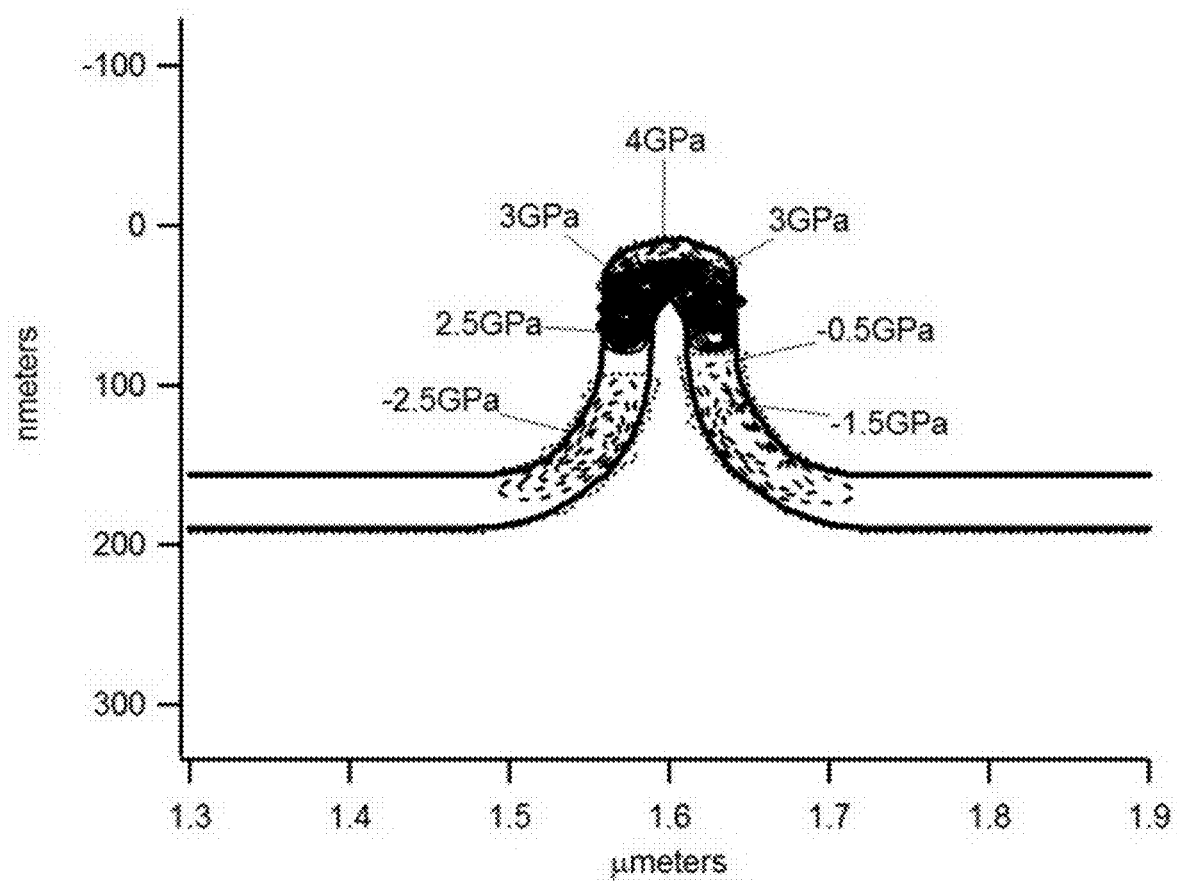

We simulated the thermal oxidation process using FLOOPS with the modifications to the mechanical parameters as described. Our investigation characterizes how non-planar geometric features on the titanium substrate introduce stress into the titania thin film formed during the thermal oxidation process. FIGS. 34A-34D show some key calculations. In particular, FIG. 34D shows a nanostructure that resulted from a 100 nm wide starting point, very similar to the nano-structures that have been produced experimentally. As expected, alternating regions of tension and compression are generally formed. Large tensile stress is typical around outer corners while compressive regions are characteristic of inner corners. As in FIG. 34D, substrates with small features in the range of 100 nm and short oxidation times are predicted to be highly stressed. Tensile stresses on the order of 4 GPa are seen near the apex of the structure. The stress is predicted to decrease dramatically as the film thickness increases and for features with low aspect ratio. Also, because the stress is concentrated around corners, or transitions, in the substrate, wider features will have fewer transitions and concomitantly less overall stress throughout the film. Final optimizations, including the introduction of periodicity, sharpness of the corners, and 3-dimensional hexagonal arrays are expected to further enhance the magnitude of the stress.

As already mentioned, the first step of this process is formation of nano-structures by wet etching of titanium metal, preferably in the form of a thin sheet, typically having a thickness in the range of about 0.07 to 0.5 mm. Since only a small depth of the titanium surface is converted to photoactive titania on the titanium electrode, an excessively thick sheet wastes titanium metal; however, too thin a sheet may be easily damaged during processing and is more costly due to the extended rolling process required to make it thin. As discussed in more detail below, the presently preferred commercial titanium film is 0.25 mm thick.

Figure 35:
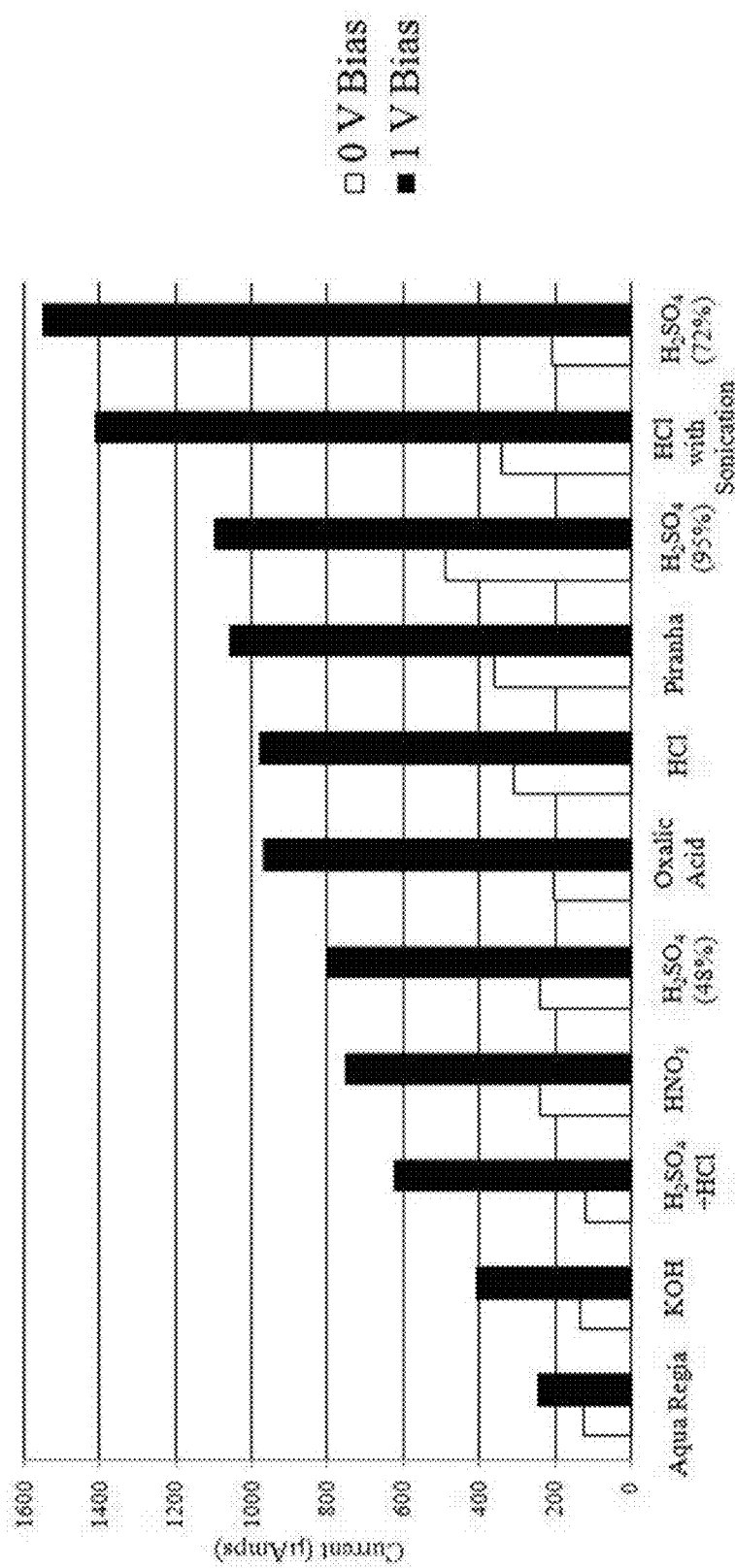
FIG. 35 is a bar graph comparing the performances of titania photocatalysts prepared using various different etchants in the etching step.

The goal of the wet etching is to produce in the titanium sheet nano-structures having these desired features: mean diameter of about 100 nm, high aspect ratio of at least 1:1, and some space between adjacent nano-structures. Further, it is desired to have a tight distribution of sizes. The acid etching may, so far as is presently known, be effected using any strong acid capable of rapidly etching titanium metal, although obviously acids which deposit insoluble titanium salts of the film should be avoided. FIG. 35 is a bar chart showing the photocurrent at zero volts bias (black outlined white bars) and at 1 volt bias (black filled bars). All samples were Grade 1 titanium and were all heat oxidized in the same way, but were first etched in various etching acid solutions as indicated. Because it yields the highest photocurrent (i.e., hydrogen production) at 1 volt bias with good photocurrent at zero volts bias, the presently preferred acid is sulfuric acid, which may be used at concentrations above about 93 percent, and preferably in the range of about 93 to about 98 percent. The sulfuric acid etch may be carried out at a temperature in the range of about 60 to about 100° C., and preferably about 75 to about 85° C. To ensure accurate control of the etching process, the process should be carried out for a predetermined period beginning with the onset of active etching as indicated by visible bubble formation. The optimum etching period for any particular combination of etchant type and concentration, temperature and specific titanium film may readily be determined empirically, but etching times will typically be in the range of about 60 to 600 seconds. In the presently preferred etching process, sulfuric acid is used for etching at a concentration of temperature of 93 to 98 percent at 80° C. for 210 seconds from the onset of bubble formation.

It is generally preferred to avoid the use of hydrochloric acid in the wet etching step. Although hydrochloric acid produces satisfactory nano-structures and, as can be seen in the bar chart in FIG. 35, good resulting photocurrent as well, it leaves the titanium surface blackened due to the formation of a titanium hydride layer, which should be removed prior to anodization or heat oxidation since it interferes with formation of an oxide layer, and reduces adhesion of the oxide layer to the underlying titanium metal. Although the hydride layer can readily be removed by etching with the sulfuric acid, the resultant two-step process is unnecessarily complex as compared with the preferred one step sulfuric acid etch. It is also possible to form the hydride layer with sulfuric acid, but the resulting layer is either dissolved subsequently by the same sulfuric acid, or is easily wiped off Therefore, our preferred embodiment is to use the sulfuric acid etch as described above, with other satisfactory etchants including the "Piranha" solution, oxalic acid, weaker sulfuric acid such as 48% concentration, and even nitric acid. However, potassium hydroxide and Aqua Regia gave unfavorable photocurrent results.

Hitherto, it seems to have been assumed that very pure titanium was required for the formation of high efficiency titania photoactive electrodes. The present inventors have found this not only to be untrue, but that "commercially pure" forms of titanium metal are preferred for use in the etching and titania forming processes of the present invention because they react with the etchant to naturally give rise to the desired spacing between the nanostructures as illustrated in FIG. 33B and imaged in FIGS. 36A, 36B, 37A, and 37B. However, of the commercially pure grades, only Grade 1 titanium having the following specification by weight:

C 0.1% maximum
Fe 0.2% maximum
H 0.015% maximum
N 0.03% maximum
O 0.18% maximum
Ti 99.5% minimum, up to about 99.6% or "Grade 2 titanium", which are orders of magnitude less costly than pure titanium, give the desired results. Grade 2, which is available commercially from a variety of suppliers is defined (see for example ASTM B863-06a) as meeting the following specification by weight:

C 0.1% maximum
Fe 0.3% maximum
H 0.015% maximum
N 0.03% maximum
O 0.25% maximum
Ti 99.2% minimum, up to about 99.6%

It appears that the impurities in Grade 1 or Grade 2 titanium actually improve the formation of nano-structures during acid etching because the impurities work with the etching process to create lands between the nano-structures that were not attainable with pure titanium foil, which in turn increases stress and pushes the bandgap edge further into the visible. In addition, the aspect ratio of the nano-structures is much improved, being taller than they are wide, with a nearly triangular cross section. Achieving such desired structures with pure titanium foil, and with any other process, would be very difficult, very costly, or would not lend itself to mass manufacturing. Furthermore, the electrodes produced by the second process of the present invention are expected to have a lifetime of decades, and this second process is less costly and has lower energy requirements than prior art processes.

The differences between the types of nano-structures produced by the first and second processes of the present invention for production of photoactive electrodes are illustrated in FIGS. 33A and 33B. FIG. 33A shows a typical profile of a titania layer formed by deposition on to a shaped substrate having a continuous series of hemicylindrical ridges. The nano-structures are substantially hemicylindrical with no gaps between adjacent ridges. In contrast, FIG. 33B shows a typical profile of a titania layer formed by the acid etching/oxidation second process of the invention. The nano-structures have the form of narrow high aspect ratio, even triangular prisms in some cases, separated by wide lands (scanning electron micrographs of such actual structures are seen in FIGS. 36A, 36B, 37A and 37B).

As discussed, the presently preferred titanium film for use in the first and second processes of the invention is the Grade 1 titanium that is also sold as "99.5% purity annealed titanium foil" 0.25 mm thick by Alfa Aesar, 26 Parkridge Road, Ward Hill Mass. 01835 under Stock No. 10385. Both Grade 1 and Grade 2 foils were also obtained from Allegheny Technologies Incorporated, 1000 Six PPG Place, Pittsburgh, Pa. 15222-5479.

As in many other etching processes, to achieve consistent results in the etching step of the second process of the invention, it is necessary to ensure that the titanium surface is clean and free from grease and other materials which might hinder the etching process. The preferred procedure for ensuring a clean titanium surface is, in this order, a soap and water scrub, an acetone soak, a methanol soak and a distilled water rinse. Ultrasonic cleaning is also used in this procedure.

Figure 36A:
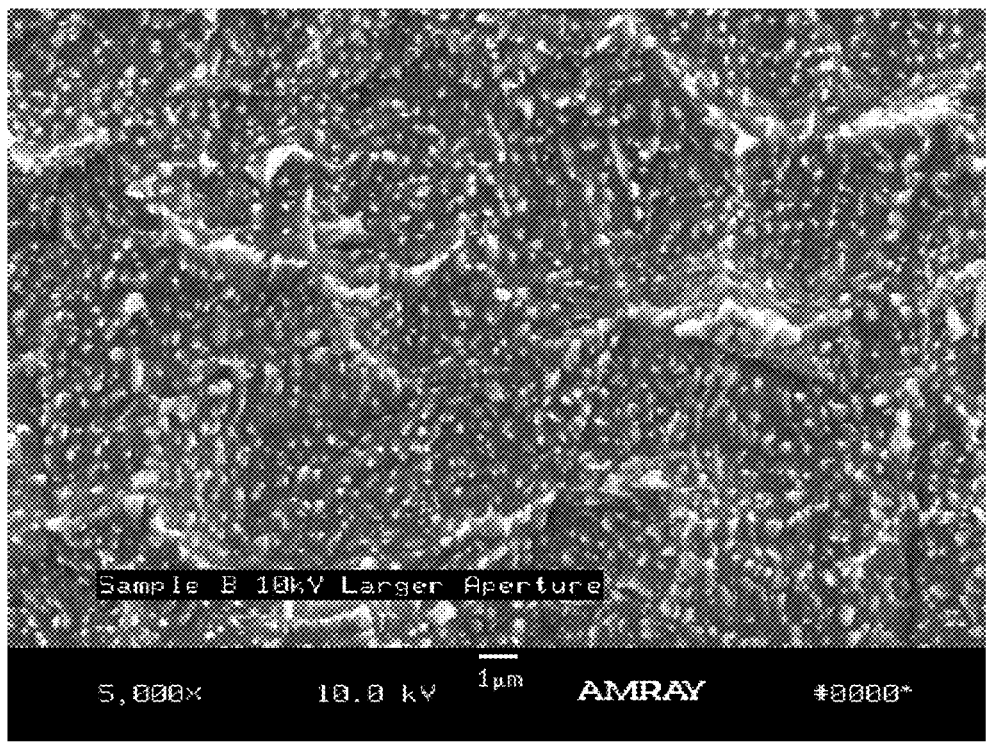
FIGS. 36A and 36B are scanning electron micrographs of nanostructures obtained in the process of the present invention.
Figure 36B:
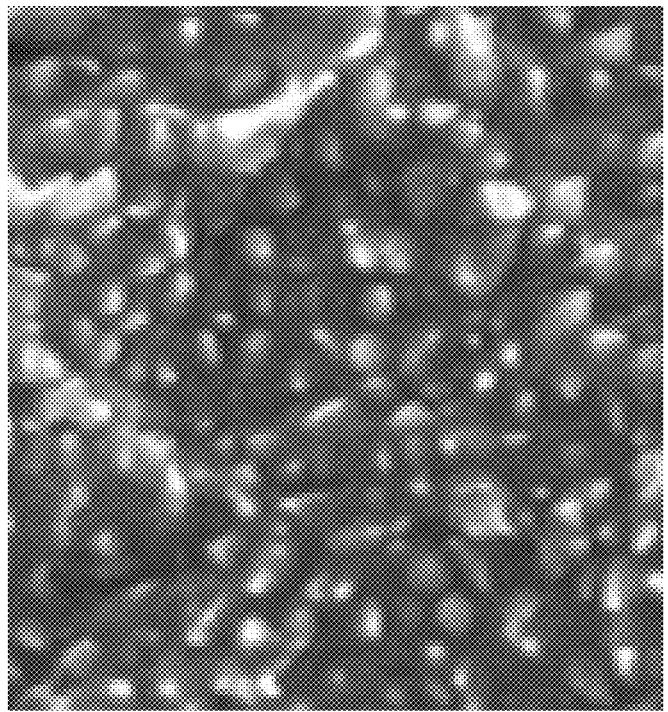
Figure 37A:
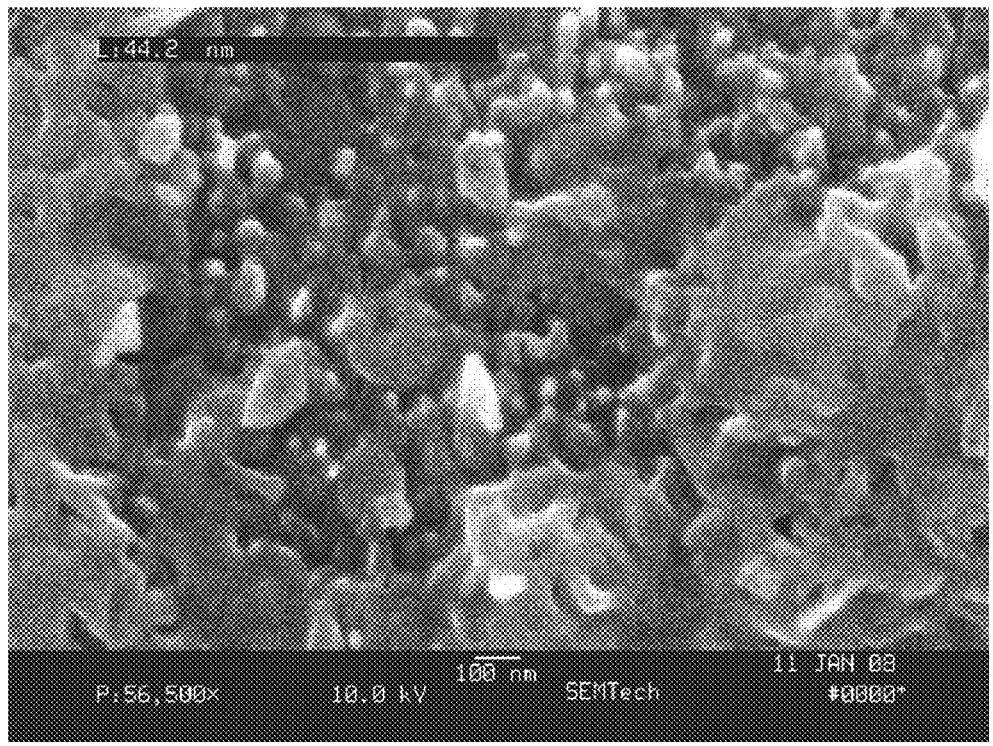
FIGS. 37A and 37B are scanning electron micrographs of nanostructures obtained in the process of the present invention but using a different etching medium from that used to prepare the nanostructures shown in FIGS. 36A-36B.
Figure 37B:
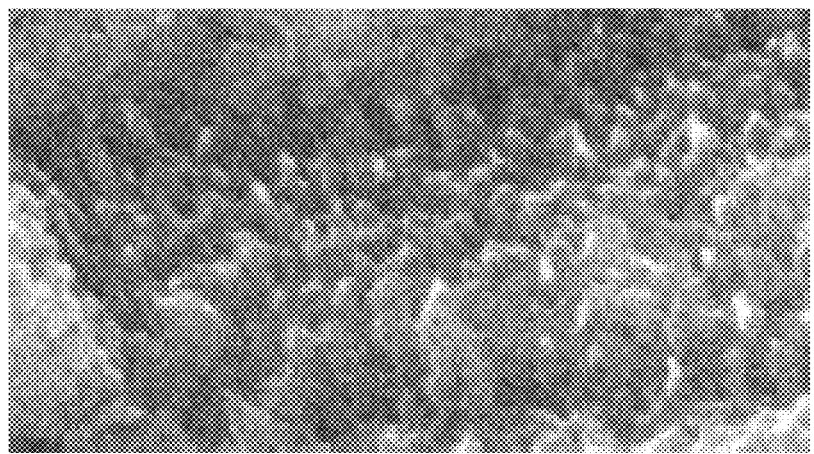

FIG. 35 compares the peak photocurrent, which indicates peak hydrogen production, for titania electrodes produced using several different etching compositions. The photocurrent is shown at zero bias voltage as well as 1 volt bias (direct current) for each recipe. All etching was performed at the optimum temperature and time for that particular etchant, which is typically 80° C. and about 3 minutes for sulfuric acid and 10-15 for hydrochloric acid; the second step of thermal oxidation was constant for all of the samples. It can be seen from FIG. 35 that the best performance is obtained with a sulfuric acid etch at 72% concentration, with the sample etched with hydrochloric acid a close second at 1 VDC bias but better at 0 VDC bias. It is important to ultrasonically clean the hydrochloric acid-etched substrate to obtain best results. Other good etching compositions include etching with sulfuric at 95% concentration, Pirhana etch, and hydrochloric and oxalic acid etches without sonification. FIGS. 36A and 36B show the resulting nanostructures with the sulfuric acid etch, and FIGS. 37A and 37B show the resulting nanostructures with the hydrochloric acid etch. It is important to note that obtaining these particular structures is not random but is the result of substantial empirical work, as it is quite easy to produce nano-tubes and other structures that do not work in the second step of the process of the present invention.

Figure 38:
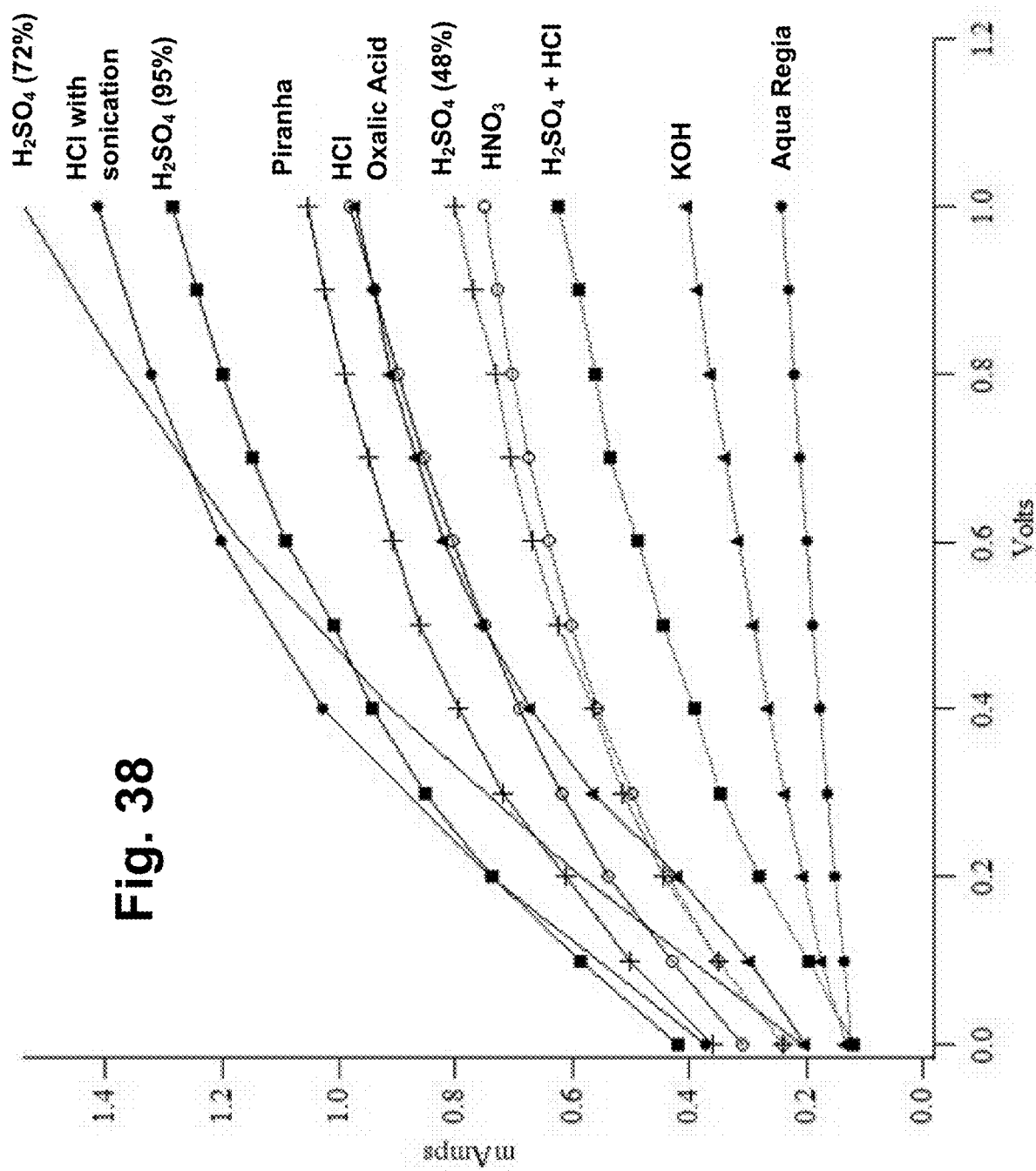
FIG. 38 shows current-voltage curves for the experimental samples graphed in FIG. 22.

FIG. 38 shows the complete IV curves, or current versus voltage plots, for each of the etching compositions used in FIG. 35.

The second step of the second process of the present invention is, as already mentioned, at least partial conversion of the titanium film to titania, desirably by a process which ensures at least a significant proportion of the anatase form of titania. This conversion of titanium to titania may be effected by anodizing (i.e., making the titanium the anode in an acid solution) or by oxidation. Although thermal oxidation is presently preferred, the anodizing process is useful in applications where the nano-structured substrate cannot be made heat resistant enough to withstand the thermal oxidation process, and the anodizing process will be described first.

Although electrochemical anodizing of titanium metal to form titania coatings is known, the form of titania produced is typically not the anatase photoactive form. Therefore, in the prior art a titania layer has been formed by anodizing, and then heated to form anatase. This process cannot be carried out on many substrates, and is very energy-consuming. It has now been found that anodizing can produces significant anatase in the resultant titania film, as verified with X-ray diffraction analysis, while not exceeding 80° C.

Although, as in the acid etching step, any acid capable of anodizing titanium metal may be used, the preferred acid is sulfuric acid, used at a dilution such that the pH is in the range of about 1.5 to about 2.5, and preferably about 2. The anodizing may be carried out at a temperature about 60 to about 100° C. and preferably about 80° C. Satisfactory anodization typically requires the use of a voltage in the range of about 70 to about 100 Volts. A voltage of this order is not a problem when anodizing the surface of thick titanium samples. However, for some applications for this invention, such as air or water purification, it is preferred to apply a thin coating or film of titanium to a nano-structured substrate. This is because the large areas required for lining air ducts, for example, for air purification would be cost-prohibitive even using Grade 1 or Grade 2 titanium foils. On the other hand, the roll-to-roll manufacturing process can economically coat a web of polycarbonate with a thin film of titanium in a box vacuum coater. That titanium coated substrate can then be run through an anodizing bath to effect the titania film atop the titanium base film. When that substrate is polycarbonate, for example, or other electrically insulating and non-heat resistant substrate, anodizing this preferred thin titanium film with the present process often damaged the substrate by resistance heating and/or arcing during anodizing, the heat from which in turn would damage the substrate (cracking glass substrates or melting polycarbonate substrates). It was found that damage to thin films caused by arcing or other undesirable effects caused by rapid voltage changes could be avoided by ramping the voltage to its final value, rather than increasing the voltage stepwise. Alternatively, a short power ramped step could be followed by a longer duration voltage ramped step. An optimum voltage ramp followed the formula:

$$V = V_{Final}(1-e^{-at})$$

where a is an arbitrary constant.

The presently preferred anodizing step uses a voltage ramp of this type with:

$V_{Final}$=80 Volts a=0.4 total time=1 hour.

The electrolyte was dilute sulfuric acid, pH 2.0 at 80 degrees C. $V_{Final}$ equal to 80 Volts was optimum, but a range between 70-95 Volts resulted in samples not significantly lower in quality for use as photoactive electrodes. Above 90 Volts, the "a" parameter was typically reduced to 0.05 to slow down the voltage rise time to prevent current limitation with the power supply used, which was a KEPCO ATE 150-7M power supply (available from Kepco, Inc. 131-38 Sanford Avenue, Flushing N.Y. 11355).

Substrate pretreatment was found to have only a minor impact on the final topography of the anodized films. AFM (Atomic Force Microscopy) results indicated that the final surface looked nearly identical regardless of pretreatment, whether etching, mechanical polishing, or electro-polishing. (The mechanical polishing and electro-polishing in this case were not alternatives to acid etching for forming the nanostructures, but were rather included as an experimental control, which was a smooth surface). Nevertheless, the substrate pretreatment did improve the band-gap shift for this application by shifting it into the visible.

Figure 39A:
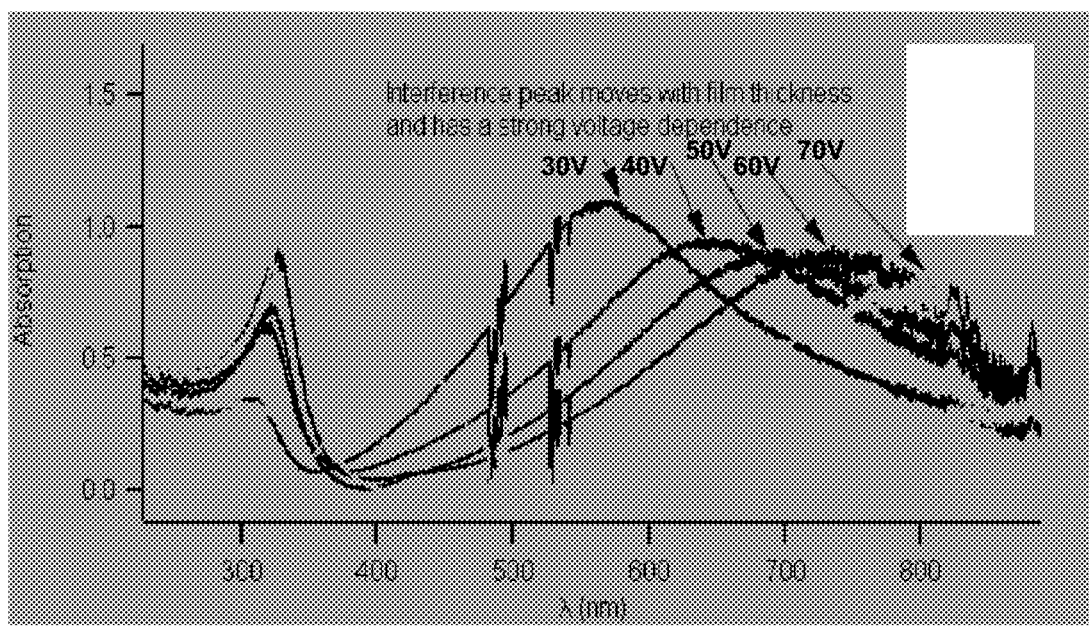
FIG. 39A is a graph showing the change in absorption over the range of 250 to 900 nm with anodizing at varying voltages of a titanium film.
Figure 39B:
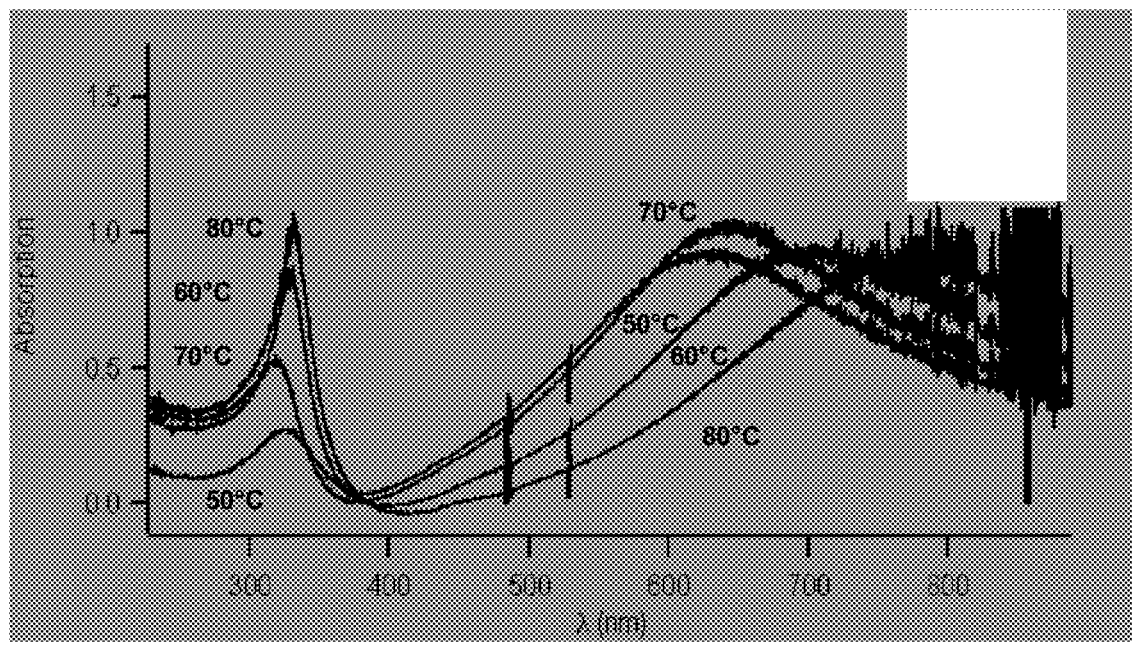
FIG. 39B is a graph similar to that of FIG. 39A but showing the change in absorption at varying anodizing temperatures.
Figure 40:
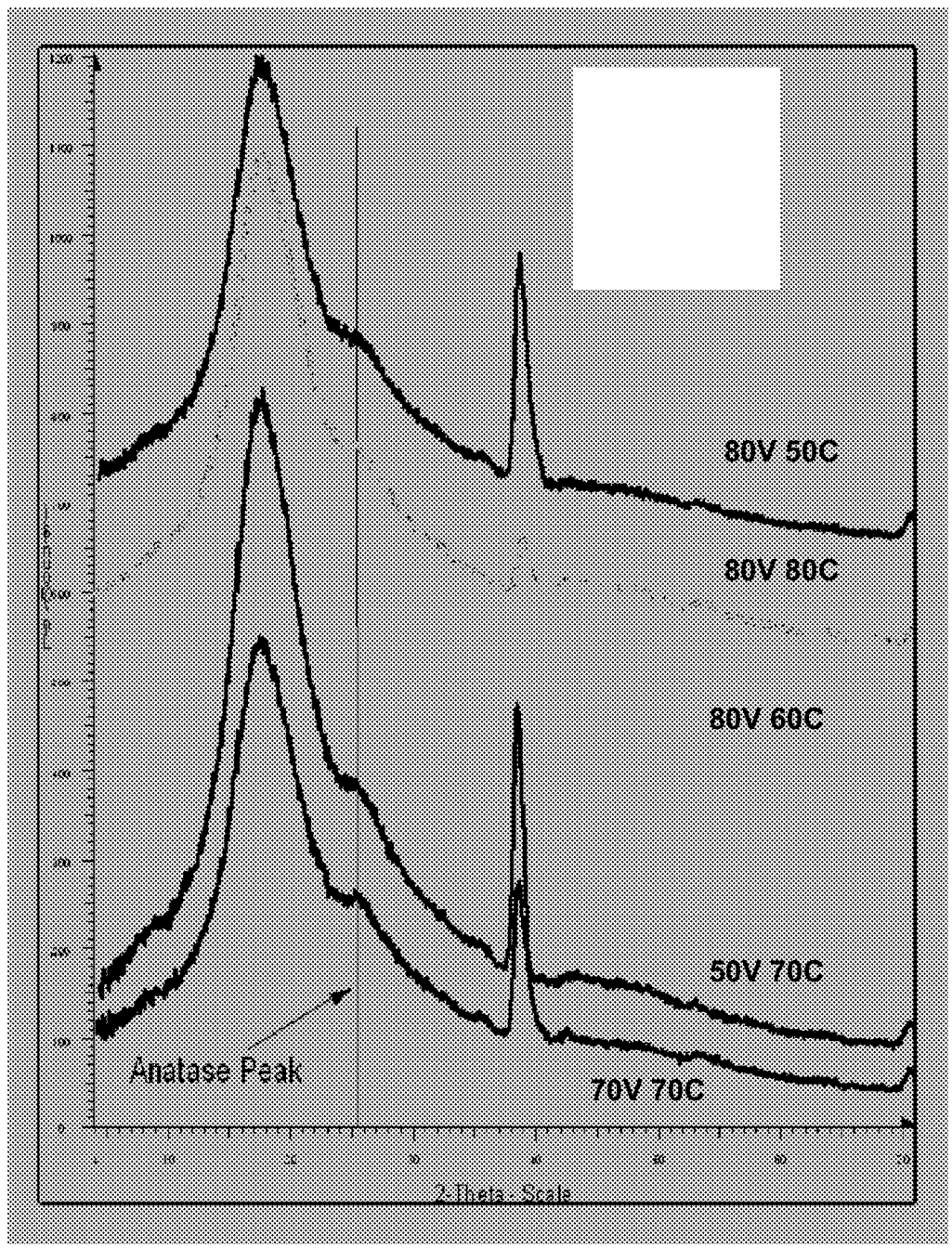
FIG. 40 is a graph showing the growth of the anatase peak with varying combinations of anodizing voltage and temperature.

The effects of anodizing temperature and voltage are illustrated in FIGS. 39, 40 and 41. The aforementioned Alfa Aesar titanium films were acid etched using the preferred sulfuric acid etch described above, and were then anodized using the preferred sulfuric acid medium and ramped operating voltage, but with varying final voltages. The optical absorption of each film was then measured over the range of 250 to 900 nm. FIG. 39A shows the results obtained using final voltages of 30, 40, 50, 60, 70 and 80 V, all at a temperature of 70° C. FIG. 39B shows the results obtained using temperatures of 50, 60, 70 and 80° C., all at a final voltage of 80 V. From FIG. 39A, it will be seen that as the final voltage is increased, the absorption interference peak, which depends upon the thickness of the titania film produced by anodizing, increases in height and shifts to shorter wavelengths. Similarly, FIG. 39B shows that as the temperature increases the absorption interference peak increases in height and shifts to shorter wavelengths. The resultant ability to control the absorption peak by control of the temperature and final voltage of anodizing allow fine tuning of the absorption peak to coincide with the bandgap of the titania produced by anodization, thus improving the efficiency of the photoactive electrode.

FIG. 40 shows X-ray diffraction patterns of titanium films anodized at various temperatures and voltages as noted in the Figure; the anatase peak (or rather shoulder) is marked. FIG. 40 indicates that the amount of anatase produced increases with increases in anodizing temperature and voltage.

Figure 41A:
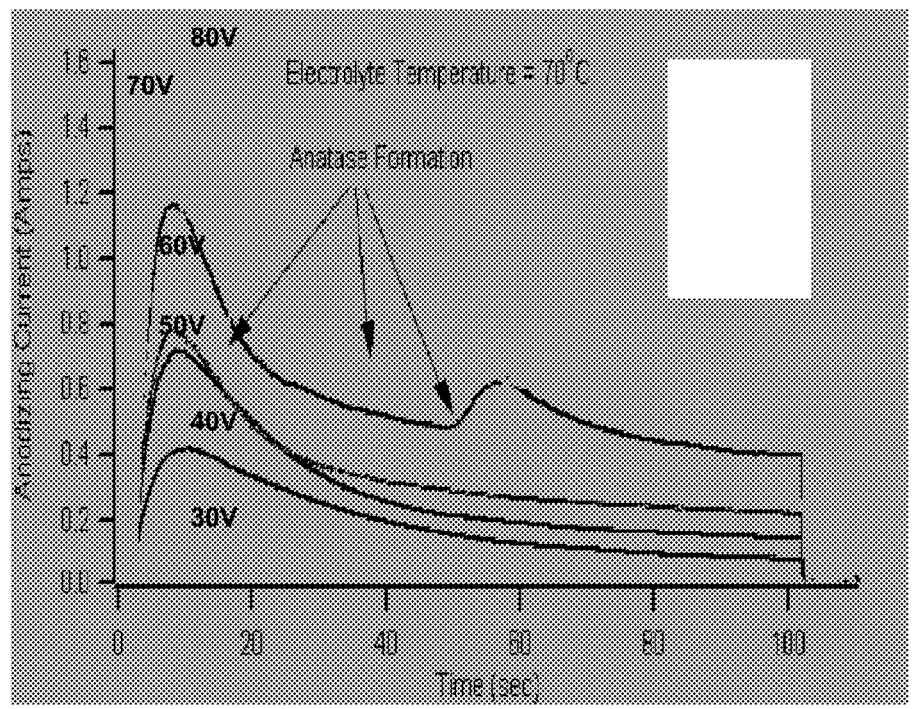
FIG. 41A is a graph showing the onset of anatase formation at varying voltages of a titanium film.
Figure 41B:
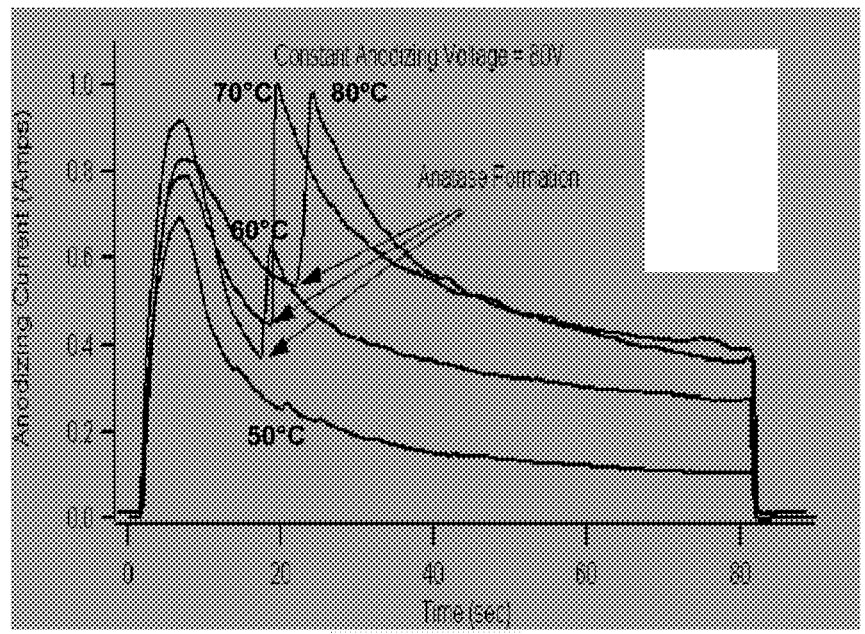
FIG. 41B is a graph similar to that of FIG. 41A but showing the onset of anatase formation at varying anodizing temperatures.

FIGS. 41A and 41B are graphs showing the variation of anodizing current with time for (in FIG. 41A) a constant electrolyte temperature of 70° C. and various applied voltages, and (in FIG. 41B) a constant voltage of 80 V and various electrolyte temperatures. The onset of anatase formation is indicated by a sudden increase in anodizing current, and is marked by the arrows in FIGS. 41A and 41B. FIG. 41A shows no anatase formation at 30, 40 and 50 V, and shows that at higher voltages the onset of anatase formation begins more quickly the higher the applied voltage. FIG. 41B shows no anatase formation at 50° C., and that at higher temperatures anatase formation begins more slowly with increasing temperature.

Finally, FIG. 42 shows X-ray diffraction scans of two different anodized films. All three scans confirm that both titanium metal and anatase is present in the anodized films.

As already indicated, the preferred anodizing process requires a complicated, asymptotic voltage against time profile, and to enable such a profile to be followed accurately, a software-controlled interface has been developed that that allows a conventional power supply, such as the aforementioned KEPCO ATE 150-7M power supply, to output arbitrary voltage or current waveforms. The waveforms may be designed by the user through a library of adjustable waveforms or via imported data files. The complete system allows arbitrary voltage or current waveforms to be applied to loads that require more power than commercially available arbitrary waveform generators can generally produce. Software control of the anodizing waveform is needed for two reasons:

1. The power required to produce the anodizing voltage (or current) increases proportionally with the area of the titanium to be anodized. It is desirable to retain the flexibility of arbitrary waveform generation when the load draws high power. Typically, arbitrary waveform generators are not designed for high power applications.
2. Process repeatability is enhanced through software control. It is desirable to create a system capable of reproducing the timing and magnitude of the anodizing waveform to a degree of accuracy that is more sensitive than the dynamics within the anodizing cell. Therefore, the user can be confident that different samples are produced with anodizing waveforms that are virtually identical.

Before these goals were met, the anodizing process was limited by the use of a DC power supply that could produce only constant voltage or current outputs. The optimization of the anodizing waveform was therefore restricted to the magnitude and duration of a square pulse. To achieve these goals, two commercially available instruments were integrated through custom software written in Igor Pro. The first component was the aforementioned KEPCO ATE-7M power supply equipped with controllable output by two analog voltage inputs. The second component was a Stanford Research Systems model SR830 lock-in amplifier, the auxiliary outputs of which were used to supply control voltage inputs to the power supply. The SR 830 is completely controllable via a GPIB (General Purpose Interface Bus) interface to a computer with controlling software. The complete system is therefore IGOR Pro software (WaveMetrics, Inc., 10200 SW Nimbus Ave., Suite G-7, Portland, Oreg. 97223) that controls the lock-in amplifier, that in turn controls the KEPCO power supply that produces the system output. The KEPCO power supply is rated for a maximum output of 1050 Watts at 150 volts and seven amperes, which comfortably exceeds the power required for the anodizing application. Additionally, the controllable output achieves the arbitrary waveform generation requirement. The auxiliary voltage outputs of the lock-in amplifier are software controllable to 1 mV. When controlled by an external voltage source, the KEPCO operates as an inverting amplifier with a gain of 15; the magnitude of the system output is then controllable to 15 mV. The speed of lock-in amplifier response to control commands, although not explicitly specified, exceeds the rates at which the commands can be sent. Timing of the control waveform is then limited by the computer processor, which executes the timing loops of the IGOR code. These specifications for accuracy of the output waveform meet the reproducibility objective stated earlier.

The IGOR Pro code serves as the main controller of the system output in two respects. The background tasks of the code manage the GPIB communication with the lock-in amplifier, making the code responsible for the magnitude and timing accuracy of the system output. Secondly, two user-friendly GUIs (Graphic User Interfaces) allow the generation of arbitrary waveforms for the system output. The program provides a library of waveforms that the user can appropriately alter to produce nearly any desired waveform through a piecewise concatenation process. Use of standard Igor data importing capabilities can be used as an additional source for waveforms that have been recorded to file. The overall system behaves similarly to a commercially available arbitrary waveform generator. However, it is unique in its output capabilities that are tailored to anodizing systems. The complete system provides a highly versatile, yet simple, environment for anodizing experimentation. Anodizing systems generally require higher power than is available directly from a waveform generator. By controlling the output of a KEPCO DC power supply, high frequency performance is sacrificed to gain much higher output power.

The software that generates the anodizing waveforms has unique features. The library of adjustable waveforms may be expanded programmatically to include additional waveforms that are of specific interest to anodizing systems. In addition, since the software is customized for this system, the output waveform may be automatically scaled to serve as proper control input signals for the KEPCO ATE supply. Testing the system accuracy is a simple matter of comparing the desired output to the real output. The real output is recorded by an oscilloscope or chart recorder and loaded into the Igor software. Visual inspection is generally adequate to determine if the output matches the input. The known sources of error include:

1. Timing errors from software; the main challenge of the software is to properly manage the delay between points (dt) of the output waveform. The minimum dt limits the highest frequency of the waveform achievable at the output. The output accuracy degrades as the waveform frequency increases, and manifests itself as output that appears discretized.
2. Hardware limitations; as described previously, the voltage magnitude is controllable to within 15 mV due to the 1 mV accuracy of the SR830 voltage source. Other sources of error are due to limitations of the power supply. These errors are typically negligible but may be noticeable for large step changes in voltage due to the finite response time of the supply. The power supply may be configured to have a faster response time, but the output will be more oscillatory.

Figure 43:
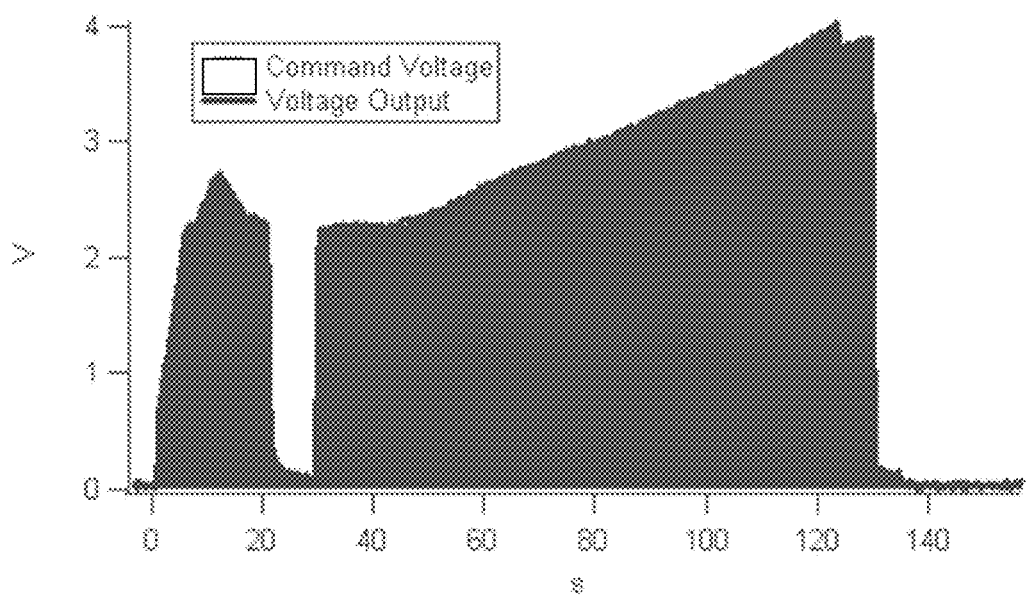
FIG. 43 shows the command voltage and the actual voltage output achieved during an anodizing process of the invention using the preferred voltage control apparatus and power supply described below.

The accuracy of the voltage control which can be achieved with the preferred system described above can be seen from FIG. 43, in which the blue line represents the (complex) recorded voltage waveform of successful anodization process derived empirically and recorded on a computer-based chart recorder, while the red area represent the results of using the same waveform to drive the preferred system described above and measuring the output of the power supply during an anodizing process. It will be seen that the original waveform and the final controlled output are identical.

Preferred processes for heat oxidation of acid etched titanium films to titania films containing anatase will now be described. One problem with heat oxidation of titanium films is that the desired anatase crystal form begins to form at about 450° C. in air, but at this temperature the rate of oxidation is too low to be practically useful. At about 700° C., the rate of oxidation becomes rapid enough for large scale production processes, but the rutile crystal form typically predominates. However, it has now been found that titania films, containing a sufficient proportion of anatase to act as efficient photoactive catalysts, can be produced by heating acid etched titanium films in air, with or without added oxygen, to about 700° C. for a relatively brief period of less than about 1 hour, and desirably in the range of about 20 to about 45 minutes; the optimum heating period appears to be typically about 30 to about 35 minutes, which results in good anatase formation. Excessive heating times tend to lead to a high proportion of the undesirable rutile crystal form. It has been found that heating to about 700° C. for a relatively brief period produces photoactive electrodes with high efficiency and long operating lifetimes. The process is highly versatile, allowing formation of titania films containing varying proportions of amorphous titania, anatase and rutile. The quality of the titania films produced is more sensitive to variations in the acid etching step and the heat oxidation step than is the case where acid etching is followed by anodization.

Such heating of acid etched titanium films will typically be carried out in a furnace; one furnace which has been found to give good results is a Barnstead Thermoline Model FB1315M, available form Barnstead International, 2555 Kerper Boulevard, Dubuque Iowa 52001-1478. A tubular furnace may alternatively be used. It is desirable that the furnace be modified to allow gases, such as nitrogen and oxygen to be introduced into the heating chamber of the furnace. The temperature and the time of heating have the most significant impact on the quality of the final photoactive electrode, and electrode quality is highly sensitive to these variables.

Figure 44:
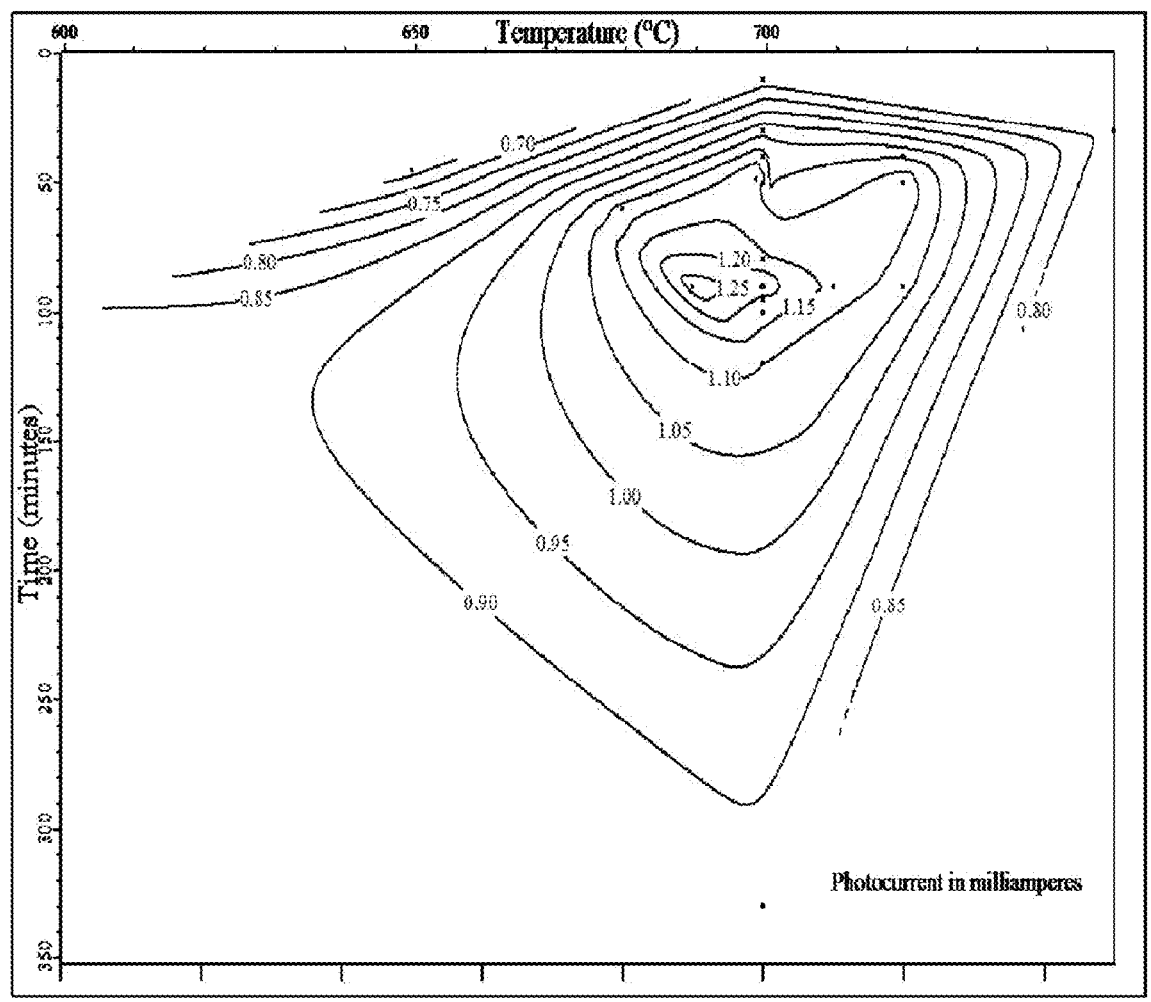
FIG. 44 is a three-dimensional graph showing the variation of photocurrent obtained from titania electrodes of the present invention as a function of the time and temperature of the thermal oxidation step of the process used to prepare the titania electrodes.

Typically, the acid etched titanium film is introduced into the furnace at a temperature lower than the actual heat treatment temperature of 690° C.; for example, the films may be added to the furnace at 500° C. The furnace temperature is then raised to the actual heat treatment temperature; the titania films produced do not appear to be very sensitive to either the temperature at which the titanium films are introduced to the furnace or the rate at which the furnace temperature is raised. Timing of the heat treatment begins only after the furnace has reached the desired heat treatment temperature. For small films of 1.5 cm by 2.5 cm, the air within the furnace provides sufficient oxygen for titania formation but with larger films, such as a coil of a 6 cm by 100 cm strip, it is desirable to introduce additional oxygen into the furnace to ensure that there is enough oxygen to form the desired thickness, uniformity and stoichiometry of the titania layer. It has been found that, in the case of the preferred commercial furnace mentioned above, introducing oxygen at a rate of 5 standard cubic feet per hour (about 142 liters per hour) provides enough oxygen to ensure proper titania formation. FIG. 31 shows that the highest photocurrent is obtained with the peak temperature at 690° C. for 90 minutes. However, since a decrease in peak photocurrent by even 25% is still commercially viable, the contour in FIG. 44 corresponding to 0.9 mA shows that the temperature can be 635 to 735° C. at corresponding times of 135 minutes to 40 minutes respectively. Allowing for a decrease in peak photocurrent of 33% to 0.8 mA includes times as short as 10 minutes at 700° C. and temperatures as high as 745° C. for 30 minutes. The full range of acceptable or commercially viable recipes of time versus temperature are shown in FIG. 44.

After the heat treatment, the films can simply be removed from the oven and allowed to stand in air to cool to ambient temperature. The rate of cooling has not been shown to have any measurable effect on the quality or efficiency of the final photoactive electrodes.

Example 1

This Example illustrates the effects of illumination conditions, bias voltage and temperature on the efficiency of hydrogen production and conversion efficiency of an apparatus as shown in FIGS. 16, 17 and 22.

An apparatus as described above with reference to FIGS. 16, 17 and 22 was subjected to artificial solar illumination conditions of AM 1.5 and AM 0.0, where AM means Air or Atmospheric Mass, the amount of atmosphere through which the sunlight must travel to reach the ground. So, AM 1.5 is typical for sea level conditions, while AM 0.0 is for a "space" application such as orbiting satellites. with the core assembly 186 maintained at either 25 or 80° C. and with varying bias voltages applied between the photoactive anode 226 and the cathode 220. In these tests, the bias voltage was not supplied by the photovoltaic strip 602 (FIG. 22) in order to permit the illumination of the photovoltaic strip and the bias voltage to be controlled independently. FIG. 45A shows the rate of hydrogen production (measured as the current passing between the electrodes) as a function of bias voltage at 25° C., while FIG. 45B shows the conversion efficiency as a function of bias voltage. FIGS. 45C and 45D parallel FIGS. 45A and 45B respectively but relate to measurements at 80° C.

From FIGS. 45A-45D, it will be seen that the rates of hydrogen production and conversion efficiency at 80° C. are more than double those at 25° C., and this improved performance with temperature is one major reason for constructing the apparatus so that it is able to operate at elevated temperatures. The improved performance at higher temperatures can be attributed to both bandgap shift and easier electrolysis. In all cases, hydrogen production increases with increasing bias voltage although under low illumination conditions the increase is small. Conversion efficiency tends to increase with bias voltage but eventually reaches a maximum value and thereafter declines.

Example 2

Figure 46:
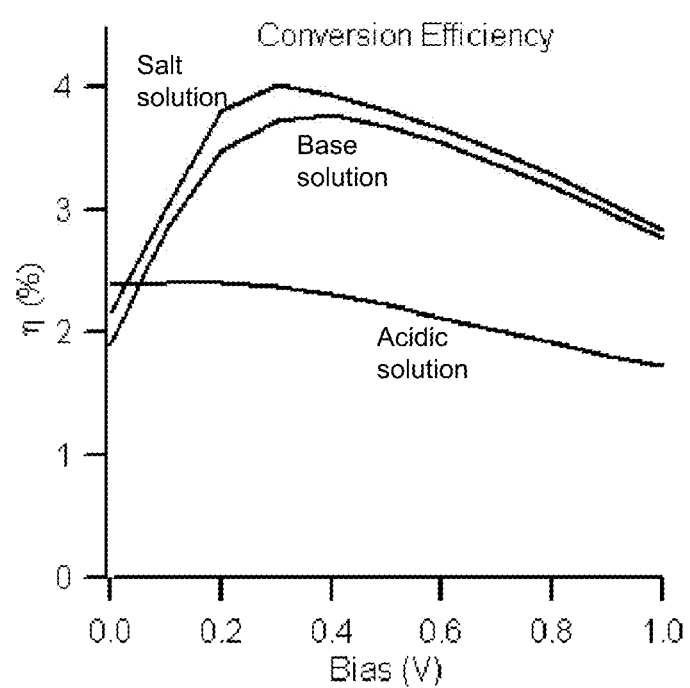
FIG. 46 is a graph showing the conversion efficiency of an apparatus as shown in FIGS. 16, 17 and 22 under varying bias voltage supplied by the photovoltaic strip therein, as a function of electrolyte recipe.

This Example illustrates (see FIG. 46) the effects of bias voltage on conversion efficiency of an apparatus as shown in FIGS. 16, 17 and 22, as a function of the electrolyte composition. The best results, i.e. highest hydrogen production efficiency, are obtained with either an acidic electrolyte or a salt water electrolyte. The basic potassium hydroxide electrolyte performs best at zero voltage bias, but underperforms at higher voltage bias.

The photoactive titania electrodes of the present invention can be used in any application in which photoactive titania electrodes have hitherto been used, as discussed in detail in the aforementioned parent application.

In summary, this invention provides for shifting the optical bandgap of a semiconductor into longer optical wavelengths by stressing the semiconductor, where the semiconductor is a thin film, and where the stress is strain caused by some or all of the following: conditions under which the thin film is formed, the shape of the substrate on a nano and micro scale, and the mechanical, chemical, and thermal properties of the substrate. Titania is the preferred semiconductor photocatalytic embodiment, but the invention applies to any semiconductor that is photo-active, such as silicon, germanium, and their alloys, and compounds that include, in addition, gallium. The stress-inducing template profiles also provide a mechanical lock to the coating so that the stress can exist without causing delamination of the coating from the substrate.

The aqueous source of hydrogen for the photoelectrolysis to act on can be water, sea water, an aqueous solution with electrolytes, or non-aqueous hydrogen-bearing liquids such as methanol or gasoline.

While the invention has been described with reference to particular embodiments, it will be understood that the present invention is by no means limited to the particular constructions, and methods herein disclosed and/or shown in the drawings, but also comprises any modifications or equivalents within the scope of the claims. For example, the apparatus of the present invention shown in FIGS. 16, 17 and 22 has a core assembly with cylindrical geometry, and tracks the sun by rotation about one axis. It will readily be apparent that this apparatus could use a core assembly with substantially spherical geometry (alternatively a planar core assembly could be used) which tracks the sun by rotation about two perpendicular axes. While a spherical core requires additional tracking of the sun, it allows for higher solar concentration than a cylindrical core so that smaller reflectors and/or core assemblies can be used. Other modifications of the specific apparatus described above will readily be apparent to those skilled in the art of light-powered photolysis and similar technologies.

The invention claimed is:

1. A photoelectrolytic cell for production of first and second gases from a liquid, the cell comprising:
   a container capable of holding the liquid;
   a photoelectrode disposed within the container and capable of generating the first gas upon exposure to radiation, said photoelectrode having been produced by a process comprising:
   (a) etching titanium metal to form a titanium nanostructured surface on said titanium metal; and
   (b) oxidizing at least part of the nanostructured titanium to titania by at least one of (i) anodizing the titanium in an anodizing solution, and (ii) heating the titanium in an oxygen-containing atmosphere, wherein the titania film produced in step (b) is stressed by the nanostructures produced in step (a), the stress causing the titania film to have a bandgap therein to support spontaneous photoelectrolysis of water in visible light;
   a counterelectrode disposed within the container electrically connected to the photoelectrode and capable of generating a second gas when the photoelectrode is exposed to radiation; and
   a membrane arranged between the photoelectrode and the counterelectrode to separate the first and second gases.

2. A photoelectrolytic cell according to claim 1 wherein the photoelectrode has a plurality of apertures extending therethrough, said apertures serving to improve migration of ions between the photoelectrode and the counterelectrode.

3. A photoelectrolytic cell according to claim 1 wherein the photoelectrode is a photoanode, the counterelectrode is a cathode, and the photoelectrolytic cell further comprises a second anode disposed within the container, the second anode not being photolytically active but being electrically connected to the cathode.

4. A photoelectrolytic cell according to claim 3 further comprising an auxiliary membrane arranged between the second anode and the cathode.

5. A photoelectrolytic cell according to claim 1 wherein the membrane is formed of an open cell material, an open cell foam, a microporous material, a fluoropolymer, or an ion exchange membrane.

6. A photoelectrolytic cell according to claim 1 wherein the photoelectrode comprises a semiconductor film on a substrate, the semiconductor film having a bandgap not supporting spontaneous photoelectrolysis of water in visible light wavelengths present in sunlight, the substrate having surface undulations with a spatial period smaller than the wavelength of visible light that cause stress in the semiconductor film and thereby shift the bandgap therein to support spontaneous photoelectrolysis of water in visible light.

7. A photoelectrolytic cell according to claim 1 wherein the photo-induced reaction comprises anyone or more of hydrogen production, oxygen production, reduction of $CO_2$ to CO, synthesis of CO and $H_2$ into $CH_4$, production of chlorine gas and sodium hypochlorite, and heating of the electrolyte.

8. Multi-core apparatus photo-reactor means comprising a parallel and coplanar elongate plurality of photoelectrolytic cells according to claim 1 joined by at least one common manifold.

9. A photoelectrolytic cell according to claim 1 having electrical potential supplied thereto by at least one of nighttime or intermittent mains electricity or electricity from photovoltaic or wind, such that said electrical potential is stored chemically through conversion to hydrogen.

10. Apparatus for carrying out photo-induced reactions, the apparatus comprising:
a primary reflector arranged to concentrate radiation incident thereon to a primary focus;
a dichroic mirror disposed at or adjacent the primary focus and arranged to pass a first band of radiation therethrough and to reflect a second band of radiation having wavelengths differing from those of the first band;
photovoltaic means for converting radiation to electricity; and
photo-reactor means for carrying out at least one photo-induced reaction, the photo-reactor means comprising at least one photoactive electrode, said photoactive electrode having been produced by a process comprising:
(a) etching titanium metal to form a titanium nanostructured surface on said titanium metal; and
(b) oxidizing at least part of the nanostructured titanium to titania by at least one of (i) anodizing the titanium in an anodizing solution, and (ii) heating the titanium in an oxygen-containing atmosphere, wherein the titania film produced in step (b) is stressed by the nanostructures produced in step (a), the stress causing the titania film to have a bandgap therein to support spontaneous photoelectrolysis of water in visible light; and
wherein one of the photovoltaic means and the photo-reactor means is arranged to receive the first band of radiation passing through the dichroic mirror, and the other of the photovoltaic means and the photo-reactor means is arranged to receive the second band of radiation reflected from the dichroic mirror.

11. Apparatus according to claim 10 wherein the dichroic mirror comprises a secondary reflector arranged to direct radiation incident thereon to a secondary focus.

12. Apparatus according to claim 11 the apparatus having a Dall-Kirkham reflective design, with an elliptical primary reflector and a cylindrical secondary reflector.

13. Apparatus according to claim 10 wherein the primary reflector comprises:
a support member;
two end caps mounted on the support member and spaced apart from one another, each end cap having a mounting surface facing the other end cap, and a slotted guide into its mounting surface; and;
a flexible reflector material having a reflective surface inserted into the slotted guides on the two end caps so that the reflective surface of the flexible substrate concentrates incident radiation on the primary focus.

14. Apparatus according to claim 10 wherein the photo-reactor means comprises a container capable of holding liquid; a photoanode; and a cathode electrically connected to the photoanode, wherein the container is substantially cylindrical and at least part of the container is light transmissive such that the light transmissive part of the container concentrates light on the photoanode.

15. Apparatus according to claim 10 wherein the photo-reactor means comprises a photoelectrolytic cell for production of first and second gases from a liquid, the cell comprising:
a container capable of holding the liquid;
a photoelectrode disposed within the container and capable of generating the first gas upon exposure to radiation;
a counterelectrode disposed within the container electrically connected to the photoelectrode and capable of generating a second gas when the photoelectrode is exposed to radiation; and
a septum arranged between the photoelectrode and the counterelectrode to separate the first and second gases.

16. Apparatus according to claim 15 wherein the photoelectrode is a photoanode, the counterelectrode is a cathode, and the photoelectrolytic cell further comprises a second anode disposed within the container, the second anode not being photolytically active but being electrically connected to the cathode.

17. Apparatus according to claim 16 further comprising an auxiliary septum arranged between the second anode and the cathode.

18. Apparatus according to claim 15 wherein the septum is formed of an open cell material, an open cell foam, a microporous material, or an ion exchange membrane.

19. A photoreactor according to claim 10 having electrical potential supplied thereto by at least one of nighttime or intermittent mains electricity or electricity from photovoltaic or wind, such that said electrical potential is stored chemically through conversion to hydrogen.

20. Photo-reactor core assembly means for carrying out at least one photo-induced reaction, the photo-reactor core assembly means comprising at least one photoactive titania electrode, said photoactive titania electrode being provided with louver openings; at least one counter-electrode, at least one septum separating said counter-electrode from said photoactive titania electrode; electrolyte; and at least one liquid-tight container, at least a portion of which is transparent to at least the electromagnetic wavelengths absorbed by said photoactive titania electrode, so as to provide immersion and containment of said photoactive electrode, counter-electrode, and septum in said electrolyte, and to further contain the reaction products developed at said photoactive titania electrode and counter-electrode,
said photoactive titania electrode having been produced by a process comprising:
(a) etching titanium metal to form a titanium nanostructured surface on said titanium metal; and (b) oxidizing at least part of the nanostructured titanium to titania by at least one of (i) anodizing the titanium in an anodizing solution, and (ii) heating the titanium in an oxygen-containing atmosphere, wherein the titania film produced in step (b) is stressed by the nanostructures produced in step (a), the stress causing the titania film to have a lower bandgap than unstressed titania.

21. A photo-reactor core assembly means according to claim 20 for carrying out photo-induced reactions, the photo-reactor core assembly means further comprising:
   a primary reflector arranged to concentrate radiation incident thereon to a primary focus;
   a secondary reflector or scattering means disposed at or adjacent the primary focus and arranged to direct radiation incident thereon to a secondary focus; and
   photovoltaic means for converting radiation to electricity;
   wherein one of the photovoltaic means and the photo-reactor means is disposed at or adjacent the primary focus, and the other of the photovoltaic means and the photo-reactor means is disposed at or adjacent the secondary focus;
   and wherein the photovoltaic means uses a first wavelength range for converting radiation to electricity and the photo-reactor means uses a second wavelength range at least part of which differs from the first wavelength range, and wherein the secondary reflector or scattering means comprises a wavelength selective reflector or scattering means arranged to reflect or scatter one of the first and second wavelength ranges to the secondary focus.

\* \* \* \* \*